United States Patent
Senzaki et al.

(10) Patent No.: US 8,999,631 B2
(45) Date of Patent: Apr. 7, 2015

(54) PRIMER AND PATTERN FORMING METHOD FOR LAYER INCLUDING BLOCK COPOLYMER

(75) Inventors: Takahiro Senzaki, Kawasaki (JP); Takahiro Dazai, Kawasaki (JP); Ken Miyagi, Kawasaki (JP); Shigenori Fujikawa, Fukuoka (JP); Harumi Hayakawa, Wako (JP); Mari Koizumi, Wako (JP)

(73) Assignees: Tokyo Ohka Kogyo Co., Ltd., Kawasaki-shi (JP); Riken, Wako-shi (JP)

( * ) Notice: Subject to any disclaimer, the term of this patent is extended or adjusted under 35 U.S.C. 154(b) by 0 days.

(21) Appl. No.: 13/820,017

(22) PCT Filed: Sep. 12, 2011

(86) PCT No.: PCT/JP2011/070729
§ 371 (c)(1),
(2), (4) Date: Oct. 17, 2013

(87) PCT Pub. No.: WO2012/036121
PCT Pub. Date: Mar. 22, 2012

(65) Prior Publication Data
US 2014/0030652 A1    Jan. 30, 2014

(30) Foreign Application Priority Data

Sep. 14, 2010 (JP) ................................. 2010-205875
Sep. 14, 2010 (JP) ................................. 2010-205890

(51) Int. Cl.
*G03F 7/11* (2006.01)
*G03F 7/20* (2006.01)
(Continued)

(52) U.S. Cl.
CPC ...... *G03F 7/11* (2013.01); *G03F 7/265* (2013.01); *C08L 53/00* (2013.01); *C09D 161/06* (2013.01);
(Continued)

(58) Field of Classification Search
None
See application file for complete search history.

(56) References Cited

U.S. PATENT DOCUMENTS 4,394,403 A * 7/1983 Smith ........................... 427/500
4,555,469 A * 11/1985 Erdmann et al. .............. 430/168
(Continued)

FOREIGN PATENT DOCUMENTS

JP    57-185036 A  * 11/1982
JP    60-206649 A  * 12/1985
(Continued)

OTHER PUBLICATIONS

Ham et al "Microdomain Orientation of PS-b-PMMA by Controoled Interfacial Interactions", Macromolecules, vol. 41, No. 17, 2008 pp. 6431 to 6437.*

(Continued)

*Primary Examiner* — Cynthia Hamilton
(74) *Attorney, Agent, or Firm* — Knobbe Martens Olson & Bear LLP

(57) ABSTRACT

An undercoat agent usable in phase separation of a layer formed on a substrate, the layer containing a block copolymer having a plurality of polymers bonded, the undercoat agent including a resin component, and 20 mol % to 80 mol % of all the structural units of the resin component being a structural unit derived from an aromatic ring-containing monomer; and a method of forming a pattern of a layer containing a block copolymer, the method including: step (1) coating the undercoat agent on a substrate (1), thereby forming a layer (2) composed of the undercoat agent, step (2) forming a layer (3) containing a block copolymer having a plurality of polymers bonded on the surface of the layer (2) composed of the undercoat agent, and subjecting the layer (3) containing the block copolymer to phase separation, and step (3) selectively removing a phase (3a) of at least one polymer of the plurality of copolymers constituting the block copolymer from the layer (3) containing the block copolymer.

6 Claims, 3 Drawing Sheets

(51) Int. Cl.
  *G03F 7/26* (2006.01)
  *C08L 53/00* (2006.01)
  *C09D 161/06* (2006.01)
  *G03F 7/00* (2006.01)
  *C09D 125/14* (2006.01)
  *G03F 7/075* (2006.01)
  *C08K 5/42* (2006.01)
  *C08K 5/45* (2006.01)

(52) U.S. Cl.
  CPC .. *G03F 7/00* (2013.01); *G03F 7/20* (2013.01); *C09D 125/14* (2013.01); *G03F 7/0002* (2013.01); *G03F 7/0752* (2013.01); *Y10S 438/947* (2013.01); *C08K 5/42* (2013.01); *C08K 5/45* (2013.01)
  USPC ............. 430/325; 430/280.1; 430/281.1; 430/326; 430/273.1; 430/271.1; 430/285.1; 438/947

(56) References Cited

U.S. PATENT DOCUMENTS

| | | | |
|---|---|---|---|
| 4,943,516 A | | 7/1990 | Kamayachi et al. |
| 5,266,444 A | * | 11/1993 | Carpenter et al. ......... 430/280.1 |
| 5,364,910 A | * | 11/1994 | Takinishi et al. ......... 525/327.3 |
| 5,945,517 A | | 8/1999 | Nitta et al. |
| 5,948,589 A | | 9/1999 | Sato et al. |
| 6,153,733 A | | 11/2000 | Yukawa et al. |
| 6,340,553 B1 | * | 1/2002 | Oomori et al. ............ 430/270.1 |
| 7,097,959 B1 | * | 8/2006 | Ryu et al. ................. 430/280.1 |
| 7,270,933 B2 | * | 9/2007 | Jung ........................ 430/270.1 |
| 7,521,090 B1 | * | 4/2009 | Cheng et al. .................. 427/256 |
| 7,521,094 B1 | * | 4/2009 | Cheng et al. .................. 427/532 |
| 7,662,541 B2 | * | 2/2010 | Uematsu et al. ........... 430/285.1 |
| 2009/0176337 A1 | * | 7/2009 | Kang et al. .................... 438/151 |
| 2009/0179001 A1 | | 7/2009 | Cheng et al. |
| 2009/0186234 A1 | * | 7/2009 | Colburn et al. .............. 428/500 |
| 2009/0253076 A1 | | 10/2009 | Sakaguchi et al. |
| 2010/0316950 A1 | | 12/2010 | Oguro et al. |
| 2012/0048738 A1 | * | 3/2012 | Fujikawa et al. ............... 205/50 |
| 2012/0244474 A1 | | 9/2012 | Asakawa et al. |
| 2013/0243958 A1 | * | 9/2013 | Senzaki et al. ................ 427/264 |
| 2013/0252179 A1 | * | 9/2013 | Senzaki et al. ................ 430/325 |

FOREIGN PATENT DOCUMENTS

| | | |
|---|---|---|
| JP | A-04-029242 | 1/1992 |
| JP | B-07-017737 | 3/1995 |
| JP | A-09-006001 | 1/1997 |
| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2008-036491 | 2/2008 |
| JP | A-2008-233781 | 10/2008 |
| JP | A-2009-092691 | 4/2009 |
| JP | A-2011-079877 | 4/2011 |
| WO | WO 2004/074242 A2 | 9/2004 |
| WO | WO 2007/023710 A1 | 3/2007 |
| WO | WO 2009/072465 A1 | 6/2009 |
| WO | WO 2009/117238 A2 | 9/2009 |
| WO | WO 2009/117243 A1 | 9/2009 |
| WO | WO 2011/039847 A1 | 4/2011 |

OTHER PUBLICATIONS

English abstract (accession No. 1983:117129 obtained from Scifinder database and available in Chemical Abstracts of JP 57-185036 A two pages issued Nov. 15, 1982.*

Hinsberg et al., "Self-Assembling Materials for Lithographic Patterning: Overview, Status and Moving Forward", Proceedings of SPIE, vol. 7637, pp. 76370G-1-76370G-11 , 2010.

International Search Report mailed on Dec. 13, 2011 for International Application No. PCT/JP2011/070729.

Office Action in Japanese Patent Application No. 2010-205890, mailed Aug. 19, 2014.

Ross et al., "Templated Self-Assembly of Si-Containing Block Copolymers for Nanoscale Device Fabrication," Proc. of SPIE, vol. 7637, pp. 76370H-1 to 76370H-7, 2010.

Cheng et al., "Dense Self-Assembly on Sparse Chemical Patterns: Rectifying and Multiplying Lithographic Patterns Using Block Copolymers," Advanced Materials, vol. 20, pp. 3155-3158 (2008).

Notification (Information Statement) issued in Japanese Patent Application No. 2010-205875 on Feb. 3, 2015.

* cited by examiner

PRIMER AND PATTERN FORMING METHOD FOR LAYER INCLUDING BLOCK COPOLYMER

TECHNICAL FIELD

The present invention relates to an undercoat agent usable in phase separation of a layer containing block copolymer formed on a substrate, the block copolymer having a plurality of polymers bonded; and a method of forming a pattern containing a block copolymer, using the undercoat agent.

Priority is claimed on Japanese Patent Application Nos. 2010-205875 and 2010-205890, filed Sep. 14, 2010, the contents of which are incorporated herein by reference.

DESCRIPTION OF RELATED ART

Recently, as further miniaturization of large scale integrated circuits (LSI) proceeds, a technology for processing a more delicate structure is demanded. In response to such demand, attempts have been started on forming a fine pattern using a phase-separated structure formed by self-assembly of polymers having mutually incompatible blocks bonded together.

For using a phase separation of a block copolymer, it is necessary to form a self-organized nano structure by a microphase separation only in specific regions, and arrange the nano structure in a desired direction. For realizing position control and orientational control, graphoepitaxy to control phase-separated pattern by a guide pattern and chemical epitaxy to control phase-separated pattern by difference in the chemical state of the substrate are proposed (see, for example, Non-Patent Document 1).

As a preferable method, there is disclosed a method in which an intermediate layer having a surface free energy of a mean value of the surface free energy of 2 block chains is formed, such that the face of the substrate contacting the block copolymer has a surface free energy of a mean value of the surface free energy of 2 block chains (for example, see Patent Document 1).

DOCUMENTS OF RELATED ART

Patent Document

[Patent Document 1] Japanese Unexamined Patent Application, First Publication No. 2008-36491

Non-Patent Documents

[Non-Patent Document 1] Proceedings of SPIE (U.S.), vol. 7637, pp. 76370G-1 (2010)

SUMMARY OF THE INVENTION

However, the present inventors have found that the position control and the orientation control of a self-assembled nano structure is possible even without controlling the surface free energy of the intermediate layer.

The present invention takes the above circumstances into consideration, with an object of providing an undercoat agent capable of producing a substrate provided with a nano structure on the substrate surface by using phase separation of a block copolymer, wherein the nanostructure is designed more freely with respect to the position and the orientation; and a method of forming a pattern of a layer containing a block copolymer using the undercoat agent.

For solving the above-mentioned problems, the present invention employs the following aspects.

Specifically, a first aspect of the present invention is an undercoat agent usable in phase separation of a layer formed on a substrate, the layer containing a block copolymer having a plurality of polymers bonded, the undercoat agent including a resin component, and 20 mol % to 80 mol % of all the structural units of the resin component being a structural unit derived from an aromatic ring-containing monomer.

A second aspect of the present invention is a method of forming a pattern of a layer containing a block copolymer, the method including the steps of: (1) coating the undercoat agent according to the first aspect on a substrate, thereby forming a layer composed of the undercoat agent, (2) forming a layer containing a block copolymer having a plurality of polymers bonded on the surface of the layer composed of the undercoat agent, and subjecting the layer containing the block copolymer to phase separation, and (3) selectively removing a phase of at least one polymer of the plurality of copolymers constituting the block copolymer from the layer containing the block copolymer.

In the present description and claims, an "alkyl group" includes linear, branched or cyclic, monovalent saturated hydrocarbon, unless otherwise specified.

The term "alkylene group" includes linear, branched or cyclic divalent saturated hydrocarbon, unless otherwise specified.

A "lower alkyl group" is an alkyl group of 1 to 5 carbon atoms.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

The term "(meth)acrylic acid" is a generic term that includes either or both of acrylic acid having a hydrogen atom bonded to the α-position and methacrylic acid having a methyl group bonded to the α-position.

The term "(meth)acrylate ester" is a generic term that includes either or both of the acrylate ester having a hydrogen atom bonded to the α-position and the methacrylate ester having a methyl group bonded to the α-position.

The term "(meth)acrylate" is a generic term that includes either or both of the acrylate having a hydrogen atom bonded to the α-position and the methacrylate having a methyl group bonded to the α-position.

According to the undercoat agent and the method of forming a pattern of a layer containing a block copolymer of the present invention, there can be produced a substrate provided with a nano structure on the substrate surface by using phase separation of a block copolymer, wherein the nanostructure is designed more freely with respect to the position and the orientation.

DETAILED DESCRIPTION OF THE INVENTION

The undercoat agent according to a first aspect of the present invention is usable in phase separation of a layer formed on a substrate, the layer containing a block copolymer having a plurality of polymers bonded.

<Method of Forming Layer Containing Block Copolymer>

Figure 1:
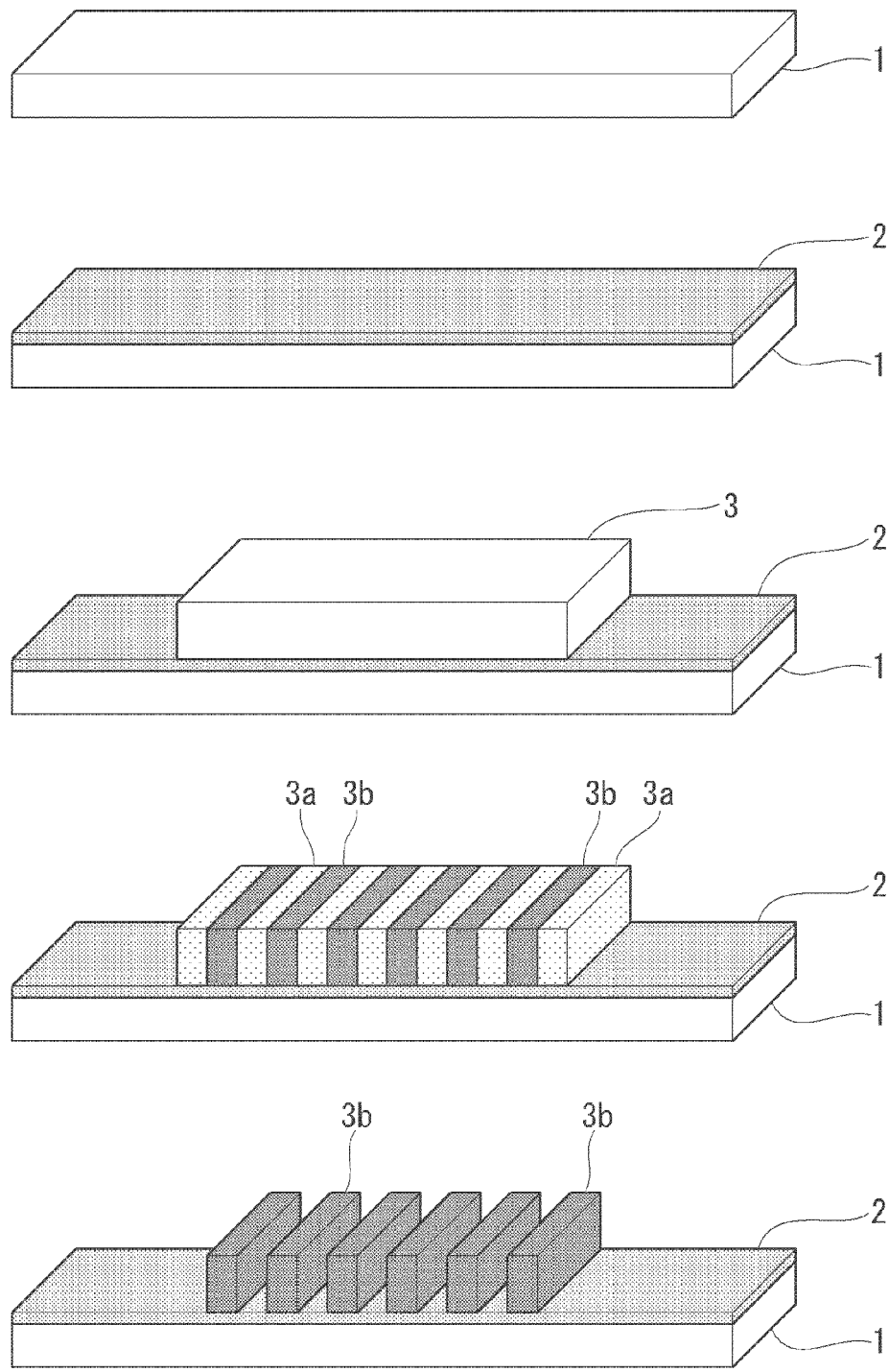
FIG. 1 is a diagram showing each step of the method of forming a pattern of a layer containing a block copolymer using an undercoat agent according to the present embodiment.

As shown in FIG. 1, as a method of forming a pattern of a layer containing a block copolymer using an undercoat agent according to a first aspect of the present invention, there can be mentioned a method (according to a second aspect of the present invention) including the steps of: (1) coating an undercoat agent containing a structural unit derived from an aromatic ring-containing monomer on a substrate 1, thereby forming a layer 2 composed of the undercoat agent, (2) forming a layer 3 containing a block copolymer having a plurality of polymers bonded on the surface of the layer 2 composed of the undercoat agent, and subjecting the layer 3 containing the block copolymer to phase separation, and (3) selectively removing a phase 3a of at least one polymer of the plurality of copolymers constituting the block copolymer from the layer 3 containing the block copolymer.

The layer containing the block polymer having a plurality of polymers bonded can be separated into phases containing the respective polymers as a main component by phase separation. In the method of forming a pattern of a layer containing a block copolymer according to the second aspect, firstly, in order to neutralize the surface of the substrate 1 and control the phase separation, an undercoat agent containing a resin component having a structural unit derived from an aromatic ring-containing monomer is coated, thereby forming a layer 2 composed of the undercoat agent. For controlling the position and the orientation of the phases in the phase separation, the undercoat agent contains a resin component having a structural unit derived from an aromatic ring-containing monomer. The amount of the structural unit derived from an aromatic ring-containing monomer based on all structural units of the resin component is 20 mol % 25 to 80 mol %. When the amount of the structural unit derived from an aromatic ring-containing monomer is outside the above-mentioned range, the surface of the substrate 1 cannot be neutralized, and the formation by the phase separation cannot be freely controlled.

The amount of the structural unit derived from an aromatic ring-containing monomer based on all structural units of the resin component is preferably 20 mol % to 70 mol %, and more preferably 30 mol % to 60 mol %.

Next, one or a plurality of phases within the phase-separated structure are selectively removed such that at least one phase remains within the phase-separated structure, thereby forming a pattern of the layer containing the block copolymer.

Therefore, the position and the orientation of the metal nanostructure on the surface of the substrate are determined by the position and the orientation of the phase selectively removed from the phase-separated structure of the layer containing the block copolymer. In other words, by appropriately adjusting the position and orientation of the phase-separated structure to be formed on the surface of the substrate, a nanostructure having the desired position and orientation can be formed on the surface of the substrate. In particular, by using a phase-separated structure capable of forming a finer pattern than conventional resist patterns as a template, it becomes possible to form a substrate provided with a nanostructure having an extremely minute shape.

Hereafter, each of the steps and the materials used will be explained in detail.

<Block Copolymer>

A block copolymer is a polymeric material in which plurality of polymers are bonded. As the polymers constituting the block copolymer, 2 types of polymers may be used, or 3 or more types of polymers may be used.

In the present invention, the plurality of polymers constituting the block copolymer are not particularly limited, as long as they are combinations capable of causing phase separation. However, it is preferable to use a combination of polymers which are mutually incompatible. Further, it is preferable to use a combination in which a phase of at least one polymer amongst the plurality of polymers constituting the block copolymer can be easily subjected to selective removal as compared to the phases of other polymers.

Examples of the block copolymer include a block copolymer having a polymer with a structural unit of styrene or a derivative thereof bonded to a polymer with a structural unit of a (meth)acrylate ester, a block copolymer having a polymer with a structural unit of styrene or a derivative thereof bonded to a polymer with a structural unit of a siloxane or a derivative thereof, and a block copolymer having a polymer with a structural unit of an alkylene oxide bonded to a polymer with a structural unit of a (meth)acrylate ester. Here, the term "(meth)acrylate ester" is a generic term that includes either or both of the acrylate ester having a hydrogen atom bonded to the α-position and the methacrylate ester having a methyl group bonded to the α-position.

As the (meth)acrylate ester, for example, (meth)acrylic acid having a substituent such as an alkyl group or a hydroxyalkyl group bonded to the carbon atom of the (meth)acrylic acid can be used. Examples of the alkyl group as the substituent include linear, branched or cyclic alkyl groups of 1 to 10 carbon atoms. Specific examples of the (meth)acrylate ester include methyl (meth)acrylate, ethyl (meth)acrylate, propyl (meth)acrylate, cyclohexyl(meth)acrylate, octyl(meth)acrylate, nonyl(meth)acrylate, hydroxyethyl (meth)acrylate, hydroxypropyl(meth)acrylate, benzyl (meth)acrylate, anthracene(meth)acrylate, glycidyl(meth)acrylate, 3,4-epoxycyclohexylmethane(meth)acrylate, and propyltrimethoxysilane(meth)acrylate.

Examples of the styrene derivative include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, vinylcyclohexane, 4-vinylbenzylchloride, 1-vinylnaphthalene, 4-vinylbiphenyl, 1-vinyl-2-pyrolidone, 9-vinylanthracene, and vinylpyridine.

Examples of the siloxane derivative include dimethylsiloxane, diethylsiloxane, diphenylsiloxane, and methylphenylsiloxane.

Examples of the alkylene oxide include ethylene oxide, propylene oxide, isopropylene oxide and butylene oxide.

In the method of forming a pattern of a layer containing a block copolymer according to a second aspect of the present invention, it is preferable to use a block copolymer having a polymer with a structural unit of styrene or a derivative thereof bonded to a polymer with a structural unit of a (meth)acrylate ester. Specific examples thereof include a styrene-polymethyl methacrylate (PS-PMMA) block copolymer, a styrene-polyethyl methacrylate block copolymer, a styrene-(poly-t-butyl methacrylate) block copolymer, a styrene-polymethacrylic acid block copolymer, a styrene-polymethyl acrylate block copolymer, a styrene-polyethyl acrylate block copolymer, a styrene-(poly-t-butyl acrylate) block copolymer, and a styrene-polyacrylic acid block copolymer. In the present invention, it is particularly preferable to use a PS-PMMA block copolymer.

The weight average molecular weight (Mw) (the polystyrene equivalent value determined by gel permeation chromatography) of each polymer constituting the block copolymer is not particularly limited as long as it is large enough to cause phase separation. The weight average molecular weight is preferably 5,000 to 500,000, more preferably 10,000 to 400,000, and still more preferably 20,000 to 300,000.

The polydispersity (Mw/Mn) of the block copolymer is preferably 1.0 to 3.0, more preferably 1.0 to 1.5, and still more preferably 1.0 to 1.2. Here, Mn is the number average molecular weight.

Hereafter, among the polymers constituting the block copolymer, a polymer which is not selectively removed in the later step is referred to as "polymer $P_A$", and a polymer to be selectively removed is referred to as "polymer $P_B$". For example, after the phase separation of a layer containing a PS-PMMA block copolymer, by subjecting the layer to an oxygen plasma treatment or a hydrogen plasma treatment, the phase of PMMA is selectively removed. In such a case, PS is the polymer $P_A$, and PMMA is the polymer $P_B$.

In the present invention, the shape and size of the phase to be selectively removed (i.e., the phase of polymer $P_B$) is determined by the compositional ratio of the respective polymers constituting the block copolymer and the molecular weight of the block copolymer. For example, by making the compositional ratio per volume of the polymer $P_B$ within the block copolymer relatively small, a cylinder structure in which the phase of the $P_B$ polymer is present within the phase of the polymer $P_A$ in the form of a cylinder can be formed. On the other hand, by making the compositional ratio per volume of the polymer $P_B$ within the block copolymer about the same as that of the polymer $P_A$, a lamellar structure in which the phase of the polymer $P_A$ and the phase of the polymer $P_B$ are alternately laminated can be formed. Further, by increasing the molecular weight of the block copolymer, the size of each phase can be increased.

<Substrate>

The substrate used in the present invention is not particularly limited as long as the substrate does not dissolve or admix when the undercoat agent and the block copolymer are applied. Examples thereof include a silicon wafer, a metal substrate such as copper, chromium, iron or aluminum, a metal oxide substrate such as a glass substrate, and a polymer film (such as polyethylene, polyethylene terephthalate, polyimide, benzocyclobutene or the like). Further, the size and the shape of the substrate is not particularly limited, and can be appropriately selected as long as it is plate-shaped.

<Substrate Washing Treatment>

Before forming a layer containing a block copolymer, the surface of the substrate may be washed. By washing the surface of the substrate, the neutralization reaction treatment in a later step may be satisfactorily performed.

As the washing treatment, a conventional method may be used, and examples thereof include an oxygen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a layer containing a block copolymer can be formed on the surface of the substrate.

<Neutralization Treatment>

A neutralization treatment is a treatment in which the surface of the substrate is modified so as to have affinity for all polymers constituting the block copolymer. By the neutralization treatment, it becomes possible to prevent only phases of specific polymers to come into contact with the surface of the substrate by phase separation. In the present invention, before forming a layer containing a block copolymer, a neutralization treatment is conducted depending on the type of the block copolymer to be used. The neutralization treatment is necessary for forming a cylinder structure, a dot structure, a gyroid structure or the like which is freely oriented on the substrate surface by phase separation.

Specifically, as the neutralization treatment, a treatment is conducted in which a thin film (neutralization film) containing a undercoat agent having affinity for all polymers constituting the block copolymer is formed on the surface of the substrate.

As the neutralization film, a film composed of a resin composition can be used. The resin composition used as the undercoat agent can be appropriately selected from conventional resin compositions used for forming a thin film, depending on the type of polymers constituting the block copolymer. However, in the present invention, 20 mol % to 80 mol % of all the structural units of the resin component is a structural unit derived from an aromatic ring-containing monomer. As such, the undercoat agent of the present invention contains both of a structural unit derived from an aromatic ring-containing monomer and a structural unit derived from an aromatic ring non-containing monomer, thereby exhibiting affinity for any polymer constituting the block copolymer.

Examples of the resin composition usable for the undercoat agent include (1) a non-photosensitive, non-heat polymerizable resin composition, (2) a photosensitive resin composition, (3) a heat polymerizable resin composition, (4) a chemically amplified resist composition, and (5) a novolak resist composition.

In the present invention, the undercoat agent is not particularly limited as long as 20 mol % to 80 mol % of all the structural units of the resin component is a structural unit derived from an aromatic ring-containing monomer. Examples of the undercoat agent include a resin composition containing all structural units of the polymers constituting the block copolymer, and a resin containing all structural units having high affinity for the polymers constituting the block copolymer.

For example, when a PS-PMMA block copolymer is used, as the undercoat agent, it is preferable to use a resin composition containing both PS and PMMA as the structural units, or a compound or a composition containing both a portion having a high affinity for PS such as an aromatic ring and a portion having a high affinity for PMMA such as a functional group with high polarity.

Examples of the resin composition containing both PS and PMMA as the structural units include a random copolymer of PS and PMMA, and an alternating polymer of PS and PMMA (a copolymer in which the respective monomers are alternately copolymerized).

Hereafter, each resin composition usable as the undercoat agent will be explained in detail.

(1) Non-Photosensitive, Non-Heat Polymerizable Resin Composition

Examples of the composition containing both a portion having a high affinity for PS and a portion having a high affinity for PMMA include a non-photosensitive, non-heat polymerizable resin composition obtainable by polymerizing an aromatic ring-containing monomer and an aromatic ring non-containing monomer having a high polarity.

Preferable examples of the aromatic ring-containing monomer include an aromatic compound of 6 to 18 carbon atoms having a vinyl group, an aromatic compound of 6 to 18 carbon atoms having a (meth)acryloyl group, and phenols which become the constitutional components of a novolak resin.

Examples of the aromatic compound of 6 to 18 carbon atoms having a vinyl group include a monomer having a group in which one hydrogen atom of an aromatic hydrocarbon such as a phenyl group, a biphenyl group, a fluorenyl group, a naphthyl group, an anthryl group or a phenanthryl group has been substituted with a vinyl group, or a monomer having a hetero aryl group such as the aforementioned group in which part of the carbon atoms constituting the ring of the group has been substituted with a hetero atom such as an oxygen atom, a sulfur atom or a nitrogen atom. These monomers may have a substituent other than a vinyl group.

Examples thereof include α-methylstyrene, 2-methylstyrene, 3-methylstyrene, 4-methylstyrene, 4-t-butylstyrene, 4-n-octylstyrene, 2,4,6-trimethyl styrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, vinylcyclohexane, 4-vinylbenzylchloride, 1-vinylnaphthalene, 4-vinylbiphenyl, 1-vinyl-2-pyrolidone, 9-vinylanthracene, and vinylpyridine.

Examples of the aromatic compound of 6 to 18 carbon atoms having a (meth)acryloyl group include a monomer having a group in which one hydrogen atom of an aromatic hydrocarbon such as a phenyl group, a biphenyl group, a fluorenyl group, a naphthyl group, an anthryl group or a phenanthryl group has been substituted with a (meth)acryloyl group, or a monomer having a hetero aryl group such as the aforementioned group in which part of the carbon atoms constituting the ring of the group has been substituted with a hetero atom such as an oxygen atom, a sulfur atom or a nitrogen atom. These monomers may have a substituent other than a (meth)acryloyl group.

Examples thereof include benzyl methacrylate, 1-naphthalene(meth)acrylic acid, 4-methoxynaphthalene(meth)acrylic acid, 9-anthracene(meth)acrylic acid, and phenoxyethyl (meth)acrylate.

As the phenols which becomes the constitutional components of a novolak resin, there is no particular limitation as long as the phenols serve as raw materials for a novolak resin obtainable by an addition condensation with aldehydes. Examples thereof include phenol; cresols such as o-cresol, m-cresol and p-cresol; xylenols, such as 2,3-xylenol, 2,4-xylenol, 2,5-xylenol, 2,6-xylenol, 3,4-xylenol and 3,5-xylenol; alkylphenols, such as o-ethylphenol, m-ethylphenol, p-ethylphenol, 2-isopropylphenol, 3-isopropylphenol, 4-isopropylphenol, o-butylphenol, m-butylphenol, p-butylphenol and p-tert-butylphenol; trialkylphenols such as 2,3,5-trimethylphenol and 3,4,5-trimethylphenol; polyhydric phenols such as resorcinol, catechol, hydroquinone, hydroquinone monomethyl ether, pyrogallol, and phloroglucinol; alkylpolyhydric phenols such as alkylresorcinol, alkylcatechol, and alkylhydroquinone (each alkyl group having 1 to 4 carbon atoms); α-naphthol; β-naphthol; hydroxydiphenyl; and bisphenol A. Further examples include the above phenols in which the hydrogen atom of a hydroxy group has been substituted with an epoxy group, an oxetanyl group or a (meta)acryloyl group.

Further, as the aromatic ring non-containing monomer having a substituent with high polarity, a (meth)acrylic compound or a vinyl compound containing at least 1 atom selected from the group consisting of N, O, Si, P and S is preferable, and examples thereof include a monomer having a trimethoxysilyl group, a trichlorosilyl group, a carboxy group, a hydroxy group, a cyano group or a hydroxyalkyl group in which part of the hydrogen atoms of the alkyl group has been substituted with fluorine atoms.

Specific examples thereof include (meth)acrylic acid; alkyl (meth)acylates, such as methyl (meth)acrylate, ethyl (meth)acrylate, propyl(meth)acrylate, isopropyl(meth)acrylate, n-butyl (meth)acrylate, sec-butyl (meth)acrylate, and tert-butyl (meth)acrylate; hydroxyalkyl(meth)acrylates, such as 2-hydroxyethyl (meth)acrylate, and 2-hydroxypropyl(meth) acrylate; cyclic alkyl(meth)acrylates, such as cyclohexyl (meth)acrylate, and dicyclopentanyl(meth)acrylate; and vinyl compounds, such as acrylonitrile, methacrylonitrile, acrylamide, methacrylamide, and vinyl cyclohexane.

In the non-photosensitive, non-heat polymerizable resin composition, 1 kind of the above resin component obtainable by polymerizing an aromatic ring-containing monomer and an aromatic ring non-containing monomer may be used alone. Alternatively, 2 or more kinds of resin components may be used in combination, as long as 20 mol % to 80 mol % of all the structural units of the resin component is a structural unit derived from an aromatic ring-containing monomer.

In the non-photosensitive, non-heat polymerizable resin composition, the usable solvent is not particularly limited, and the same solvents as those described later for a negative photosensitive resist composition and a chemically amplified positive resist composition can be mentioned.

The weight average molecular weight (Mw) (the polystyrene equivalent value determined by gel permeation chromatography) of the non-photosensitive, non-heat polymerizable resin composition is not particularly limited, but is preferably 3,000 to 300,000, more preferably 3,000 to 300,000, and most preferably 3,000 to 300,000. When the weight average molecular weight (Mw) is within the above-mentioned range, film formability by spin-coating is excellent, and solubility in a solvent is excellent, so that a solution can be easily prepared.

Further, the dispersity (Mw/Mn) is preferably 1.0 to 5.0, more preferably 1.0 to 3.0, and most preferably 1.2 to 2.5. Here, Mn is the number average molecular weight.

Furthermore, the resin concentration of the non-photosensitive, non-heat polymerizable resin composition is not particularly limited, but is preferably a concentration which enables coating of the composition to obtain a film thickness smaller than the film thickness of the block copolymer coated in the surface of the layer composed of the undercoat agent.

(2) Negative Photosensitive Resin Composition

Alternatively, as the resin composition usable for the undercoat agent of the present invention, a negative photosensitive resin composition can be mentioned. The negative photosensitive resin composition contains, as a photosensitive polymerization initiator, at least one member selected from the group consisting of a cationic polymerization initiator and a radical polymerization initiator, and the resin component contains a polymerizable group and/or a crosslinkable group.

Alternatively, the undercoat agent of the present invention may contain a polymerizable monomer instead of a polymerizable group and/or a crosslinkable group.

In the negative photosensitive resin composition, the same structural units as those derived from the monomer explained above in relation to the non-photosensitive, non-heat polymerizable resin composition can be mentioned. Examples of the aromatic ring non-containing monomer include, other than those described above in relation to the non-photosensitive, non-heat polymerizable resin composition, the following monomers.

[Epoxy Group-Containing Monomer]

Examples of the epoxy group-containing monomer include compounds represented by general formula (I) to (XVII) shown below.

[Chemical Formula 1]

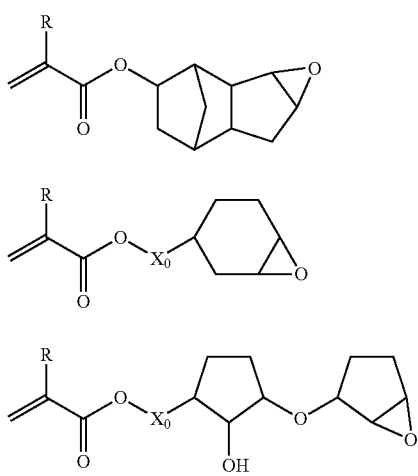

[Chemical Formula 2]

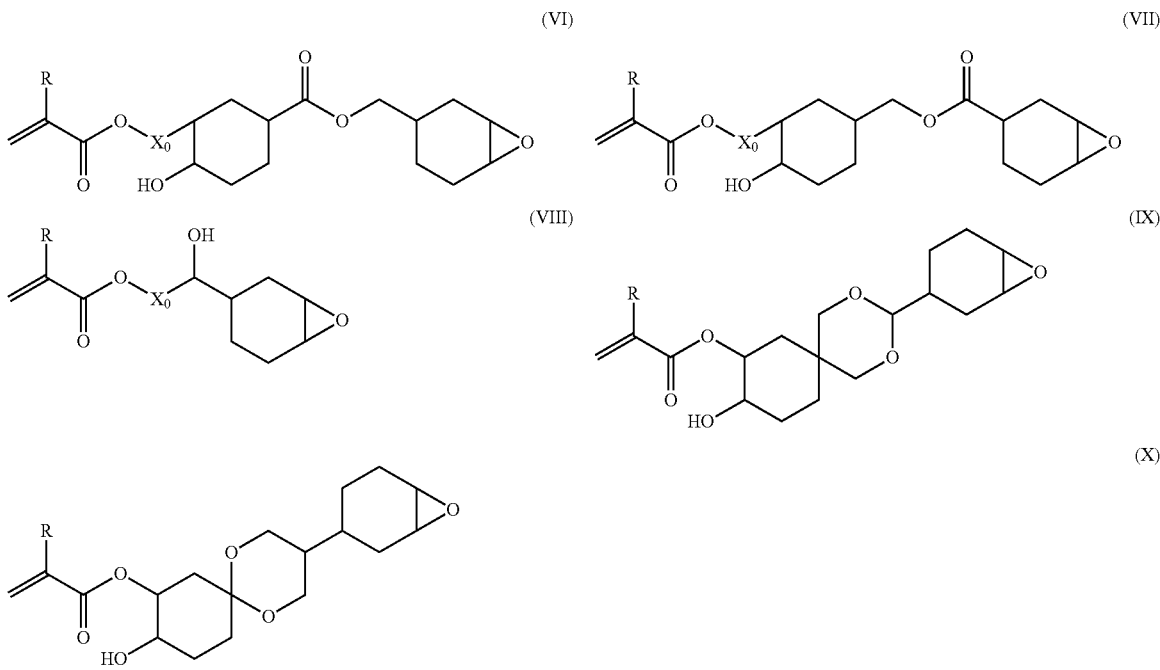

[Chemical Formula 3]

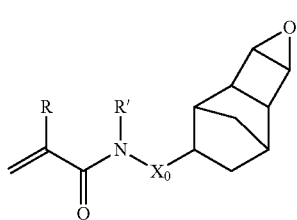

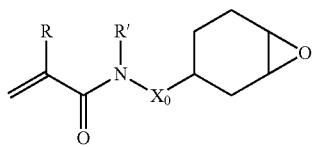

(XIII)

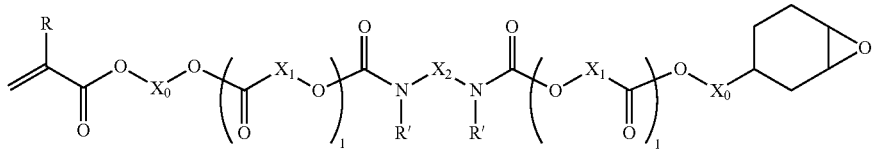

(XIV)

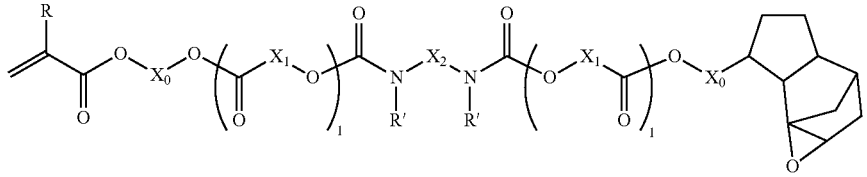

(XV)

[Chemical Formula 4]

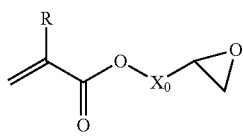

(XVI)

[Chemical Formula 5]

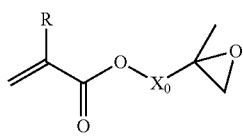

(XVII)

Each R independently represents a hydrogen atom or a methyl group. Each $X_0$ independently represents a divalent aliphatic saturated hydrocarbon group of 1 to 6 carbon atoms. $X_1$ and $X_2$ each independently represents a divalent hydrocarbon group of 1 to 10 carbon atoms. 1 represents an integer of 0 to 10. As $X_0$, a linear or branched alkylene group such as a methylene group, an ethylene group, a propylene group, a tetramethylene group, an ethylethylene group, a pentamethylene group or a hexamethylene group is preferable. As $X_1$ and $X_2$, for example, a methylene group, an ethylene group, a propylene group, a tetramethylene group, an ethylethylene group, a pentamethylene group, a hexamethylene group or a cyclohexylene group is preferable.

Among the above examples, compounds represented by formula (I) to (X), (XIII), (XVI) and (XVII) are preferable.

Other examples of the aromatic ring non-containing monomer include siloxane compounds such as (meth)acryloxypropyltrimethoxysilane, 3-(meth)acryloxypropylmethyldimethoxysilane, 3-(meth)acryloxypropyltriethoxysilane, vinyltriacetoxysilane, and allyltrimethoxysilane; and gylcidyl methacrylate modified methacrylic acid.

[Polymerizable Monomer]

The polymerizable monomer is not particularly limited as long as it is polymerizable, and the following examples can be given.

Polymerizable compound having 1 ethylenic unsaturated double bond:

A radically polymerizable compound (monomer) is usable, and preferably, as a monoester of methacrylic acid and acrylic acid, a compound represented by the following formula is usable.

$CH_2=CHCO-(OC_2H_4)_n-O-paraC_6H_4-R_{11}$ (provided that, n=0~8, and $R^{11}$ represents H or a C1-C9 alkyl group)

Specific examples thereof include a commercially available product Aronix M-101 (n≈2, $R^{11}$=H) (hereafter, commercially available products are indicated by the product names), M-102 (n≈4, $R^{11}$=H), M-111 (n≈1, $R^{11}$=n-$C_9H_{19}$), M-113 (n≈4, $R^{11}$=n-$C_9H_{19}$), M-114 (n≈8, $R^{11}$=n-$C_9H_{19}$), M-117 (n≈2.5, $R^{11}$=n-$C_9H_{19}$) (the above products are manufactured by Toagosei Co., Ltd.), and KAYARADR-564 (n≈2.3, $R^{11}$=H) (manufactured by NIPPON KAYAKU Co., Ltd.).

Examples of other similar compounds include a commercially available product KAYARAD TC-110S, TC-120S (manufactured by NIPPON KAYAKU Co., Ltd.), V-158 and V-2311 (manufactured by OSAKA ORGANIC CHEMICAL INDUSTRY LTD).

Polymerizable compound having 2 ethylenic unsaturated double bonds:

A (meth)acrylate diester of a dihydric alcohol, which is a bifunctional (meth)acrylate, is usable. Preferable examples of the bifunctional (meth)acrylate include a compound represented by the following formula:

$CH_2=CHCO-(OC_2H_4)_n-O-paraC_6H_4-C(R^{12})_2-paraC_6H_4-O-(C_2H_4O)_m-COCH=CH_2$ (provided that n=0 to 8, m=0 to 8, and $R^{12}$ represents H or $CH_3$)

Specific examples thereof include a commercially available product Aronix M-210 (n≈2, m≈2, $R^2$=$CH_3$) (manufactured by Toagosei Co., Ltd.), KAYARAD R-551 (n+m≈4, $R^2$=$CH_3$), and R-712 (n+m≈4, $R^2$=H) (manufactured by NIPPON KAYAKU Co., Ltd.).

Further, a compound represented by the following formula can also be preferably used.

$CH_2$=CHCOO—$R^3$—COCH=$CH_2$ (provided that $R^3$=an oxyalkyl group of 2 to 8 carbon atoms, or a 1 to 10 times repeating unit of an ethyleneglycol group or a propyleneglycol group)

Specific examples thereof include a commercially available product Aronix M-240 ($R^3$=—($CH_2CH_2O$)—, n≈4), M-245 ($R^3$=—($CH_2CH_2O$)$_n$—, n≈9) (manufactured by Toagosei Co., Ltd.), KAYARAD HDDA ($R^3$=—($CH_2CH_2CH_2CH_2CH_2O$)—), NPGDA ($R^3$=—($CH_2C(CH_3)_2CH_2O$)—), TPGDA ($R^3$=—($CH_2CH(CH_3)O$—), PEG400DA ($R^3$=—($CH_2CH_2O$)$_n$—, n=8), MANDA ($R^3$=—($CH_2C(CH_3)_2CH_2O$)—), HX-220 ($R^3$=—($CH_2CH_2CH_2CH_2CH_2O$)$_m$—$CH_2$—$C(CH_3)_2COOCH_2C(CH_3)_2CH_2O(COCH_2CH_2CH_2CH_2CH_2O$)$_n$—, m+n=2), and HX-620 ($R^3$=—($CH_2CH_2CH_2CH_2CH_2O$)$_m$—$CH_2$—$C(CH_3)_2COOCH_2C(CH_3)_2CH_2O(COCH_2CH_2CH_2CH_2O$)$_n$—, m+n=4) (manufactured by NIPPON KAYAKU Co., Ltd.).

Further, a compound represented by the following formula can also be preferably used.

A-(M-N)$_n$-M-A (provided that A represents a (meth)acrylic acid residue ($CH_2$=C(H or $CH_3$)COO—), M represents a divalent alcohol residue, N represents a diprotic acid residue, and n=0 to 15)

Specific examples thereof include oligoester acrylates (commercially available products such as M-6100, M-6200, M-6250, M-6300, M-6400 and M-6500 (manufactured by Toagosei Co., Ltd.). Further, other examples include commercially available products R-604 (manufactured by NIPPON KAYAKU Co., Ltd.), V260, V312 and V335HP (manufactured by OSAKA ORGANIC CHEMICAL INDUSTRY LTD).

Polymerizable compound having 3 or more ethylenic unsaturated double bonds:

A (meth)acrylate ester of a trihydric alcohol or a polyhydric alcohol having more than 3 hydroxy groups is usable. As a compound having such a structure, a compound represented by the following formula can be used.

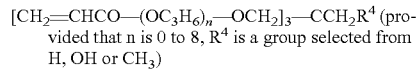
[$CH_2$=CHCO—($OC_3H_6$)$_n$—$OCH_2$]$_3$—$CCH_2R^4$ (provided that n is 0 to 8, $R^4$ is a group selected from H, OH or $CH_3$)

Specific examples thereof include a commercially available product Aronix M-309 (n=0, $R^4$=$CH_3$), M-310 (n≈1, $R^4$=$CH_3$) (manufactured by Toagosei Co., Ltd.), KAYARAD TMPTA (n=0, $R^4$=$CH_3$) (manufactured by NIPPON KAYAKU Co., Ltd.), V-295 (n=0, $R^4$=$CH_3$), and V-300 (n=0, $R^4$=OH) (manufactured by OSAKA ORGANIC CHEMICAL INDUSTRY LTD).

Further, a compound represented by the following formula can also be preferably used.

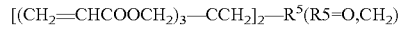
[($CH_2$=CHCOOCH$_2$)$_3$—$CCH_2$]$_2$—$R^5$(R5=O,$CH_2$)

Specific examples thereof include a commercially available product Aronix M-400 (manufactured by Toagosei Co., Ltd.). Similarly, a compound represented by the following formula can also be preferably used.

A-(X(A)-Y)$_n$—XA$_2$ (provided that A represents (meth)acrylic acid, X represents a polyhydric alcohol, Y represents a polybasic acid group, and n=0 to 15)

Specific examples thereof include commercially available product Aronix M-7100, M-8030, M-8060, M-8100 and M-9050 (manufactured by Toagosei Co., Ltd.).

Further, a compound represented by the following formula can also be preferably used.

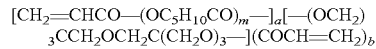
[$CH_2$=CHCO—($OC_5H_{10}CO$)$_m$—]$_a$[—($OCH_2$)$_3$CCH$_2$OCH$_2C(CH_2O)_3$—](COCH=$CH_2$)$_b$ (provided that m≈1 or 2, a≈an integer of 2 to 6, and b≈an integer of 0 to 6)

Examples of commercially available products include KAYARAD DPCA-20 (m≈1, a≈2, b≈4), DPCA-30 (m≈1, a≈3, b≈3), DPCA-60 (m≈1, a≈6, b≈0), DPCA-120 (m≈2, a≈6, b≈0) (manufactured by NIPPON KAYAKU Co., Ltd.). Other examples include V-360, V-GPT, V-3PA and V-400 (manufactured by OSAKA ORGANIC CHEMICAL INDUSTRY LTD).

Further, a compound represented by the following formula can also be preferably used.

[$CH_2$=CHCO—($OC_2H_4$)$_n$—$OCH_2$]$_3$—$CCH_2R^6$ (provided that each n may be different, and the sum of n is 0 to 24; and $R^6$ represents a group selected from H, OH or $CH_3$)

Specific examples thereof include a commercially available product Aronix M-350 (sum of n=3, $R^6$=$CH_3$), M-360 (sum of n=6, $R^6$=$CH_3$) (manufactured by Toagosei Co., Ltd.), SR-502 (sum of n=9, $R^6$=$CH_3$), SR-9035 (sum of n=15, $R^6$=$CH_3$), SR-415 (sum of n=20, $R^6$=$CH_3$) (manufactured by KayakuSartomer).

Oxetane Monomer:

Examples of the oxetane monomer include 3-ethyl-3-hydroxymethyloxetane (OXT-101: Toagosei Co., Ltd.), 2-ethylhexyloxetane (OXT-212: Toagosei Co., Ltd.), xylylenebisoxetane (OXT-121: Toagosei Co., Ltd.), and 3-ethyl-3-{3-ethyloxetan-3-yl]methoxymethyl}oxetane (OXT-221: Toagosei Co., Ltd.).

Epoxy Monomer:

Examples of the epoxy monomer include bisphenol A epoxy resin (jER828:Mitsubishi Chemical), bisphenol F epoxy resin (jER807: Mitsubishi Chemical), biphenyl epoxy resin (YX4000H: Mitsubishi Chemical), naphthalene epoxy resin (EPICLON HP-4032D, EPICLON HP-4700: DIC), alicyclic epoxy resin (GT-401: Daicel Chemical).

In the negative photosensitive resin composition, the amount of the polymerizable monomer relative to 100 parts by weight of the resin component is preferably 20 to 200, and more preferably 20 to 100. When the amount of the polymerizable monomer is within the above-mentioned range, excellent film formability of the layer composed of the undercoat agent and stability with time can be obtained.

As a combination of the polymerizable monomer and the photosensitive polymerization initiator, a combination of the aforementioned acrylic monomer with the below-described radical polymerization initiator, and a combination of the aforementioned oxetane monomer or the aforementioned epoxy monomer with the below-described cationic polymerization initiator are preferable.

[Polymer Having Radically Polymerizable Group]

In the negative photosensitive resin composition, the resin component may contain a polymerizable group. That is, the negative photosensitive resin composition may contain a polymer having a radically polymerizable group. Examples of the polymer having a radically polymerizable group include oligomers obtainable by polymerizing (meth)acrylic acid, fumaric acid, maleic acid, monomethyl fumarate, monoethyl fumarate, 2-hydroxyethyl (meth)acrylate, ethylene glycol monomethyl ether (meth)acrylate, ethylene glycol monoethyl ether(meth)acrylate, glycerol(meth)acrylate, (meth)acrylamide, acrylonitrile, methacrylonitrile, methyl (meth)acrylate, ethyl (meth)acrylate, isobutyl (meth)acrylate, 2-ethylhexyl(meth)acrylate, benzyl (meth)acrylate, ethylene glycol di(meth)acrylate, diethylene glycol diacrylate, triethylene glycol di(meth)acrylate, tetraethylene glycol di(meth)acrylate, butylene glycol dimethacrylate, propylene glycol di(meth)acrylate, trimethylolpropane tri(meth)acrylate, tetramethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, 1,6-hexanediol di(meth)acrylate, cardoepoxy diacrylate and the like; a polyester methacrylate obtainable by condensation of a polyhydric alcohol with a monobasic acid or a polybasic acid, followed by reacting (meth)acrylic acid; and a polyurethane(meth)acrylate obtainable by reacting a polyol with a compound having 2 isocyanate groups, followed by reacting (meth)acrylic acid.

Alternatively, as the resin having a radically polymerizable group, a resin obtainable by reacting the below-described epoxy compound with the below-described ethylenic unsaturated group-containing carboxylic acid compound to obtain a reaction product, followed by further reacting the reaction product with the below-described polybasic acid anhydride.

(Epoxy Compound)

Examples of the epoxy compound include a glycidylether epoxy resin, a glycidylamine epoxy resin, an alicyclic epoxy resin a bisphenol A resin, a bisphenol F epoxy resin, a bisphenol S epoxy resin, a biphenyl epoxy resin, a naphthalene epoxy resin, a fluorene epoxy resin, a phenol novolak epoxy resin and an orthocresol epoxy resin.

(Ethylenic Unsaturated Group-Containing Carboxylic Acid Compound)

As the ethylenic unsaturated group-containing carboxylic acid compound, a monocarboxylic acid containing a reactive ethylenic double bond such as an acryl group or a methacryl group in a molecule thereof is preferable. Examples of the ethylenic unsaturated group-containing carboxylic acid compound include acrylic acid, methacrylic acid, β-styrylacrylic acid, β-furfurylacrylic acid, α-cyanocinnamic acid, and cinnamic acid. As the ethylenic unsaturated group-containing carboxylic acid compound, 1 kind of compound may be used, or 2 or more kinds of compounds may be used in combination.

(Polybasic Acid Anhydride)

Examples of the polybasic acid anhydride include maleic anhydride, succinic anhydride, itaconic anhydride, phthalic anhydride, tetrahydrophthalic anhydride, hexahydrophthalic anhydride, methylhexahydrophthalic anhydride, methyltetrahydrophthalic anhydride, trimellitic anhydride, pyromellitic anhydride, benzophenone tetracarboxylic dianhydride, 3-methylhexahydrophthalic anhydride, 4-methylhexahydrophthalic anhydride, 3-ethylhexahydrophthalic anhydride, 4-ethylhexahydrophthalic anhydride, tetrahydrophthalic anhydride, 3-methyltetrahydrophthalic anhydride, 4-methyltetrahydrophthalic anhydride, 3-ethyltetrahydrophthalic anhydride, and 4-ethyltetrahydrophthalic anhydride. As the polybasic acid anhydride, 1 kind of compound may be used, or 2 or more kinds of compounds may be used in combination.

In the negative photosensitive resin composition, the amount of the radically polymerizable group is preferably 20 mol % to 80 mol %. When the amount of the radically polymerizable group is in the above-mentioned range, a satisfactory curability can be obtained. When the resin component has a radically polymerizable group, a polymer having a radically polymerizable group is not essential.

[Radical Polymerization Initiator]

Examples of the radical polymerization initiator include 1-hydroxycyclohexyl phenyl ketone, 2-hydroxy-2-methyl-1-phenyl-propan-1-one, 1-[4-(2-hydroxyethoxy)phenyl]-2-hydroxy-2-methyl-1-propane-1-one, 1-(4-isopropylphenyl)-2-hydroxy-2-methyl-propan-1-one, 1-(4-dodecylphenyl)-2-hydroxy-2-methyl-propan-1-one, 2,2-dimethoxy-1,2-diphenyl-ethane-1-one, bis(4-dimethylaminophenyl) ketone, 2-methyl-1-[4-(methylthio)phenyl]-2-morpholinopropan-1-one, 2-benzyl-2-dimethylamino-1-(4-morpholinophenyl)-butane-1-one, ethanone-1-[9-ethyl-6-(2-methylbenzoyl)-9H-carbazole-3-yl]-1-(O-acetyloxime), 2,4,6-trimethylbenzoyldiphenyl phosphineoxide, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 4-dimethylamino-2-ethylhexylbenzoic acid, 4-dimethylamino-2-isoamylbenzoic acid, benzyl-β-methoxyethylacetal, benzyldimethyl ketal, 1-phenyl-1,2-propanedione-2-(O-ethoxycarbonyl) oxime, methyl O-benzoylbenzoate, 2,4-diethylthioxanthone, 2-chlorothioxanthone, 2,4-dimethylthioxanthone, 1-chloro-4-propoxythioxanthone, thioxanthene, 2-chlorothioxanthene, 2,4-diethylthioxanthene, 2-methylthioxanthene, 2-isopropylthioxanthene, 2-ethylanthraquinone, octamethylanthraquinone, 1,2-benzanthraquinone, 2,3-diphenylanthraquinone, azobisisobutyronitrile, benzoyl peroxide, cumene peroxide, 2-mercaptobenzimidazole, 2-mercaptobenzoxazole, 2-mercaptobenzothiazole, 2-(O-chlorophenyl)-4,5-di(m-methoxyphenyl)-imidazolyl dimer, benzophenone, 2-chlorobenzophenone, p,p'-bisdimethylaminobenzophenone, 4,4'-bisdiethylaminobenzophenone, 4,4'-dichlorobenzophenone, 3,3-dimethyl-4-methoxybenzophenone, benzyl, benzoin, benzoin methyl ether, benzoin ethyl ether, benzoin isopropyl ether, benzoin n-butylether, benzoin isobutyl ether, benzoin butyl ether, acetophenone, 2,2-diethoxyacetophenone, p-dimethylacetophenone, p-dimethylaminopropiophenone, dichloroacetophenone, trichloroacetophenone, p-tert-butylacetophenone, p-dimethylaminoacetophenone, p-tert-butyltrichloroacetophenone, p-tert-butyldichloroacetophenone, α,α-dichloro-4-phenoxyacetophenone, thioxanthone, 2-methylthioxanthone, 2-isopropylthioxanthone, dibenzosuberone, pentyl-4-dimethylaminobenzoate, 9-phenylacridine, 1,7-bis-(9-acridinyl)heptane, 1,5-bis-(9-acridinyl)pentane, 1,3-bis-(9-acridinyl)propane, p-methoxytriazine, 2,4,6-tris(trichloromethyl)-s-triazine, 2-methyl-4,6-bis(trichloromethyl)-s-triazine, 2-[2-(5-methyl-furan-2-yl)ethenyl]-4,6-bis(trichloromethyl)-s-triazine, 2-[2-(furan-2-yl)ethenyl]-4,6-bis(trichloromethyl)-s-triazine, 2-[2-(4-diethylamino-2-methylphenyl)ethenyl]-4,6-bis(trichloromethyl)-s-triazine, 2-[2-(3,4-dimethoxyphenyl)ethenyl]-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy)styrylphenyl-s-triazine, and 2,4-bis-trichloromethyl-6-(2-bromo-4-methoxy)styrylphenyl-s-triazine. As the photopolymerization initiator, 1 kind of compound may be used, or 2 or more kinds of compounds may be used in combination.

The amount of the radical polymerization initiator based on the solid content of the negative photosensitive resin composition is preferably 0.10% by weight to 10% by weight, and more preferably 0.5% by weight to 5% by weight. When the amount of the radical polymerization initiator component is within the above-mentioned range, the sensitivity of the negative photosensitive resin composition becomes excellent, and unsatisfactory photocuring can be suppressed.

[Cationic Polymerization Initiator]

Next, the cationic polymerization initiator will be described. The cationic polymerization initiator usable in the present invention is a compound which generates a cation by the irradiation of an active energy ray such as ultraviolet ray, deep ultraviolet ray, excimer laser such as KrF or ArF, X ray, electron beam or the like, and the cation functions as a polymerization initiator.

Such a cationic polymerization initiator is, for example, represented by general formula (5) shown below.

[Chemical Formula 6]

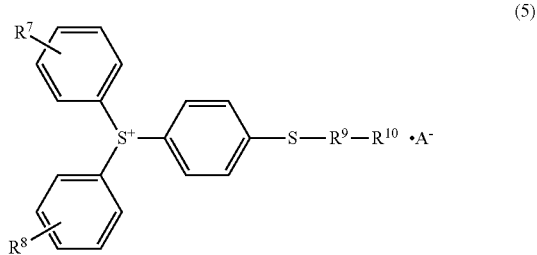

(5)

In general formula (5), $R^7$ and $R^8$ each independently represents a hydrogen atom, a halogen atom, a hydrocarbon group which may contain an oxygen atom or a halogen atom, or an alkoxy group which may have a substituent bonded thereto; $R^9$ represents a p-phenylene group which may have one or more hydrogen atoms substituted with a halogen atom or an alkyl group; $R^{10}$ represents a hydrogen atom, a hydrocarbon group which may contain an oxygen atom or a halogen atom, a benzoyl group which may have a substituent, or a polyphenyl group which may have a substituent; and $A^-$ represents a counter ion of an onium ion.

In general formula (5), specific examples of $A^-$ include $SbF_6^-$, $PF_6^-$, $AsF_6^-$, $BF_4^-$, $SbCl_6^-$, $ClO_4^-$, $CF_3SO_3^-$, $CH_3SO_3^-$, $FSO_3^-$, $F_2PO_2^-$, p-toluenesulfonate, nonafluorobutanesulfonate, adamantanecarboxylate, tetraarylborate, and a fluorinated alkylfluorophosphoric acid anion represented by general formula (6) shown below.

[Chemical Formula 7]

$[(Rf)_bPF_{6-b}]^-$ (6)

In general formula (6), Rf represents an alkyl group having 80% or more of the hydrogen atoms substituted with fluorine. b represents an integer of 1 to 5. The Rf groups in the number of b may be the same or different from each other.

Examples of the cationic polymerization initiator include 4-(2-chloro-4-benzoylphenylthio)phenyldiphenylsulfonium hexafluoroantimonate, 4-(2-chloro-4-benzoylphenylthio) phenylbis(4-fluorophenyl)sulfonium hexafluoroantimonate, 4-(2-chloro-4-benzoylphenylthio)phenylbis(4-chlorophenyl)sulfonium hexafluoroantimonate, 4-(2-chloro-4-benzoylphenylthio)phenylbis(4-methylphenyl)sulfonium hexafluoroantimonate, 4-(2-chloro-4-benzoylphenylthio) phenylbis(4-(1-hydroxyethoxy)phenyl)sulfonium hexafluoroantimonate, 4-(2-methyl-4-benzoylphenylthio)phenylbis(4-fluorophenyl)sulfonium hexafluoroantimonate, 4-(3-methyl-4-benzoylphenylthio)phenylbis(4-fluorophenyl)sulfonium hexafluoroantimonate, 4-(2-fluoro-4-benzoylphenylthio)phenylbis(4-fluorophenyl)sulfonium hexafluoroantimonate, 4-(2-methyl-4-benzoyl)phenylbis(4-fluorophenyl)sulfonium hexafluoroantimonate, 4-(2,3,5,6-tetramethyl-4-benzoylphenylthio)phenylbis(4-fluorophenyl)sulfonium hexafluoroantimonate, 4-(2,6-dichloro-4-benzoylphenylthio)phenylbis(4-fluorophenyl)sulfonium hexafluoroantimonate, 4-(2,6-dimethyl-4-benzoylphenylthio)phenylbis(4-fluorophenyl)sulfonium hexafluoroantimonate, 4-(2,3-dimethyl-4-benzoylphenylthio)phenylbis(4-fluorophenyl)sulfonium hexafluoroantimonate, 4-(2-methyl-4-benzoylphenylthio)phenylbis(4-chlorophenyl)sulfonium hexafluoroantimonate, 4-(3-methyl-4-benzoylphenylthio) phenylbis(4-chlorophenyl)sulfonium hexafluoroantimonate, 4-(2-fluoro-4-benzoylphenylthio)phenylbis(4-chlorophenyl) sulfonium hexafluoroantimonate, 4-(2-methyl-4-benzoylphenylthio)phenylbis(4-chlorophenyl)sulfonium hexafluoroantimonate, 4-(2,3,5,6-tetramethyl-4-benzoylphenylthio)phenylbis(4-chlorophenyl)hexafluoroantimonate, 4-(2,6-dichloro-4-benzoylphenylthio)phenylbis(4-chlorophenyl)sulfonium hexafluoro antimonate, 4-(2,6-dimethyl-4-benzoylphenylthio)phenylbis(4-chlorophenyl)sulfonium hexafluoroantimonate, 4-(2,3-dimethyl-4-benzoylphenylthio)phenylbis(4-chlorophenyl)sulfonium hexafluoroantimonate, 4-(2-chloro-4-acetylphenylthio)phenyldiphenylsulfonium hexafluoroantimonate, 4-(2-chloro-4-(4-methylbenzoyl)phenylthio)phenyldiphenylsulfonium hexafluoroantimonate, 4-(2-chloro-4-(4-fluorobenzoyl)phenylthio)phenyldiphenylsulfonium hexafluoroantimonate, 4-(2-chloro-4-(4-methoxybenzoyl)phenylthio)phenyldiphenylsulfonium hexafluoroantimonate, 4-(2-chloro-4-dodecanoylphenylthio)phenyldiphenylsulfonium hexafluoroantimonate, 4-(2-chloro-4-acetylphenylthio)phenylbis(4-fluorophenyl)sulfonium hexafluoroantimonate, 4-(2-chloro-4-(4-methylbenzoyl)phenylthio)phenylbis(4-fluorophenyl) sulfonium hexafluoroantimonate, 4-(2-chloro-4-(4-fluorobenzoyl)phenylthio)phenylbis(4-fluorophenyl) sulfonium hexafluoroantimonate, 4-(2-chloro-4-(4-methoxybenzoyl)phenylthio)phenylbis(4-fluorophenyl) sulfonium hexafluoroantimonate, 4-(2-chloro-4-dodecanoylphenylthio)phenylbis(4-fluorophenyl)sulfonium hexafluoroantimonate, 4-(2-chloro-4-acetylphenylthio)phenylbis(4-chlorophenyl)sulfonium hexafluoroantimonate, 4-(2-chloro-4-(4-methylbenzoyl)phenylthio)phenylbis(4-chlorophenyl)sulfonium hexafluoroantimonate, 4-(2-chloro-4-(4-fluorobenzoyl)phenylthio)phenylbis(4-chlorophenyl) sulfonium hexafluoroantimonate, 4-(2-chloro-4-(4-methoxybenzoyl)phenylthio)phenylbis(4-chlorophenyl) sulfonium hexafluoroantimonate, 4-(2-chloro-4-dodecanoylphenylthio)phenylbis(4-chlorophenyl)sulfonium hexafluoroantimonate, 4-(2-chloro-4-benzoylphenylthio) phenyldiphenylsulfonium hexafluorophosphate, 4-(2-chloro-4-benzoylphenylthio)phenyldiphenylsulfonium tetrafluoroborate, 4-(2-chloro-4-benzoylphenylthio) phenyldiphenylsulfonium perchlorate, 4-(2-chloro-4-benzoylphenylthio)phenyldiphenylsulfonium trifluoromethanesulfonate, 4-(2-chloro-4-benzoylphenylthio)phenylbis(4-fluorophenyl)sulfonium hexafluorophosphate, 4-(2-chloro-4-benzoylphenylthio)phenylbis(4-fluorophenyl)sulfonium tetrafluoroborate, 4-(2-chloro-4-benzoylphenylthio)phenylbis(4-fluorophenyl)sulfonium perchlorate, 4-(2-chloro-4-benzoylphenylthio)phenylbis(4-fluorophenyl)sulfonium trifluoromethanesulfonate, 4-(2-chloro-4-benzoylphenylthio)phenylbis(4-fluorophenyl)sulfonium p-toluenesulfonate, 4-(2-chloro-4-benzoylphenylthio)phenylbis(4-fluorophenyl)sulfonium camphorsulfonate, 4-(2-chloro-4-benzoylphenylthio)phenylbis(4-fluorophenyl)sulfonium nonafluorobutanesulfonate, 4-(2-chloro-4-benzoylphenylthio)bis(4-chlorophenyl)sulfonium hexafluorophosphate, 4-(2-chloro-4-benzoylphenylthio)phenylbis(4-chlorophenyl)sulfonium tetrafluoroborate, 4-(2-chloro-4-benzoylphenylthio)phenylbis(4-chlorophenyl)sulfonium perchlorate, 4-(2-chlorobenzoylphenylthio)phenylbis(4-chlorophenyl)sulfonium trifluoromethanesulfonate, diphenyl[4-(phenylthio)phenyl]sulfonium trifluorotrispentafluoroethylphosphate, diphenyl[4-(p-ter-phenylthio)phenylsulfonium hexafluoroantimonate, and diphenyl[4-(p-ter-phenylthio)phenylsulfonium trifluorotrispentafluoroethyl phosphate. Among these compounds, 4-(2-chloro-4-benzoylphenylthio)phenylbis(4-fluorophenyl)sulfonium hexafluoroantimonate (manufactured by ADEKA CORPORATION, Adekaoptomer SP-172), diphenyl[4-(phenylthio)phenyl]sulfonium trifluorotrispentatluoroethylphosphate (manufactured by SAN-APRO Ltd., CPI-210S), diphenyl[4-(p-ter-phenylthio)phenylsulfonium hexafluoroantimonate, and diphenyl[4-(p-ter-phenylthio)phenylsulfonium trifluorotrispentafluoroethylphosphate (manufactured by SAN-APRO Ltd., HS-1PG) are preferable.

In the negative photosensitive resin composition, the amount of the cationic polymerization initiator is preferably 0.1 to 20% by weight, and more preferably 0.5 to 10% by weight. In the negative photosensitive resin composition, when the amount of the cationic polymerization initiator is 0.1% by weight or more, curing time of the negative photosensitive resin composition by the active energy ray becomes appropriate. Further, in the negative photosensitive resin composition, when the amount of the cationic polymerization initiator is 10% by weight or less, developing properties after exposure by the active energy ray becomes excellent. The above amount of the cationic polymerization initiator is based on the negative photosensitive resin composition containing no solvent component. Therefore, in the case where the negative photosensitive resin composition contains a solvent component, the amount of the cationic polymerization initiator based on the negative photosensitive resin composition having the weight of the solvent component subtracted can be controlled to be within the above-mentioned range.

In the negative photosensitive resin composition, the resin component may contain a cross-linkable group or a cross-linking agent.

[Cross-Linking Agent]

The cross-linking agent is not particularly limited, and a compound having at least 2 alkyletherified amino groups in a molecule. Examples of such compound include nitrogen-containing compounds in which part or all of active methylol groups have been alkyletherified, e.g., (poly)methylol melamine, (poly)methylol glycoluril, (poly)methylol benzoguanamin and (poly)methylol urea. Examples of the alkyl group include a methyl group, an ethyl group, a butyl group and a mixture thereof, and may contain an oligomer component formed by self-condensation. Specific examples include hexamethoxymethyl melamine, hexabutoxymethyl melamine, tetramethoxymethyl glycoluril, and tetrabutoxymethyl glycoluril.

As the cross-linking agent, 1 kind of compound may be used, or 2 or more kinds of compounds may be used in combination.

The amount of the cross-linking agent relative to 100 parts by weight of the resin component is preferably 5 to 50 parts by weight, and more preferably 10 to 30 parts by weight. When the amount of the cross-linking agent is within the above-mentioned range, the patterning properties become excellent.

[Solvent]

As the solvent, any solvent conventionally known as being usable for a negative photosensitive resin composition can be used without particular limitation.

Specific examples of the solvent include ethylene glycol monoalkyl ether acetates, such as ethylene glycol monomethyl ether acetate and ethylene glycol monoethyl ether acetate; propylene glycol monoalkyl ethers, such as propylene glycol monomethyl ether, propylene glycol monoethyl ether, propylene glycol monopropyl ether and propylene glycol monobutyl ether; propylene glycol dialkyl ethers, such as propylene glycol dimethyl ether, propylene glycol diethyl ether, propylene glycol dipropyl ether and propylene glycol dibutyl ether; propylene glycol monoalkyl ether acetates, such as propylene glycol monomethyl ether acetate, propylene glycol monoethyl ether acetate, propylene glycol monopropyl ether acetate and propylene glycol monobuyl ether acetate; cellosolves, such as ethyl cellosolve and butyl cellosolve; carbitols, such as butyl carbitol; lactic acid esters, such as methyl lactate, ethyl lactate, n-propyl lactate and isopropyl lactate; aliphatic carboxylic acid esters, such as ethyl acetate, n-propyl acetate, isopropyl acetate, n-butyl acetate, isobutyl acetate, n-amyl acetate, isoamyl acetate, isopropyl propionate, n-butyl propionate and isobutyl propionate; other esters, such as 3-methoxymethyl propionate, 3-methoxyethyl propionate, 3-ethoxymethyl propionate, 3-ethoxyethyl propionate, methyl pyruvate and ethyl pyruvate; aromatic hydrocarbons, such as toluene and xylene; ketones, such as 2-heptanone, 3-heptanone, 4-heptanone and cyclohexanone; amides, such as N-dimethylformamide, N-methylacetamide, N,N-dimethylacetamide and N-methylpyrrolidone; and lactones, such as γ-butyrolactone.

As the solvent, 1 kind of compound may be used, or 2 or more kinds of compounds may be used in combination.

The amount of the solvent component is not particularly limited, but in general, the solvent is used in an amount such that the solid content of the negative photosensitive resin composition becomes preferably from 10 to 60% by weight, and more preferably 20 to 50% by weight.

[Other Components]

If desired, the negative photosensitive resin composition may contain an additional resin, a stabilizer, a colorant, a surfactant or the like.

In the negative photosensitive resin composition, 1 kind of the resin component obtainable by polymerizing an aromatic ring-containing monomer and an aromatic ring non-containing monomer may be used alone. Alternatively, 2 or more kinds of resin components may be used in combination, as long as 20 mol % to 80 mol % of all the structural units of the resin component is a structural unit derived from an aromatic ring-containing monomer.

The weight average molecular weight (Mw) (the polystyrene equivalent value determined by gel permeation chromatography) of the negative photosensitive resin composition is not particularly limited, but is preferably 3,000 to 300,000, more preferably 3,000 to 300,000, and most preferably 3,000 to 300,000. When the weight average molecular weight (Mw) is within the above-mentioned range, film formability by spin-coating is excellent, and solubility in a solvent is excellent, so that a solution can be easily prepared.

Further, the dispersity (Mw/Mn) is preferably 1.0 to 5.0, more preferably 1.0 to 3.0, and most preferably 1.2 to 2.5. Here, Mn is the number average molecular weight.

Further, the resin concentration of the negative photosensitive resin composition is not particularly limited.

(3) Heat Polymerizable Resin Composition

Alternatively, as the resin composition usable for the undercoat agent of the present invention, a heat polymerizable resin composition (3) can be mentioned. As the resin component for the heat polymerizable resin composition, the same resin components as those described above for the non-photosensitive, non-heat polymerizable resin composition and the negative photosensitive resin composition can be mentioned. Further, the undercoat agent of the present invention, like the negative photosensitive resin composition, preferably contains a polymerizable monomer, or the resin component preferably has a polymerizable group.

In the heat polymerizable resin composition, as the aromatic ring non-containing monomer, an epoxy group-containing monomer as described in the negative photosensitive resin composition can be preferably mentioned.

In the heat polymerizable resin composition, the amount of the radically polymerizable group is preferably 20 mol % to 80 mol %. When the amount of the radically polymerizable group is in the above-mentioned range, a satisfactory curability can be obtained. When the resin component has a radically polymerizable group, a polymer having a radically polymerizable group is not essential.

In the heat polymerizable resin composition, the amount of the polymerizable monomer relative to 100 parts by weight of the resin component is preferably 20 to 200, and more preferably 20 to 100. When the amount of the polymerizable monomer is within the above-mentioned range, excellent film formability of the layer composed of the undercoat agent and stability with time can be obtained.

In addition, the undercoat agent of the present invention preferably contains a cure accelerator, and more preferably a heat polymerization catalyst.

[Cure Accelerator]

Examples of the cure accelerator include addition polymerization type (such as polyamines, acid anhydrides, polyphenols, polymercaptans, isocyanates and organic acids), catalyst type (such as heat curable type (amines (preferably tertiary amines), imidazole and Lewis acid), and ultraviolet curable type (Bronsted acid salt)), and condensation type (such as phenol resins, urea resins, and melamine resins).

For example, in Japanese Examined Patent Application Publication No. Hei 7-17737, the following specific examples are shown.

Imidazole derivatives, such as 2MZ, 2E4MZ, $C_{11}Z$, $C_{17}Z$, 2PZ, 1B2MZ, 2MZ-CN, 2E4MZ-CN, $C_{11}Z$—CN, 2PZ—CN, 2PHZ—CN, 2MZ-CNS, 2E4MZ-CNS, 2PZ—CNS, 2MZ-AZINE, 2E4MZ-AZINE, $C_{11}Z$-AZINE, 2MA-OK, 2P4 MHZ, 2PHZ and 2P4BHZ manufactured by Shikoku Chemicals Co., Ltd.; guanamines such as acetoguanamine, benzoguanamine, and 3,9-bis[2-(3,5-diamino-2,4,6-triazaphenyl)ethyl]b 2,4,8,10-tetraoxaspiro[5,5]undecane; polyamines such as diaminodiphenyl methane, m-phenylene diamine, diaminodiphenyl sulfone, cyclohexyl amine, m-xylylene diamine, 4,4'-diamino-3,3'-diethyldiphenyl methane, diethylene triamine, tetraethylene pentamine, N-aminoethyl piperazine, isophorone diamine, dicyandiamide, urea, urea derivatives, melamine, polybasic hydrazide, and organic acid salts thereof and/or epoxy adducts; amine complexes of boron trifluoride; tertiary amines such as trimethyl amine, triethanol amine, N,N-dimethyloctyl amine, N,N-dimethyl aniline, N-benzyldimethyl amine, pyridine, N-methylpyridine, N-methyl morpholine, hexamethoxymethyl melamine, 2,4,6-tris(dimethylaminophenol), N-cyclohexyldimethyl amine, tetramethyl guanidine, and m-aminophenol; polyphenols such as polyvinyl phenol, polyvinyl phenol bromide, phenol novolak, and alkylphenol novolaks; organic phospines such as tributyl phosphine, triphenyl phosphine, and tris-2-cyanoethyl phosphine; phosphonium salts such as tri-n-butyl(2,5-dihydroxyphenyl)phosphonium bromide and hexadecyltributyl phosphonium chloride; quaternary ammonium salts such as benzyltrimethyl ammonium chloride, phenyltributyl ammonium chloride, and benzyltrimethyl ammonium bromide; anhydrides of the polybasic acids mentioned above; photo-cationic polymerization catalysts such as diphenyl iodonium tetrafluoroborate, triphenyl sulfonium hexafluoroantimonate, 2,4,6-triphenyl thiopyrilium hexafluorophosphate, the product of Ciba-Geigy Ltd. under registered trademark designation of "IRGACURE" 261, and styrenemaleic acid resin.

Among these examples, 1 kind of compound may be used, or a mixture of 2 or more kinds of compounds may be used.

Among these, amines (polyamines, low molecular weight amines (primary, secondary or tertiary amines (preferably secondary or tertiary amines))) which are basic compounds are preferable.

The amines are not particularly limited as long as the amines have compatibility with the resin composition. Examples of the amines include those described in Japanese Unexamined Patent Application Publication No. Hei 9-6001. Specific examples thereof include secondary or tertiary alkanolamines, such as diethanolamine, triethanolamine, tributanolamine and triisopropanolamine; and secondary or tertiary alkylamines, such as diethylamine, triethylamine, dibutylamine, tributylamine, tri-n-pentylamine, methyl-di-n-octylamine, tri-n-decylamine, tribenzylamine and N,N-dicyclohexyl methylamine.

Among these examples, secondary amines and tertiary amines are preferable. In particular, relatively bulky amines such as tri-n-pentylamine, methyl-di-n-octylamine, tri-n-decylamine, tribenzylamine and N,N-dicyclohexylmethylamine are preferable in that these amines exhibit the effect of suppressing the amount of acid component by-produced in the composition with lapse of time, thereby providing long-term storage stability.

As the cure accelerator, 1 kind of compound may be used, or 2 or more kinds of compounds may be used in combination. In terms of obtaining advantageous effects, the amount of the cure accelerator relative to 100 parts by weight of the solid content of the resin is preferably 0.01 to 5.0 parts by weight, and most preferably 0.1 to 1.0 parts by weight. When the amount of the cure accelerator is no more than the upper limit of the above-mentioned range, a film having a high cure density can be formed.

In the heat polymerizable composition, like the negative photosensitive resin composition, the resin component may have a cross-linking group. In the case where the cross-linking group is a glycidylether-type epoxy group or a glycidylether-type oxetane, the aforementioned heat polymerization catalyst or the aforementioned photocationic polymerization initiator is necessary.

In the heat polymerizable resin composition, 1 kind of the resin component obtainable by polymerizing an aromatic ring-containing monomer and an aromatic ring non-containing monomer may be used alone. Alternatively, 2 or more kinds of resin components may be used in combination, as long as 20 mol % to 80 mol % of all the structural units of the resin component is a structural unit derived from an aromatic ring-containing monomer.

In heat polymerizable resin composition, the usable solvent is not particularly limited, and the same solvents as those described above for the negative photosensitive resist composition and a chemically amplified positive resist composition can be mentioned.

The weight average molecular weight (Mw) (the polystyrene equivalent value determined by gel permeation chromatography) of the heat polymerizable resin composition is not particularly limited, but is preferably 3,000 to 300,000, more preferably 3,000 to 300,000, and most preferably 3,000 to 300,000. When the weight average molecular weight (Mw) is within the above-mentioned range, film formability by spin-coating is excellent, and solubility in a solvent is excellent, so that a solution can be easily prepared.

Further, the dispersity (Mw/Mn) is preferably 1.0 to 5.0, more preferably 1.0 to 3.0, and most preferably 1.2 to 2.5. Here, Mn is the number average molecular weight.

Further, the resin concentration of the heat polymerizable resin composition is not particularly limited.

(4) Chemically Amplified Positive Resist Composition

Next, the chemically amplified positive resist composition will be described. The chemically amplified positive resist composition contains, in addition to the structural unit described above with respect to the non-photosensitive, non-heat polymerizable resin composition, an acid generator component which generates acid upon exposure, and the structural unit derived from the aromatic ring non-containing monomer contains an acid dissociable dissolution inhibiting group. That is, the chemically amplified positive resist composition includes a base component (A) (hereafter, referred to as "component (A)") which exhibits changed solubility in an alkali developing solution under action of acid, and an acid-generator component (B) (hereafter, referred to as "component (B)") which generates acid upon exposure.

In the resin contained in the chemically amplified positive resist composition, prior to exposure, the substituent which imparts alkali solubility is protected with a protecting group, and hence, the alkali solubility of the resin is low. However, after exposure, the protecting group is removed by the action of acid generated from the photoacid generator, and the substituent which imparts alkali solubility is generated, thereby increasing the alkali solubility of the resin. By such an action, in the chemically amplified positive resist composition, portions selectively exposed through a photomask are removed by alkali development, thereby forming a resin pattern.

As described with respect to the non-photosensitive, non-heat polymerizable resin composition, the chemically amplified positive resist composition preferably contains a resin component obtainable by polymerizing an aromatic ring-containing monomer and a highly polar, aromatic ring non-containing monomer.

Preferable examples of the aromatic ring-containing monomer include an aromatic compound of 6 to 18 carbon atoms having a vinyl group, an aromatic compound of 6 to 18 carbon atoms having a (meth)acryloyl group, and phenols which become the constitutional components of a novolak resin.

Examples of the aromatic compound of 6 to 18 carbon atoms having a vinyl group include a monomer having a group in which one hydrogen atom of an aromatic hydrocarbon such as a phenyl group, a biphenyl group, a fluorenyl group, a naphthyl group, an anthryl group or a phenanthryl group has been substituted with a vinyl group, or a monomer having a hetero aryl group such as the aforementioned group in which part of the carbon atoms constituting the ring of the group has been substituted with a hetero atom such as an oxygen atom, a sulfur atom or a nitrogen atom. These monomers may have a substituent other than a vinyl group.

Examples thereof include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, vinylcyclohexane, 4-vinylbenzylchloride, 1-vinylnaphthalene, 4-vinylbiphenyl, 1-vinyl-2-pyrolidone, 9-vinylanthracene, and vinylpyridine.

Further, as the aromatic ring non-containing monomer having a substituent with high polarity, a vinyl group or a (meth)acrylic compound containing at least 1 atom selected from the group consisting of N, O, Si, P and S is preferable, and conventional monomers described for the component (A) below can be used.

<Component (A)>

In the chemically amplified positive resist composition, the component (A) preferably contains a resin component (A1) (hereafter, referred to as "component (A1)") which exhibits increased solubility in an alkali developing solution by the action of acid. Further, the component (A) may be the component (A1).

<Component (A1)>

In the chemically amplified positive resist composition, it is preferable that the component (A1) include a structural unit (a1) derived from an acrylate ester containing an acid dissociable, dissolution inhibiting group.

It is preferable that the component (A1) further include a structural unit (a2) derived from an acrylate ester containing a lactone-containing cyclic group.

It is preferable that the component (A1) further include a structural unit (a3) derived from an acrylate ester containing a polar group-containing aliphatic hydrocarbon group.

In the present descriptions and claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position.

Examples of the substituent include an alkyl group of 1 to 5 carbon atoms and a halogenated alkyl group of 1 to 5 carbon atoms. With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the alkyl group of 1 to 5 carbon atoms for the substituent at the α-position include linear or branched alkyl groups of 1 to 5 carbon atoms such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group of 1 to 5 carbon atoms include groups in which part or all of the hydrogen atoms of the aforementioned "alkyl group of 1 to 5 carbon atoms for the substituent on the α-position" are substituted with halogen atoms. Examples of halogen atoms include fluorine atoms, chlorine atoms, bromine atoms and iodine atoms, and fluorine atoms are particularly desirable.

In the present invention, it is preferable that a hydrogen atom, an alkyl group of 1 to 5 carbon atoms or a halogenated alkyl group of 1 to 5 carbon atoms is bonded to the α-position of the acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

Structural Unit (a1)

The structural unit (a1) is a structural unit derived from an acrylate ester containing an acid dissociable, dissolution inhibiting group.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution.

Generally, groups that form either a cyclic or chain-like tertiary alkyl ester with the carboxyl group of the (meth) acrylic acid, and acetal-type acid dissociable, dissolution inhibiting groups such as alkoxyalkyl groups are widely known. Here, the term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic" is a relative concept used in relation to the term "aromatic", and defines a group or compound that has no aromaticity.

The term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be used. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded thereto, as the groups bonded to the oxygen atom of the carbonyl group (—C(O)—O—) within the structural units represented by general formulas (a1″-1) to (a1″-6) shown below, can be used.

[Chemical Formula 8]

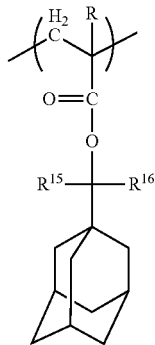

(a1″-1)

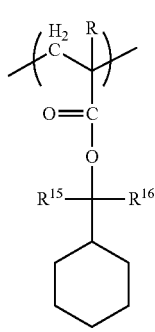

(a1″-2)

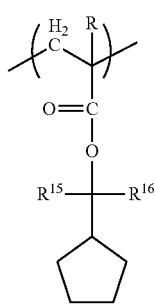

(a1″-3)

-continued

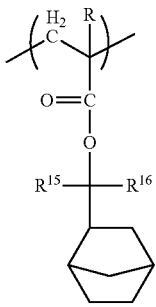

(a1″-4)

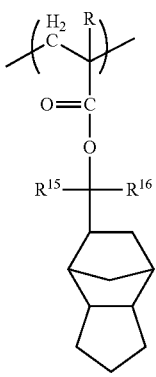

(a1″-5)

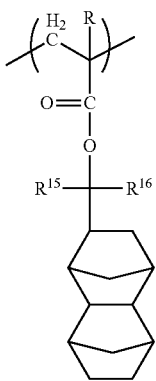

(a1″-6)

In the formulas, R represents a hydrogen atom, an alkyl group of 1 to 5 carbon atoms or a halogenated alkyl group of 1 to carbon atoms; and $R^{15}$ and $R^{16}$ each independently represent an alkyl group (which may be linear or branched, and preferably has 1 to 5 carbon atoms).

In general formulas (a1″-1) to (a1″-6) above, the alkyl group of 1 to 5 carbon atoms or halogenated alkyl group of 1 to 5 carbon atoms for R are the same as the alkyl group of 1 to 5 carbon atoms or halogenated alkyl group of 1 to 5 carbon atoms which can be bonded to the α-position of the aforementioned acrylate ester.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 9]

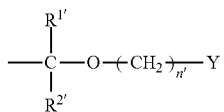

(p1)

In the formula, $R^{1\prime}$ and $R^{2\prime}$ each independently represent a hydrogen atom or an alkyl group of 1 to 5 carbon atoms; n' represents an integer of 0 to 3; and Y represents an alkyl group of 1 to 5 carbon atoms or an aliphatic cyclic group.

In general formula (p1) above, n' is preferably an integer of 0 to 2, more preferably 0 or 1, and most preferably 0.

As the alkyl group of 1 to 5 carbon atoms for $R^{1\prime}$ and $R^{2\prime}$, the same alkyl groups of 1 to 5 carbon atoms as those described above for R can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below.

[Chemical Formula 10]

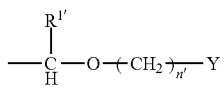

(p1-1)

In the formula, $R^{1\prime}$, n' and Y are the same as defined above.

As the alkyl group of 1 to 5 carbon atoms for Y, the same alkyl groups of 1 to 5 carbon atoms as those described above can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 11]

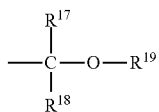

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In the above formula, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^9$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 12]

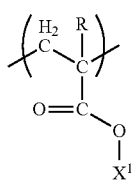

(a1-0-1)

In the formula, R represents a hydrogen atom, an alkyl group of 1 to 5 carbon atoms or a halogenated alkyl group of 1 to 5 carbon atoms; and $X^1$ represents an acid dissociable, dissolution inhibiting group.

[Chemical Formula 13]

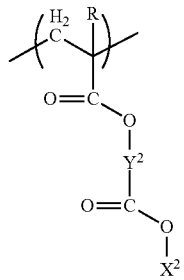

(a1-0-2)

In the formula, R represents a hydrogen atom, an alkyl group of 1 to 5 carbon atoms or a halogenated alkyl group of 1 to 5 carbon atoms; $X^2$ represents an acid dissociable, dissolution inhibiting group; and $Y^2$ represents a divalent linking group.

In general formula (a1-0-1) above, the alkyl group of 1 to 5 carbon atoms or halogenated alkyl group of 1 to 5 carbon atoms for R are the same as the alkyl group of 1 to 5 carbon atoms or halogenated alkyl group of 1 to 5 carbon atoms which can be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above.

$X^2$ is the same as defined for $X^1$ in general formula (a1-0-1).

As the divalent linking group for $Y^2$, an alkylene group, a divalent aliphatic cyclic group or a divalent linking group containing a hetero atom can be mentioned.

As the aliphatic cyclic group, the same as those used above in connection with the explanation of "aliphatic cyclic group" can be used, except that two hydrogen atoms have been removed therefrom.

When $Y^2$ represents an alkylene group, it preferably has 1 to 10 carbon atoms, more preferably 1 to 6, still more preferably 1 to 4, and most preferably 1 to 3.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

When $Y^2$ represents a divalent linking group containing a hetero atom, examples thereof include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, and "-A-O—B— (wherein O is an oxygen atom, and each of A and B independently represents a divalent hydrocarbon group which may have a substituent)".

When $Y^2$ represents a divalent linking group —NH— and the H in the formula is replaced with a substituent such as an alkyl group or an acyl group, the substituent preferably has 1 to 10 carbon atoms, more preferably 1 to 8 carbon atoms, and most preferably 1 to 5 carbon atoms.

When $Y^2$ is "A-O—B", each of A and B independently represents a divalent hydrocarbon group which may have a substituent.

A hydrocarbon "has a substituent" means that part or all of the hydrogen atoms within the hydrocarbon group is substituted with groups or atoms other than hydrogen atom.

The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be given.

The linear or branched aliphatic hydrocarbon group preferably has 1 to 10 carbon atoms, more preferably 1 to 8, still more preferably 2 to 5, and most preferably 2.

As a linear aliphatic hydrocarbon group, a linear alkylene group is preferable, and specific examples include a methylene group, an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$— and —$CH(CH_2CH_3)CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

As examples of the hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

As A, a linear aliphatic hydrocarbon group is preferable, more preferably a linear alkylene group, still more preferably a linear alkylene group of 2 to 5 carbon atoms, and most preferably an ethylene group.

As the hydrocarbon group for B, the same divalent hydrocarbon groups as those described above for A can be used.

As B, a linear or branched aliphatic hydrocarbon group is preferable, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 14]

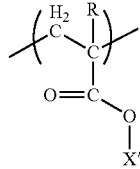
(a1-1)

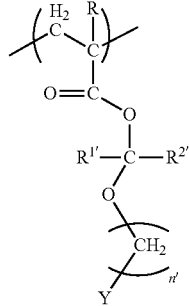
(a1-2)

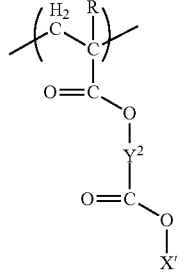
(a1-3)

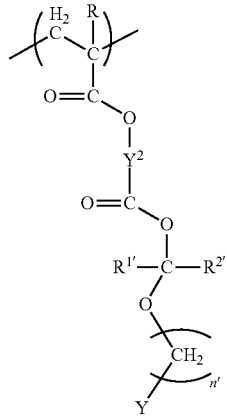
(a1-4)

In the formulas, X' represents a tertiary alkyl ester-type acid dissociable, dissolution inhibiting group; Y represents an alkyl group of 1 to 5 carbon atoms or an aliphatic cyclic group; n' represents an integer of 0 to 3; $Y^2$ represents a divalent linking group; R is the same as defined above; and each of $R^{1\prime}$ and $R^{2\prime}$ independently represents a hydrogen atom or an alkyl group of 1 to 5 carbon atoms.

Examples of the tertiary alkyl ester-type acid dissociable, dissolution inhibiting group for X' include the same tertiary alkyl ester-type acid dissociable, dissolution inhibiting groups as those described above for $X^1$.

As $R^{1\prime}$, $R^{2\prime}$, n' and Y are respectively the same as defined for $R^{1\prime}$, $R^{2\prime}$, n' and Y in general formula (p1) described above in connection with the "acetal-type acid dissociable, dissolution inhibiting group".

As examples of $Y^2$, the same groups as those described above for $Y^2$ in general formula (a1-0-2) can be given.

Specific examples of structural units represented by general formula (a1-1) to (a1-4) are shown below.

In the formulae shown below, $R^\alpha$ represents a hydrogen atom, a methyl group or a trifluoromethyl group.

[Chemical Formula 15]

(a1-1-1)

(a1-1-2)

(a1-1-3)

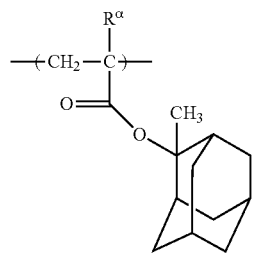

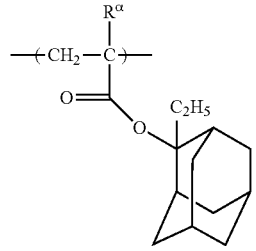

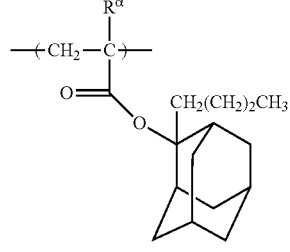

(a1-1-4)

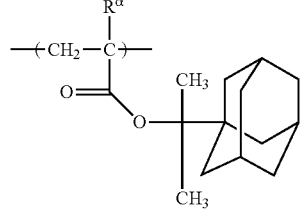

(a1-1-5)

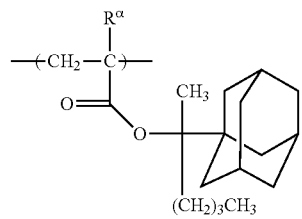

(a1-1-6)

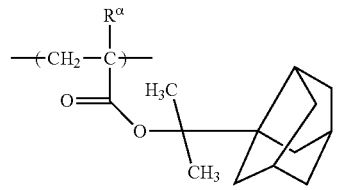

(a1-1-7)

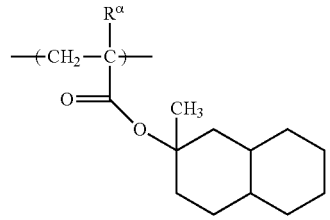

(a1-1-8)

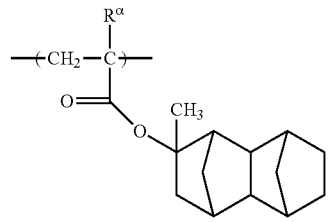

(a1-1-9)

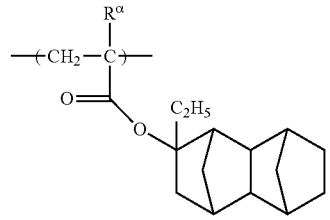

[Chemical Formula 16]

(a1-1-10)

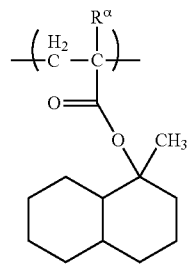

(a1-1-11) 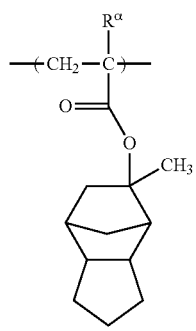
(a1-1-12) 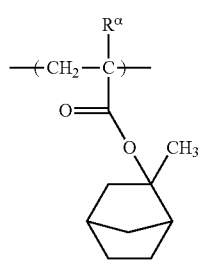
(a1-1-13) 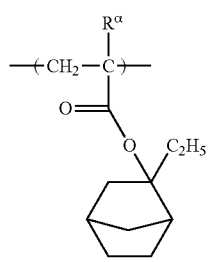
(a1-1-14) 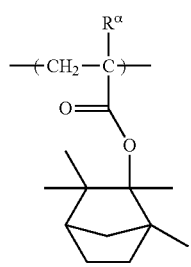
(a1-1-15) 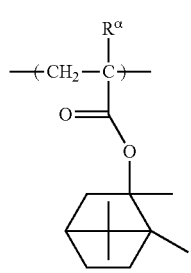
(a1-1-16) 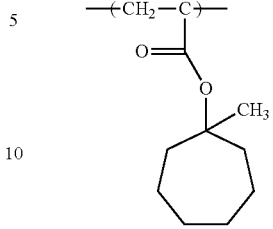
(a1-1-17) 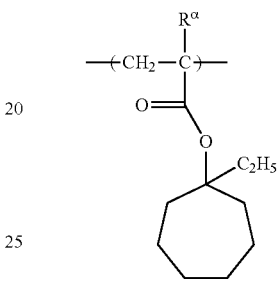
(a1-1-18) 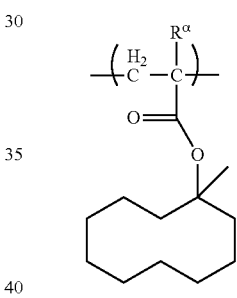
(a1-1-19) 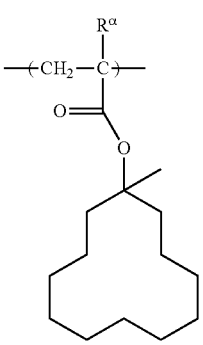
(a1-1-20) 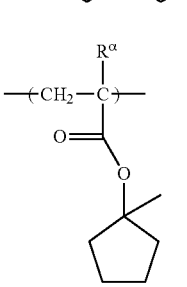

(a1-1-21) 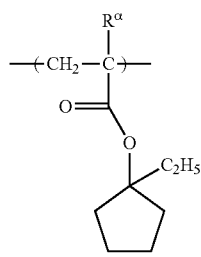
[Chemical Formula 17]
(a1-1-22) 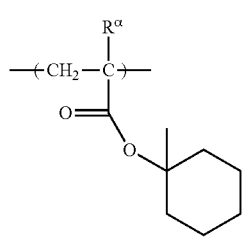
(a1-1-23) 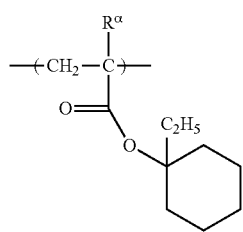
(a1-1-24) 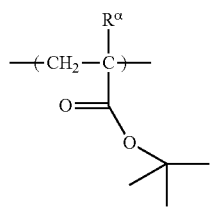
(a1-1-25) 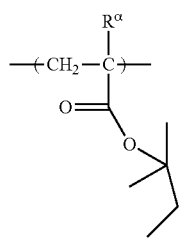
(a1-1-26) 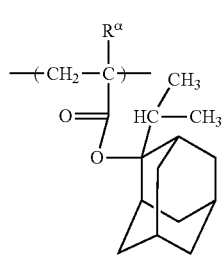
(a1-1-27) 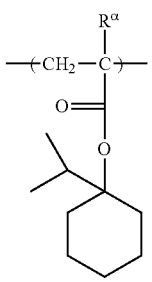
(a1-1-28) 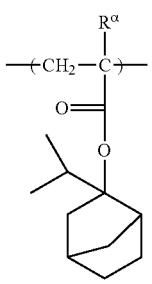
(a1-1-29) 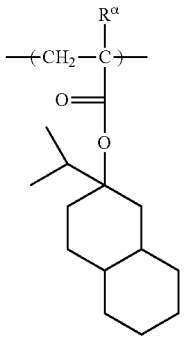
(a1-1-30) 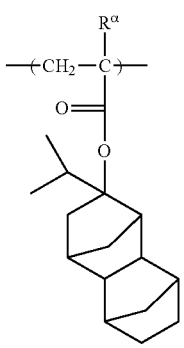
(a1-1-31) 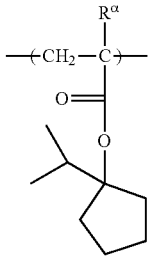

[Chemical Formula 18]
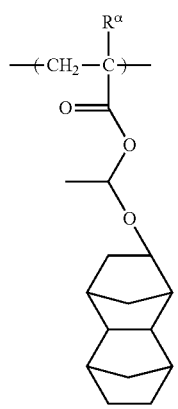 (a1-2-1)
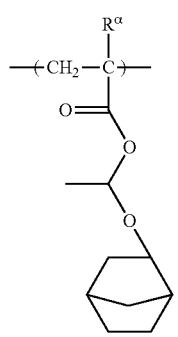 (a1-2-2)
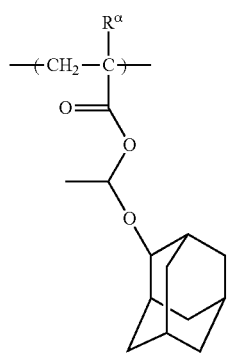 (a1-2-3)
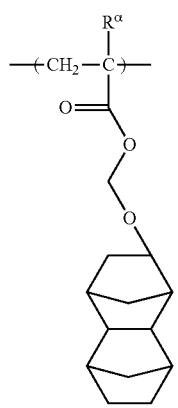 (a1-2-4)
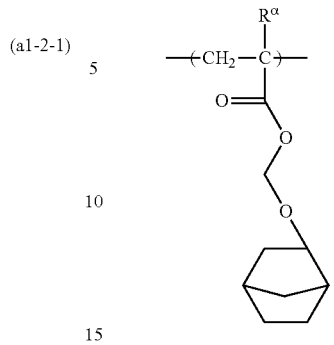 (a1-2-5)
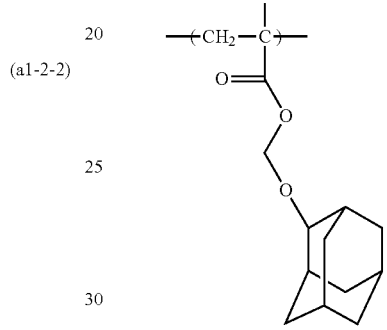 (a1-2-6)
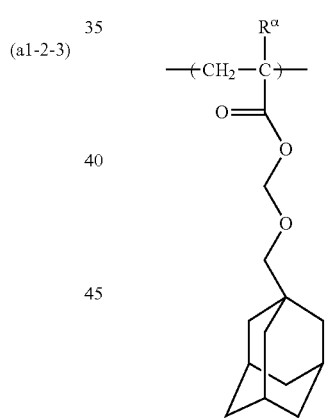 (a1-2-7)
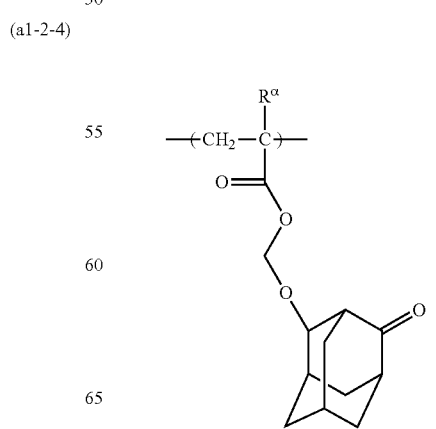 (a1-2-8)

-continued
(a1-2-9)
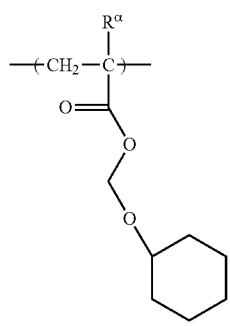
(a1-2-13)
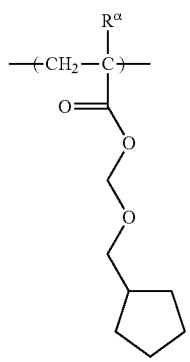
(a1-2-10)
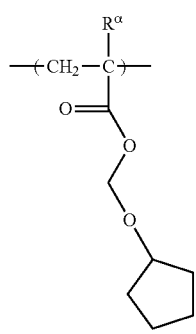
(a1-2-14)
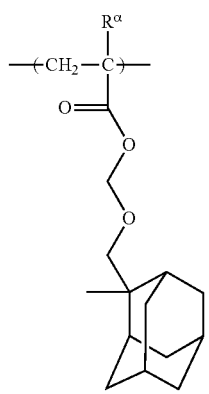
(a1-2-11)
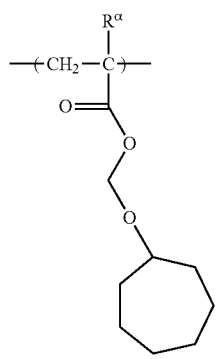
(a1-2-15)
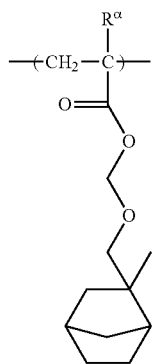
(a1-2-12)
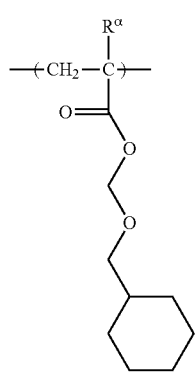
(a1-2-16)
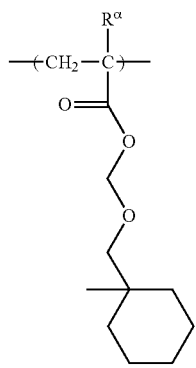

(a1-2-17) 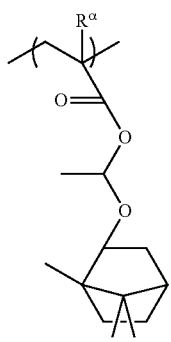
(a1-2-18) 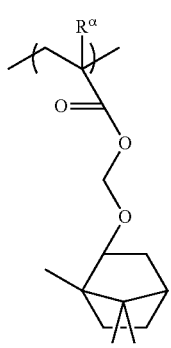
(a1-2-19) 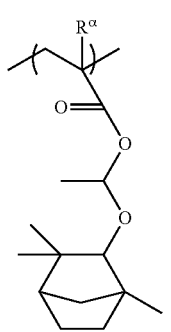
(a1-2-20) 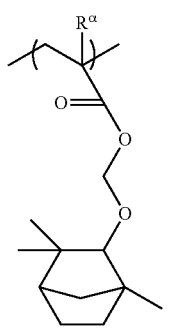
(a1-2-21) 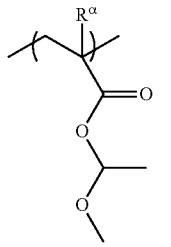
(a1-2-22) 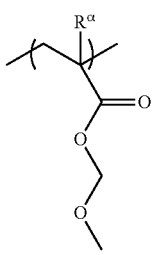
(a1-2-23) 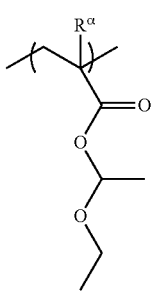
(a1-2-24) 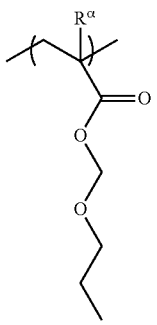
[Chemical Formula 19]
(a1-3-1) 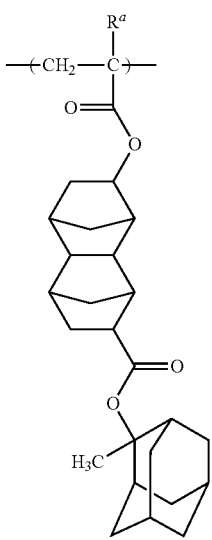

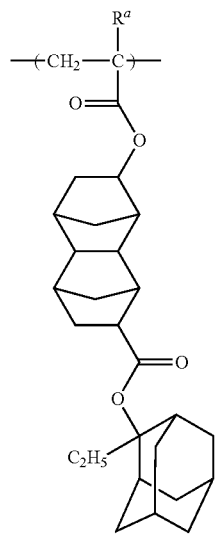 (a1-3-2)
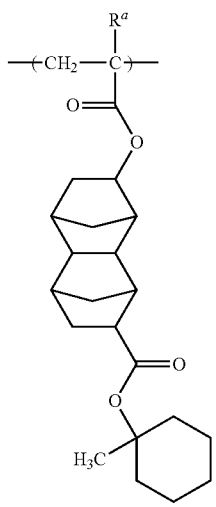 (a1-3-5)
(a1-3-3)
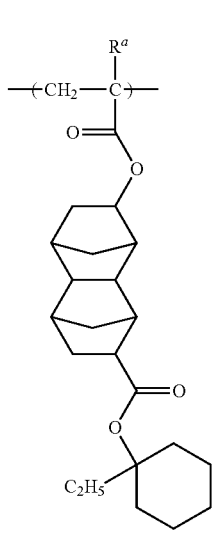 (a1-3-6)
(a1-3-4)
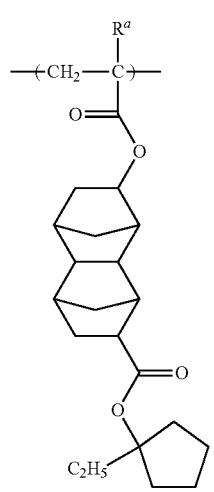
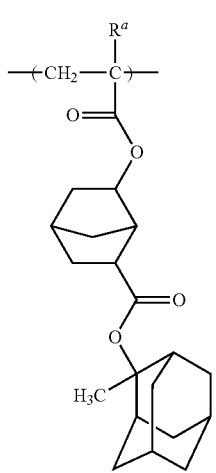 (a1-3-7)

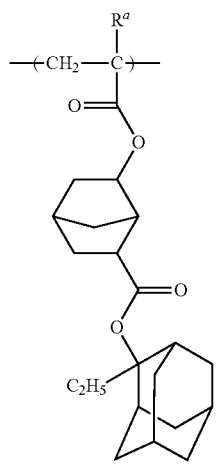
(a1-3-8)
(a1-3-9)
(a1-3-10)
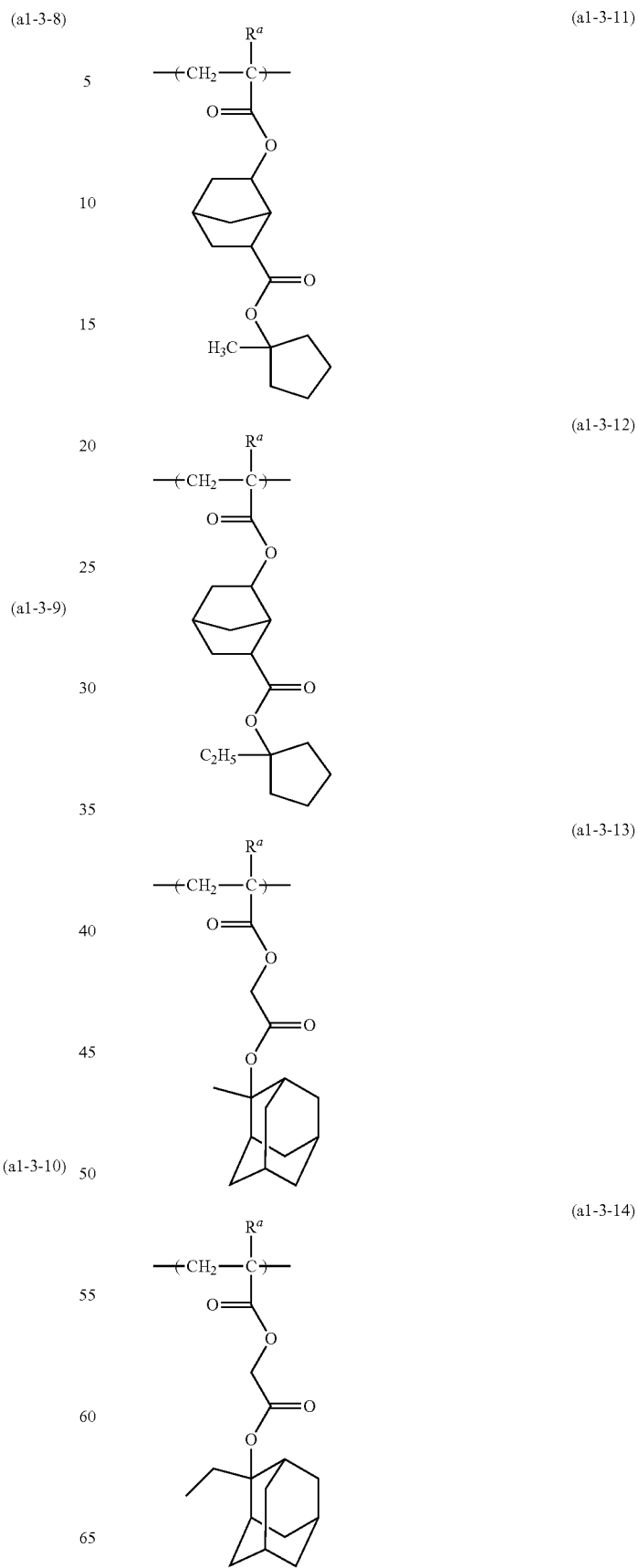
(a1-3-11)
(a1-3-12)
(a1-3-13)
(a1-3-14)

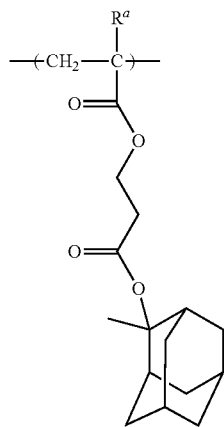 (a1-3-15)
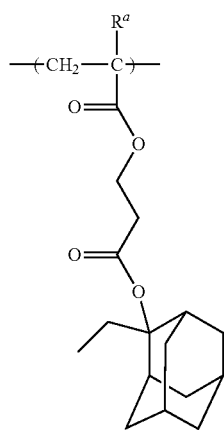 (a1-3-16)
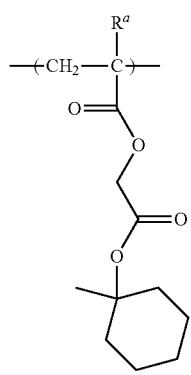 (a1-3-17)
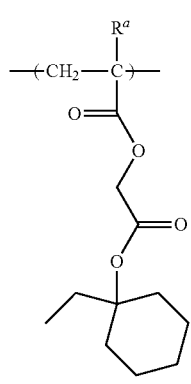 (a1-3-18)
[Chemical Formula 20]
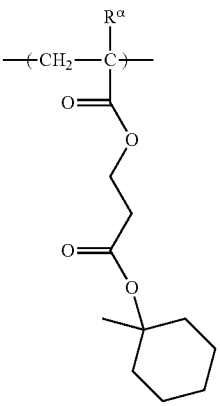 (a1-3-19)
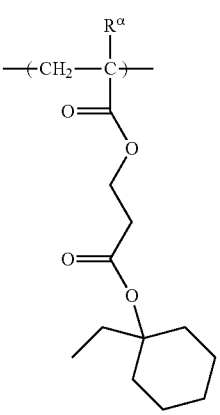 (a1-3-20)
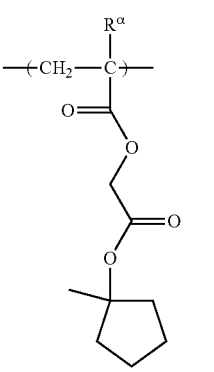 (a1-3-21)
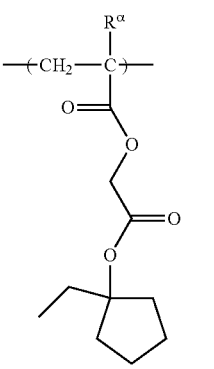 (a1-3-22)

(a1-3-23)
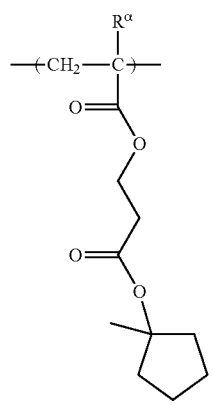
(a1-3-24)
(a1-3-26)
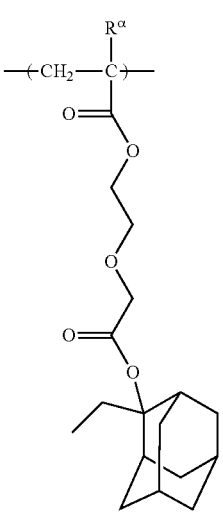
(a1-3-27)
[Chemical Formula 21]
(a1-3-25)
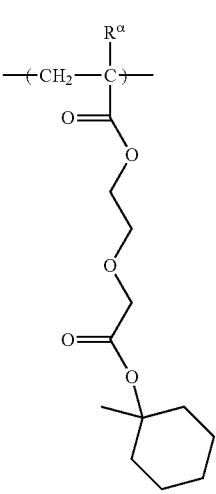
(a1-3-28)
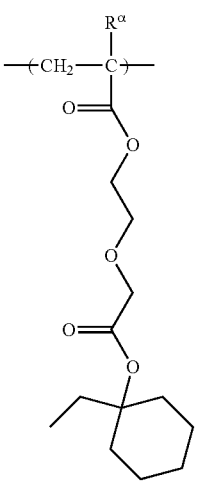

(a1-3-29)
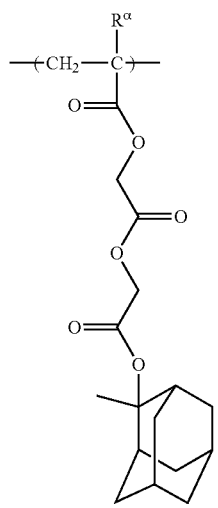
(a1-3-30)
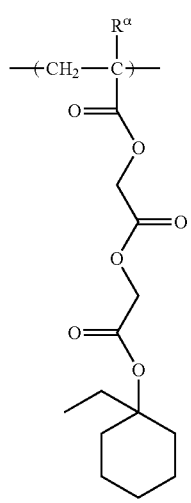
(a1-3-31)
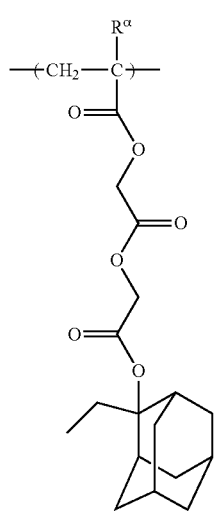
(a1-3-32)
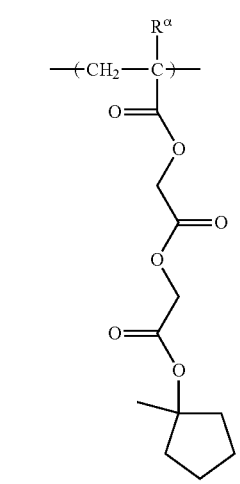
[Chemical Formula 22]
(a1-4-1)
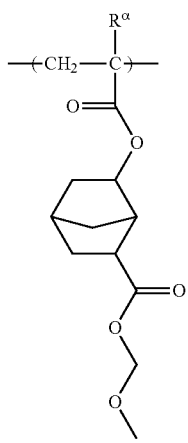
(a1-4-2)
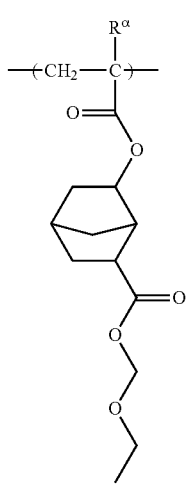

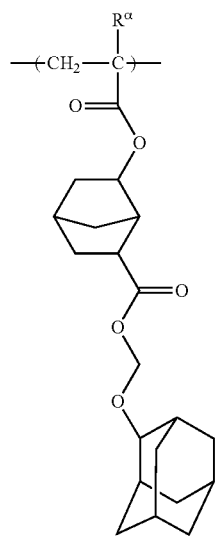
(a1-4-3)
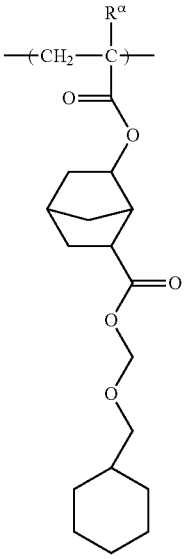
(a1-4-6)
(a1-4-4)
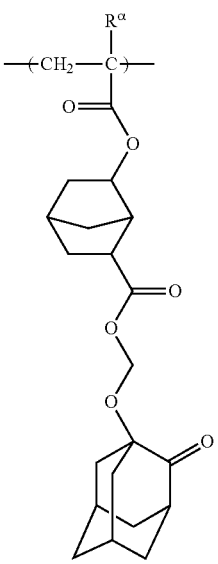
(a1-4-7)
(a1-4-5)
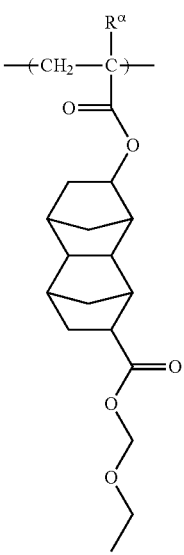
(a1-4-8)

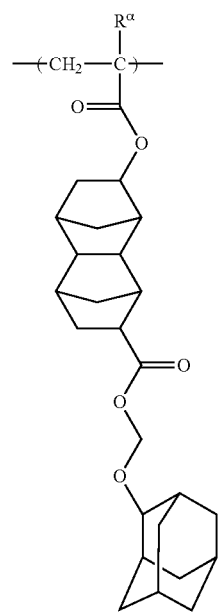
(a1-4-9)
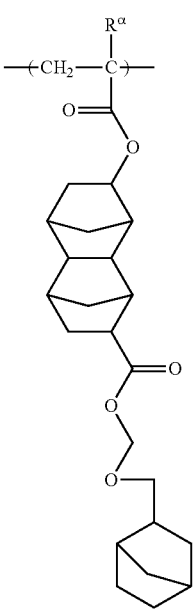
(a1-4-11)
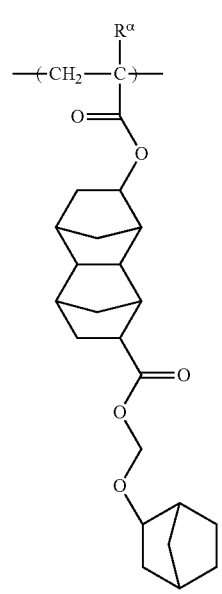
(a1-4-10)
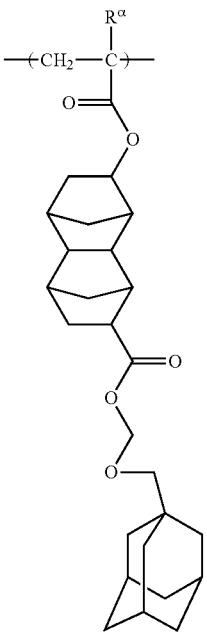
(a1-4-12)

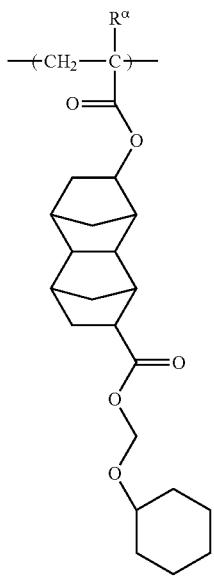 (a1-4-13)

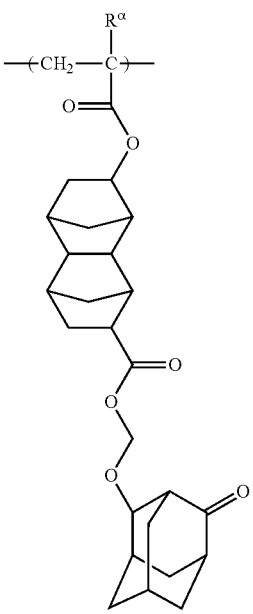 (a1-4-15)

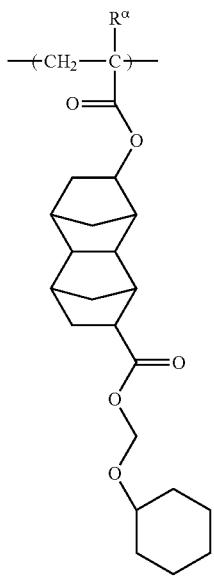 (a1-4-14)

As the structural unit (a1), one type of structural unit may be used, or two or more types may be used in combination.

Among these, structural units represented by general formula (a1-1) or (a1-3) are preferable. More specifically, at least one structural unit selected from the group consisting of structural units represented by formulas (a1-1-1) to (a-1-1-4), (a1-1-20) to (a1-1-23) and (a1-3-25) to (a1-3-28) is more preferable.

Further, as the structural unit (a1), structural units represented by general formula (a1-1-01) shown below which includes the structural units represented by formulas (a1-1-1) to (a1-1-3), and structural units represented by general formula (a1-1-02) shown below which includes the structural units represented by formulas (a1-1-16), (a1-1-17) and (a1-1-20) to (a1-1-23) are also preferable.

[Chemical Formula 23]

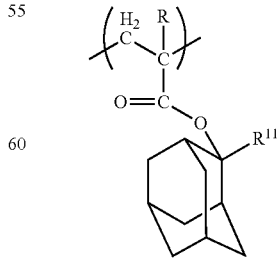 (a1-1-01)

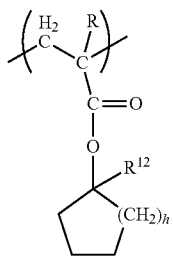
(a1-1-02)

In general formula (a1-1-01), R represents a hydrogen atom, an alkyl group of 1 to 5 carbon atoms or a halogenated alkyl group of 1 to 5 carbon atoms; and $R^{11}$ represents an alkyl group of 1 to 5 carbon atoms. In general formula (a1-1-02), R is the same as defined above; $R^{12}$ represents an alkyl group of 1 to 5 carbon atoms; and h represents an integer of 1 to 6.

In general formula (a1-1-01), R is the same as defined above.

The alkyl group of 1 to 5 carbon atoms for $R^{11}$ is the same as the alkyl group of 1 to 5 carbon atoms for R above, preferably a methyl group or an ethyl group, and most preferably an ethyl group.

In general formula (a1-1-02), R is the same as defined above.

The alkyl group of 1 to 5 carbon atoms for $R^{12}$ is the same as the alkyl group of 1 to 5 carbon atoms for R above, preferably a methyl group or an ethyl group, and most preferably an ethyl group. h is preferably 1 or 2, and most preferably 2.

In the component (A1), the amount of the structural unit (a1) based on the combined total of all structural units constituting the component (A1) is preferably 20 to 80 mol %, more preferably 20 to 70 mol %, and still more preferably 25 to 50 mol %. When the amount of the structural unit (a1) is at least as large as the lower limit of the above-mentioned range, a pattern can be easily formed using a positive resist composition prepared from the component (A1). On the other hand, when the amount of the structural unit (a1) is no more than the upper limit of the above-mentioned range, a good balance can be achieved with the other structural units.

Structural Unit (a2)

The structural unit (a2) is at least one structural unit selected from the group consisting of a structural unit derived from an acrylate ester containing a —$SO_2$-containing cyclic group (hereafter, referred to as "structural unit (a2$^S$)") and a structural unit derived from an acrylate ester containing a lactone-containing cyclic group (hereafter, referred to as "structural unit (a2$^L$)").

By virtue of the structural unit (a2) containing a —$SO_2$— containing cyclic group or a lactone-containing cyclic group, a positive resist composition containing the component (A1) including the structural unit (a2) is capable of improving the adhesion of a resist film to a substrate and the compatibility with the developing solution containing water, thereby contributing to improvement of lithography properties.

Structural Unit (a2$^S$):

The structural unit (a2$^s$) is a structural unit derived from an acrylate ester containing a —$SO_2$— containing cyclic group.

Here, an "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group. The ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The —$SO_2$-containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20, still more preferably 4 to 15, and most preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton has been substituted with a —O—$SO_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of the substituent include an alkyl group, an alkoxy group, a halogen atom, a halogenated alkyl group, a hydroxy group, an oxygen atom (═O), —COOR", —OC(═O)R", a hydroxyalkyl group and a cyano group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear or branched alkoxy group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR″ group and the —OC(═O)R″ group, R″ represents a hydrogen atom or a linear, branched or cyclic alkyl group of 1 to 15 carbon atoms.

When R″ represents a linear or branched alkyl group, it is preferably an alkyl group of 1 to 10 carbon atoms, more preferably an alkyl group of 1 to 5 carbon atoms, and most preferably a methyl group or an ethyl group.

When R″ is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —SO$_2$— containing cyclic group include groups represented by general formulas (3-1) to (3-4) shown below.

[Chemical Formula 24]

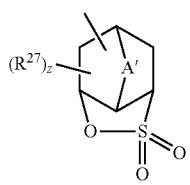

(3-1)

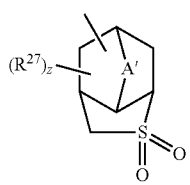

(3-2)

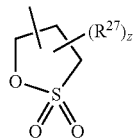

(3-3)

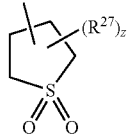

(3-4)

In the formulas, A′ represents an oxygen atom, a sulfur atom or an alkylene group of 1 to 5 carbon atoms which may contain an oxygen atom or a sulfur atom; z represents an integer of 0 to 2; and $R^{27}$ represents an alkyl group, an alkoxy group, a halogenated alkyl group, a hydroxyl group, —COOR″, —OC(═O)R″, a hydroxyalkyl group or a cyano group, wherein R″ represents a hydrogen atom or an alkyl group.

In general formulas (3-1) to (3-4) above, A′ represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A′, a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

As A′, an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

When z is 2, the plurality of $R^{27}$ may be the same or different from each other.

As the alkyl group, alkoxy group, halogenated alkyl group, —COOR″, —OC(═O)R″ and hydroxyalkyl group for $R^{27}$, the same alkyl groups, alkoxy groups, halogenated alkyl groups, —COOR″, —OC(═O)R″ and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 25]

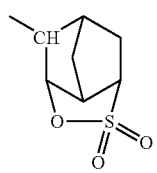

(3-1-1)

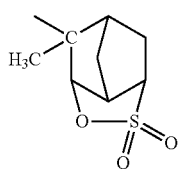 (3-1-2)
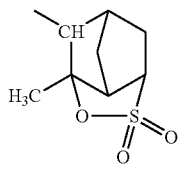 (3-1-3)
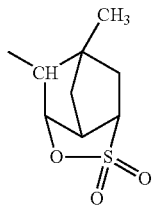 (3-1-4)
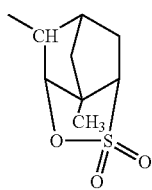 (3-1-5)
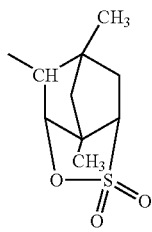 (3-1-6)
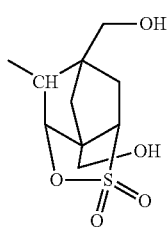 (3-1-7)
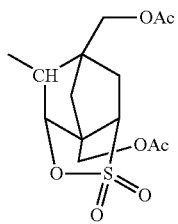 (3-1-8)
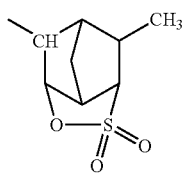 (3-1-9)
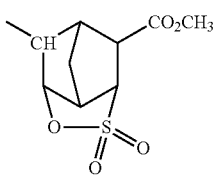 (3-1-10)
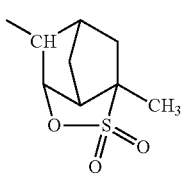 (3-1-11)
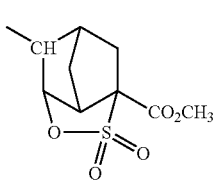 (3-1-12)
[Chemical Formula 26]
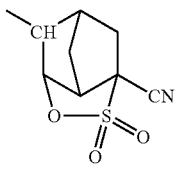 (3-1-13)
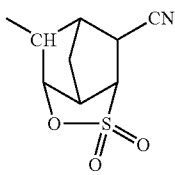 (3-1-14)
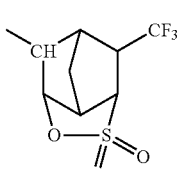 (3-1-15)
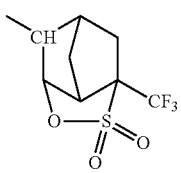 (3-1-16)
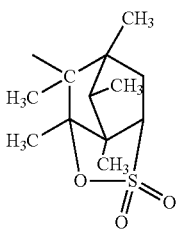 (3-1-17)

[Chemical Formula 27]
(3-1-18)
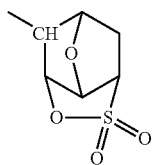
(3-1-19)
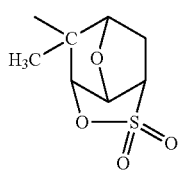
(3-1-20)
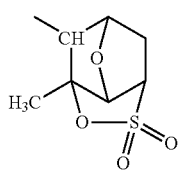
(3-1-21)
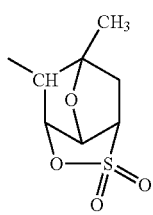
(3-1-22)
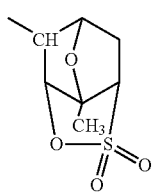
(3-1-23)
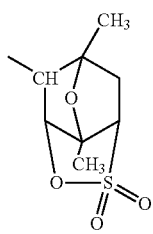
(3-1-24)
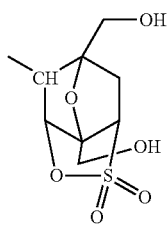
(3-1-25)
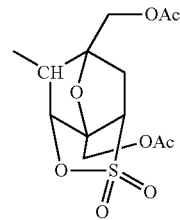
[Chemical Formula 28]
(3-1-26)
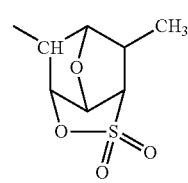
(3-1-27)
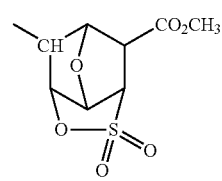
(3-1-28)
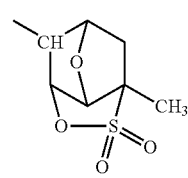
(3-1-29)
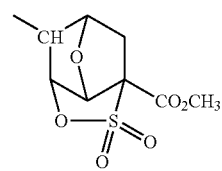
(3-1-30)
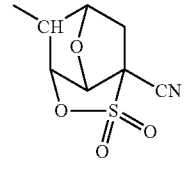
(3-1-31)
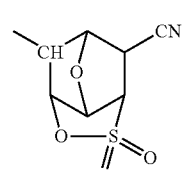
(3-1-32)
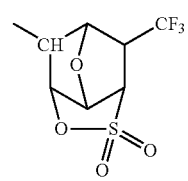

-continued

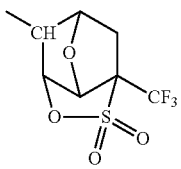
[Chemical Formula 29]

(3-1-33)

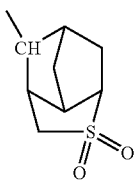

(3-2-1)

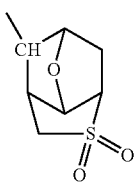

(3-2-2)

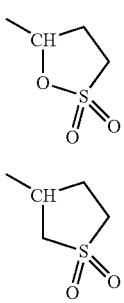

(3-3-1)

(3-4-1)

As the —SO$_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

More specific examples of the structural unit (a2$^S$) include structural units represented by general formula (a2-0) shown below.

[Chemical Formula 30]

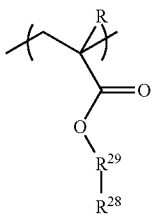

(a2-0)

In the formula, R represents a hydrogen atom, an alkyl group of 1 to 5 carbon atoms or a halogenated alkyl group of 1 to 5 carbon atoms; R$^{28}$ represents a —SO$_2$-containing cyclic group; and R$^{29}$ represents a single bond or a divalent linking group.

In general formula (a2-0), R is the same as defined above.
R$^{28}$ is the same as defined for the aforementioned —SO$_2$— containing group.
R$^{29}$ may be either a single bond or a divalent linking group. In terms of the effects of the present invention, a divalent linking group is preferable.

The divalent linking group for R$^{29}$ is not particularly limited. For example, the same divalent linking groups as those described for Y$^2$ in general formula (a1-0-2) explained above in relation to the structural unit (a1) can be mentioned. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by Y$^2$.

As the divalent linking group containing an ester bond, a group represented by general formula: —R$^{30}$—C(=O)—O— (in the formula, R$^{30}$ represents a divalent linking group) is particularly desirable. That is, the structural unit (a2$^S$) is preferably a structural unit represented by general formula (a2-0-1) shown below.

[Chemical Formula 31]

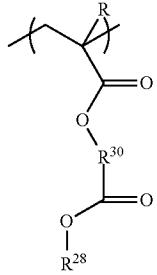

(a2-0-1)

In the formula, R and R$^{28}$ are the same as defined above; and R$^{30}$ represents a divalent linking group.

R$^{30}$ is not particularly limited. For example, the same divalent linking groups as those described for Y$^2$ in general formula (a1-0-2) explained above in relation to the structural unit (a1) can be mentioned.

As the divalent linking group for R$^{30}$, an alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent alicyclic hydrocarbon group and divalent linking group containing a hetero atom as those described above as preferable examples of Y$^2$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH(CH$_3$)—, —C(CH$_3$)$_2$— or —C(CH$_3$)$_2$CH$_2$— is particularly desirable.

As the divalent linking group containing a hetero atom, a divalent linking group containing an ether bond or an ester bond is preferable, and a group represented by the aforementioned formula -A-O—B—, -[A-C(=O)—O]$_m$—B— or -A-O—C(=O)—B— is more preferable.

Among these, a group represented by the formula -A-O—C(=O)—B— is preferable, and a group represented by the formula: —(CH$_2$)$_c$—C(=O)—O—(CH$_2$)$_d$— is particularly desirable. c represents an integer of 1 to 5, and preferably 1 or 2. d represents an integer of 1 to 5, and preferably 1 or 2.

In particular, as the structural unit (a2$^S$), a structural unit represented by general formula (a0-1-11) or (a0-1-12) shown below is preferable, and a structural unit represented by general formula (a0-1-12) shown below is more preferable.

[Chemical Formula 32]

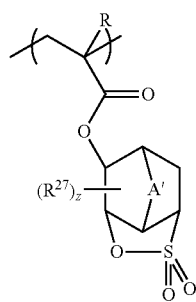

(a0-1-11)

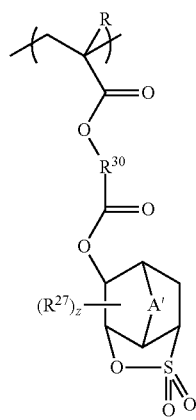

(a0-1-12)

In the formulas, R, A', R$^{27}$, z and R$^{30}$ are the same as defined above.

In general formula (a0-1-11), A' is preferably a methylene group, an oxygen atom (—O—) or a sulfur atom (—S—).

As R$^{30}$, a linear or branched alkylene group or a divalent linking group containing an oxygen atom is preferable. As the linear or branched alkylene group and the divalent linking group containing an oxygen atom represented by R$^3$), the same linear or branched alkylene groups and the divalent linking groups containing an oxygen atom as those described above can be mentioned.

As the structural unit represented by general formula (a0-1-12), a structural unit represented by general formula (a0-1-12a) or (a0-1-12b) shown below is particularly desirable.

[Chemical Formula 33]

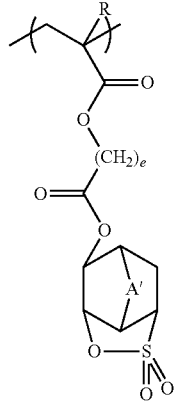

(a0-1-12a)

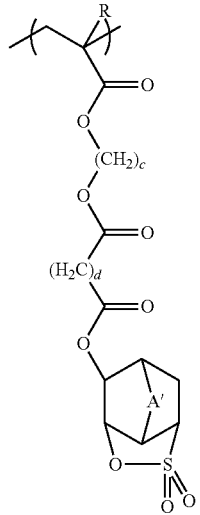

(a0-1-12b)

In the formulas, R and A' are the same as defined above; and each of c to e independently represents an integer of 1 to 3.

Structural Unit (a2$^L$):

The structural unit (a2$^L$) is a structural unit derived from an acrylate ester containing a lactone-containing cyclic group.

The term "lactone-containing cyclic group" refers to a cyclic group including a ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit (a2$^L$) is not particularly limited, and an arbitrary structural unit may be used. Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

Examples of the structural unit (a2$^L$) include structural units represented by the aforementioned general formula (a2-0) in which the R$^{28}$ group has been substituted with a lactone-containing cyclic group. Specific examples include structural units represented by general formulas (a2-1) to (a2-5) shown below.

[Chemical Formula 34]

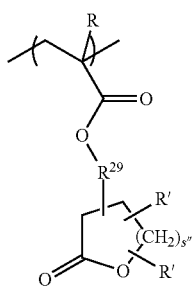
(a2-1)

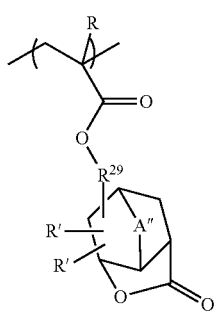
(a2-2)

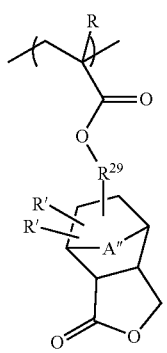
(a2-3)

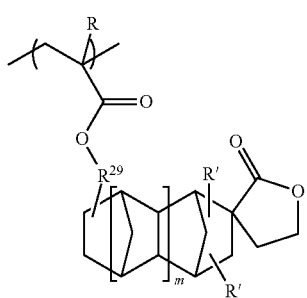
(a2-4)

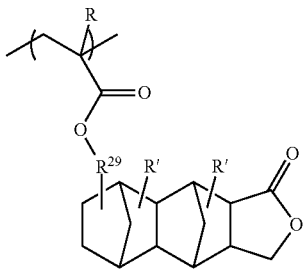
(a2-5)

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; R$^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group In terms of industrial availability, R' is preferably a hydrogen atom.

The alkyl group for R" may be any of linear, branched or cyclic.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As examples of A", the same groups as those described above for A' in general formula (3-1) can be given. A" is preferably an alkylene group of 1 to 5 carbon atoms, an oxygen atom (—O—) or a sulfur atom (—S—), and more preferably an alkylene group of 1 to 5 carbon atoms or —O—. As the alkylene group of 1 to 5 carbon atoms, a methylene group or a dimethylethylene group is preferable, and a methylene group is particularly desirable.

R$^{29}$ is the same as defined for R$^{29}$ in the aforementioned general formula (a2-0).

In formula (a2-1), s" is preferably 1 or 2.
Specific examples of structural units represented by general formulas (a2-1) to (a2-5) are shown below. In the formulae shown below, $R^\alpha$ represents a hydrogen atom, a methyl group or a trifluoromethyl group.
[Chemical Formula 35]
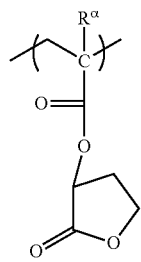
(a2-1-1)
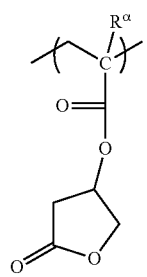
(a2-1-2)
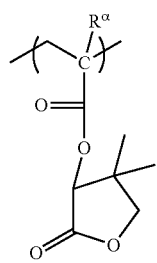
(a2-1-3)
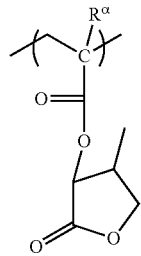
(a2-1-4)
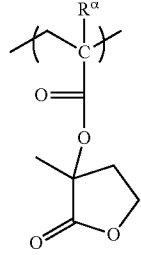
(a2-1-5)
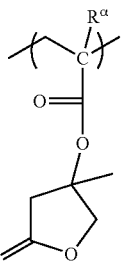
(a2-1-6)
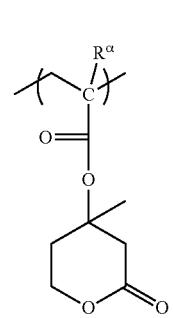
(a2-1-7)
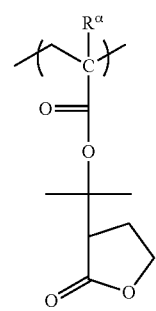
(a2-1-8)
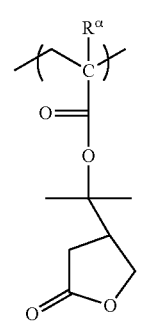
(a2-1-9)
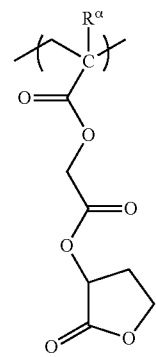
(a2-1-10)

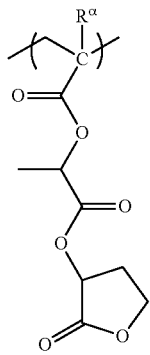 (a2-1-11)
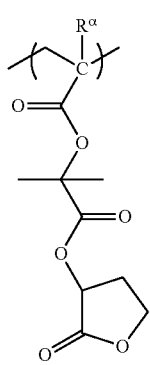 (a2-1-12)
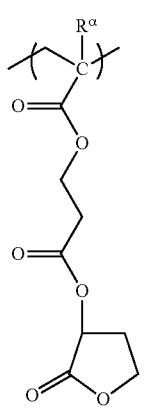 (a2-1-13)
[Chemical Formula 36]
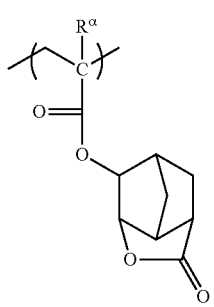 (a2-2-1)
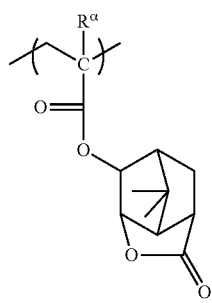 (a2-2-2)
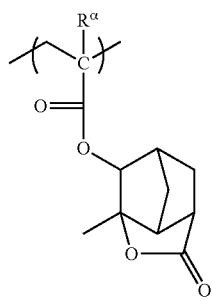 (a2-2-3)
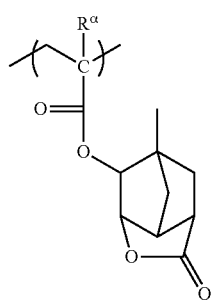 (a2-2-4)
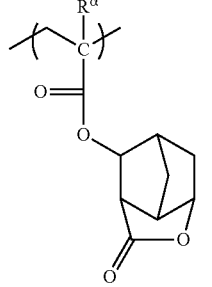 (a2-2-45)
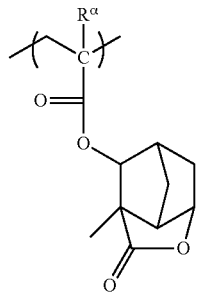 (a2-2-6)

(a2-2-7)
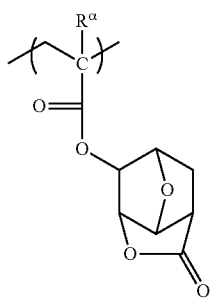
(a2-2-8)
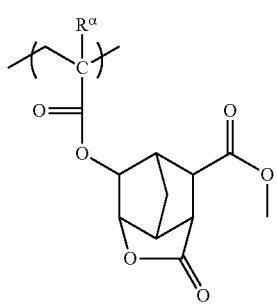
(a2-2-9)
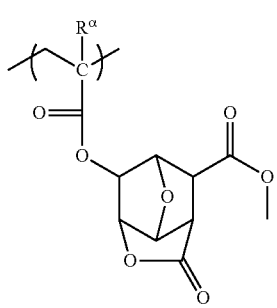
(a2-2-10)
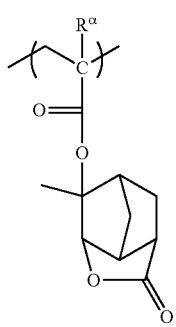
(a2-2-11)
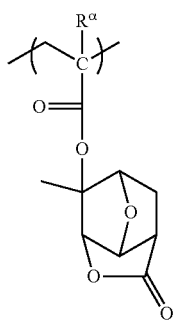
(a2-2-12)
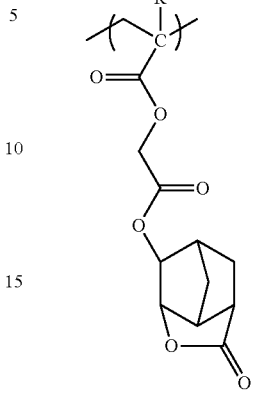
(a2-2-13)
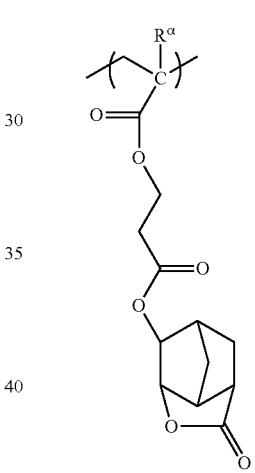
(a2-2-14)
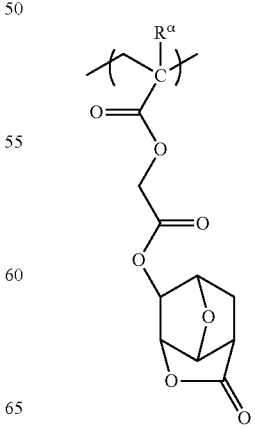

(a2-2-15) 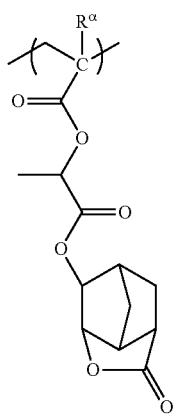
(a2-2-16) 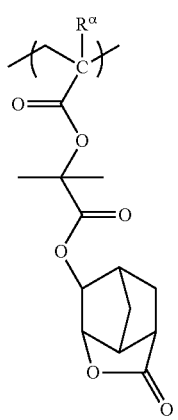
(a2-2-17) 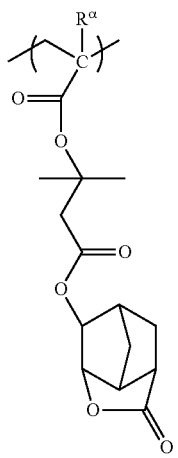
[Chemical Formula 37]
(a2-3-1) 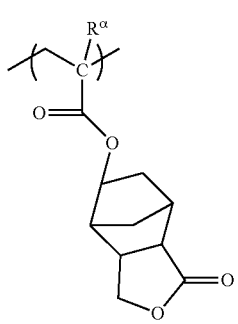
(a2-3-2) 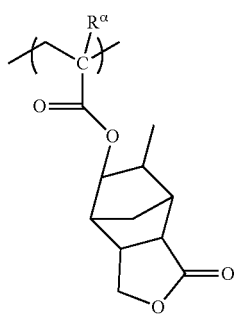
(a2-3-3) 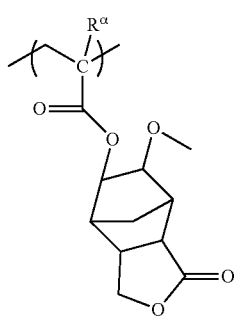
(a2-3-4) 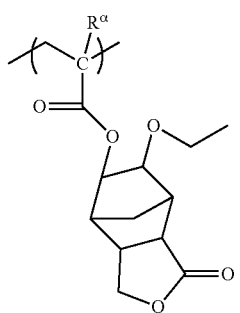
(a2-3-5) 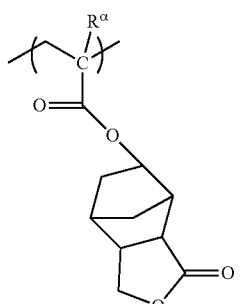
[Chemical Formula 38]
(a2-4-1) 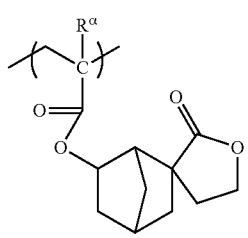

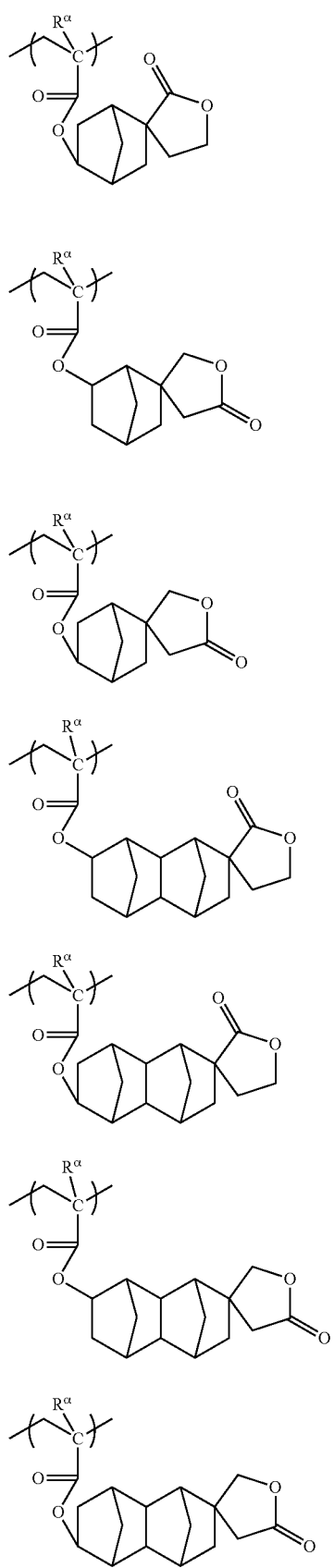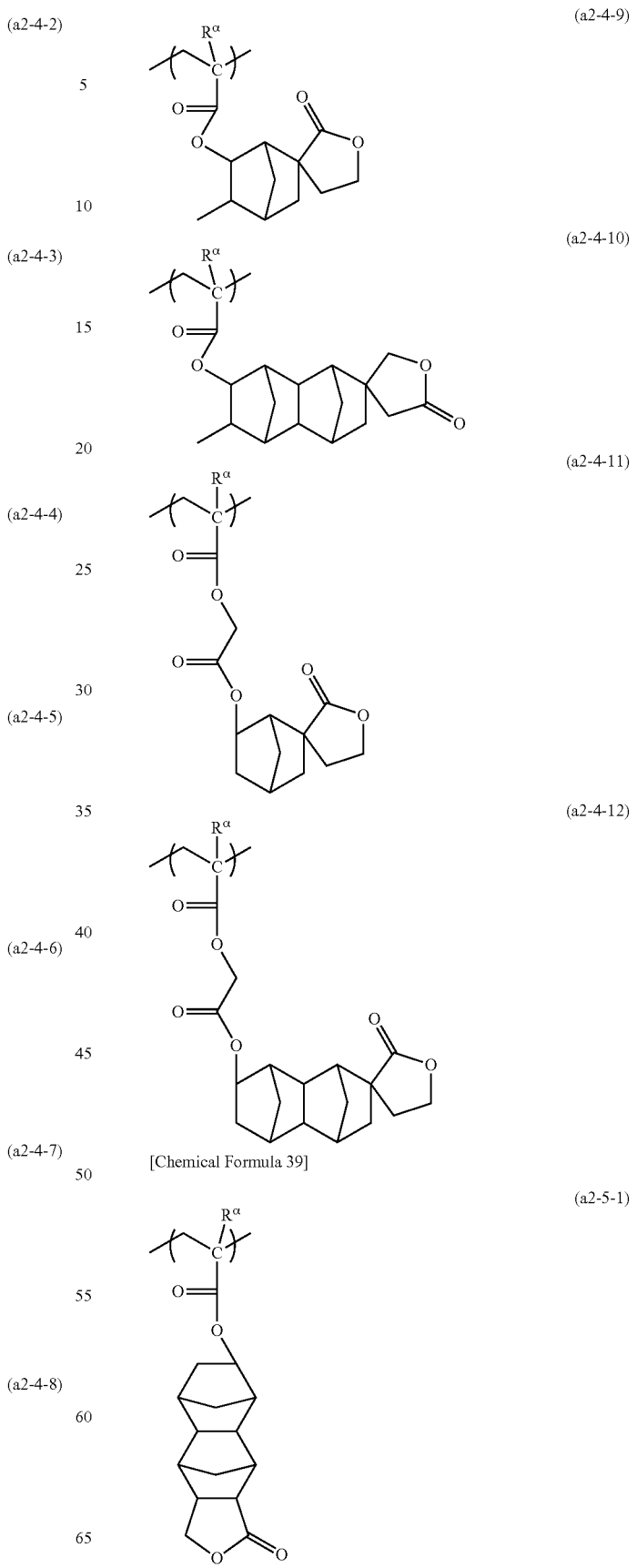

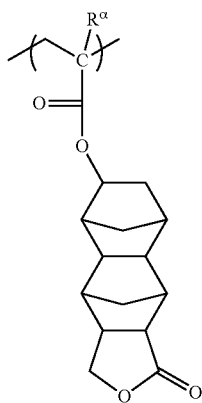
(a2-5-2)

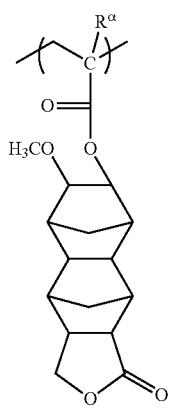
(a2-5-3)

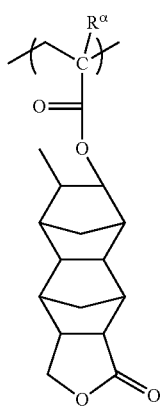
(a2-5-4)

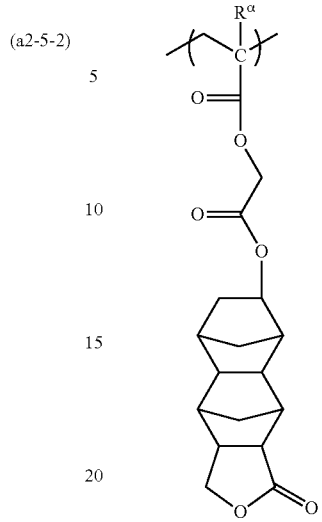
(a2-5-5)

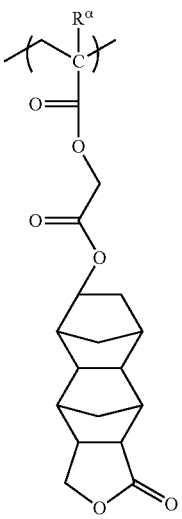
(a2-5-6)

As the structural unit ($a2^L$), it is preferable to include at least one structural unit selected from the group consisting of structural units represented by the aforementioned general formulas (a2-1) to (a2-5), more preferably at least one structural unit selected from the group consisting of structural units represented by the aforementioned general formulas (a2-1) to (a2-3), and most preferably at least one structural unit selected from the group consisting of structural units represented by the aforementioned general formulas (a2-1) and (a2-2).

Specifically, it is preferable to use at least one structural unit selected from the group consisting of formulas (a2-1-1), (a2-1-2), (a2-2-1), (a2-2-7), (a2-2-12), (a2-2-14), (a2-3-1) and (a2-3-5).

In the component (A1), as the structural unit (a2), one type of structural unit may be used, or two or more types may be used in combination. For example, as the structural unit (a2), a structural unit ($a2^S$) may be used alone, or a structural unit ($a2^L$), or a combination of these structural units may be used. Further, as the structural unit ($a2^S$) or the structural unit ($a2^L$), either a single type of structural unit may be used, or two or more types may be used in combination.

In the present invention, it is particularly desirable that the structural unit (a2) includes at least the structural unit ($a2^S$), as the effects of the present invention are improved.

In the component (A1), the amount of the structural unit (a2) based on the combined total of all structural units constituting the component (A1) is preferably 1 to 80 mol %, more preferably 10 to 70 mol %, still more preferably 10 to 65 mol %, and most preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties such as DOF and CDU and pattern shape can be improved.

Structural Unit (a3)

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 40]

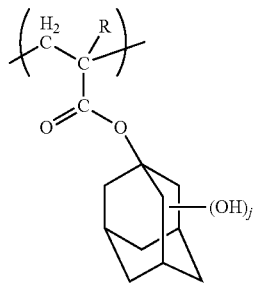
(a3-1)

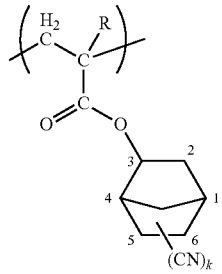
(a3-2)

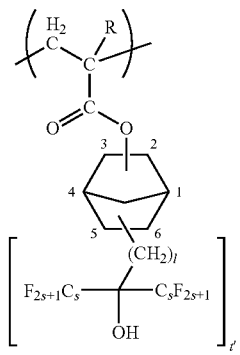
(a3-3)

In the formulas, R is the same as defined above; j represents an integer of 1 to 3; k represents an integer of 1 to 3; t' represents an integer of 1 to 3; l represents an integer of 1 to 5; and s represents an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, in formula (a3-3), it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

In the component (A1), as the structural unit (a3), one type of structural unit may be used, or two or more types may be used in combination.

In the component (A1), the amount of the structural unit (a3) based on the combined total of all structural units constituting the component (A1) is preferably 5 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

Structural Unit (a4)

The component (A1) may also have a structural unit (a4) which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitation, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 41]

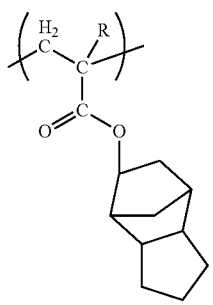

(a4-1)

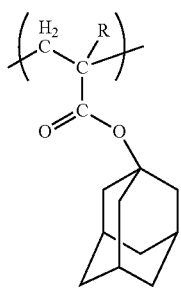

(a4-2)

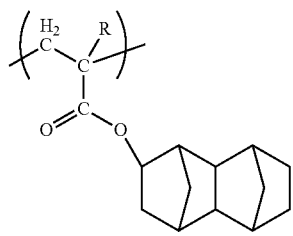

(a4-3)

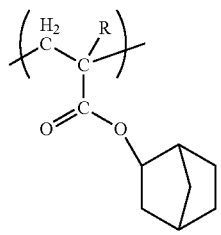

(a4-4)

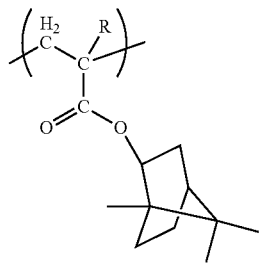

(a4-5)

In the formulas, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the present invention, the component (A1) is a copolymer having the structural unit derived from an aromatic ring-containing monomer and a structural unit (a1) derived from an aromatic ring non-containing monomer, and examples thereof include a copolymer which further includes any of the structural units (a2), (a3) and (a4).

In the component (A), as the component (A1), 1 kind of resin may be used, or 2 or more kinds of resins may be used in combination, provided that 20 mol % to 80 mol % of all the structural units of the resin component is a structural unit derived from an aromatic ring-containing monomer.

The weight average molecular weight (Mw) (the polystyrene equivalent value determined by gel permeation chromatography) of the component (A1) is not particularly limited, but is preferably 3,000 to 300,000, more preferably 3,000 to 300,000, and most preferably 3,000 to 300,000. When the weight average molecular weight (Mw) is within the above-mentioned range, film formability by spin-coating is excellent, and solubility in a solvent is excellent, so that a solution can be easily prepared.

Further, the dispersity (Mw/Mn) is preferably 1.0 to 5.0, more preferably 1.0 to 3.0, and most preferably 1.2 to 2.5. Here, Mn is the number average molecular weight.

In the chemically amplified positive resist composition, the amount of the component (A1) can be appropriately adjusted depending on the thickness of the resist film to be formed, and the like.

Further, the resin concentration of the chemically amplified positive resist composition is not particularly limited.

<Component (B)>

As the component (B), there is no particular limitation, and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 42]

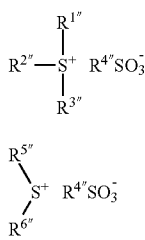

In the formulas above, $R^{1\prime\prime}$ to $R^{3\prime\prime}$, $R^{5\prime\prime}$ and $R^{6\prime\prime}$ each independently represent an aryl group or alkyl group which may have a substituent, wherein two of $R^{1\prime\prime}$ to $R^{3\prime\prime}$ may be bonded to each other to form a ring with the sulfur atom; and $R^{4\prime\prime}$ represents an alkyl group, a halogenated alkyl group, an aryl group or an alkenyl group which may have a substituent, with the provision that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group which may have a substituent or an alkyl group which may have a substituent. In formula (b-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group of $R^{1\prime\prime}$ to $R^{3\prime\prime}$ is not particularly limited, and includes, for example, an aryl group of 6 to 20 carbon atoms. The aryl group is preferably an aryl group having 6 to 10 carbon atoms because it can be synthesized at a low cost. Specific examples thereof include a phenyl group and a naphthyl group.

The aryl group may have a substituent. The expression "has a substituent" means that part or all of the hydrogen atoms within the aryl group has been substituted with a substituent. Examples of the substituent include an alkyl group, an alkoxy group, a halogen atom, a hydroxyl group, an alkoxyalkyloxy group, —O—$R^{50}$—C(=O)—(O)$_n$—$R^{51}$ (in the formula, $R^{50}$ represents an alkylene group or a single bond, $R^{51}$ represents an acid dissociable group or an acid non-dissociable group, and n represents 0 or 1.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

Examples of the alkoxyalkyloxy group which substitutes the hydrogen atoms within the aryl group include —O—C($R^{47}$)($R^{48}$)—O—$R^{49}$ (in the formula, each of $R^{47}$ and $R^{48}$ independently represents a hydrogen atom or a linear or branched alkyl group, and $R^{49}$ represents an alkyl group, wherein $R^{48}$ and $R^{49}$ may be mutually bonded to form a ring structure, provided that at least one of $R^{47}$ and $R^{48}$ represents a hydrogen atom.

The alkyl group for $R^{47}$ and $R^{48}$ preferably has 1 to 5 carbon atoms. As the alkyl group, an ethyl group or a methyl group is preferable, and a methyl group is most preferable.

Further, it is preferable that at least one of $R^{47}$ and $R^{48}$ represent a hydrogen atom, and the other represent a hydrogen atom or a methyl group. It is particularly desirable that both of $R^{47}$ and $R^{48}$ represent a hydrogen atom.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10.

Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

$R^{48}$ and $R^{49}$ may be mutually bonded to form a ring structure. In such a case, a cyclic group is formed by $R^{48}$, $R^{49}$, the oxygen atom having $R^{49}$ bonded thereto, and the carbon atom having the oxygen atom and $R^{48}$ bonded thereto. Such a cyclic group is preferably a 4- to 7-membered ring, and more preferably a 4- to 6-membered ring.

In the —O—$R^{50}$S—C(=O)—(O)$_n$—$R^{51}$ group which may substitute the hydrogen atoms within the aryl group, the alkylene group for $R^{50}$ is preferably a linear or branched alkylene group of 1 to 5 carbon atoms. Examples of the alkylene group include a methylene group, an ethylene group, a trimethylene group, a tetramethylene group and a 1,1-dimethylethylene group.

The acid dissociable group for $R^{51}$ is not particularly limited as long as it is an organic group that is dissociable by the action of an acid (generated from the component (B) upon exposure), and examples thereof include the same acid dissociable groups as those described above in the explanation of the structural unit (a0). Among these, a tertiary alkyl ester-type acid dissociable group is preferable.

Examples of the acid non-dissociable group for $R^{15}$ include a linear alkyl group which may have as substituent, a branched alkyl group (excluding tertiary alkyl groups) which may have a substituent, and acid non-dissociable, aliphatic cyclic group. Examples of the acid non-dissociable, aliphatic cyclic groups include the same groups as those described above for the structural unit (a4). Examples of preferable acid non-dissociable groups include a decyl group, a tricyclodecyl group, an adamantyl group, a 1-(1-adamantyl)methyl group, a tetracyclododecyl group, an isobornyl group and a norbornyl group.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkyl group may have a substituent. The expression "has a substituent" means that part or all of the hydrogen atoms within the alkyl group has been substituted with a substituent. Examples of the substituent include the same groups as those described above for the substituent of the aforementioned aryl group.

In formula (b-1), two of $R^{1\prime\prime}$ to $R^{3\prime\prime}$ may be mutually bonded to form a ring with the sulfur atom. The ring may be saturated or unsaturated.

Further, the ring may be monocyclic or polycyclic. For example, when either one or both of the two of $R^{1\prime\prime}$ to $R^{3\prime\prime}$ represent a cyclic group (a cyclic alkyl group or an aryl group), a polycyclic ring (condensed ring) is formed when the two groups are bonded.

When two of $R^{1\prime\prime}$ to $R^{3\prime\prime}$ are mutually bonded to form a ring, the ring containing the sulfur atom in the skeleton thereof is preferably a 3 to 10-membered ring, and most preferably a 5 to 7-membered ring.

Specific examples of the ring formed by two of $R^{1\prime\prime}$ to $R^{3\prime\prime}$ mutually bonded include benzothiophene, dibenzothiophene, 9H-thioxanthene, thioxanthene, thianthrene, phenoxathiine, tetrahydrothiophenium and tetrahydrothiopyranium.

When two of $R^{1\prime\prime}$ to $R^{3\prime\prime}$ are bonded to each other to form a ring with the sulfur atom, the remaining one of $R^{1\prime\prime}$ to $R^{3\prime\prime}$ is preferably an aryl group.

In the compound represented by formula (b-1), preferable examples of the cation moiety in which all of $R^{1\prime\prime}$ to $R^{3\prime\prime}$ represents a phenyl group which may have a substituent, i.e., the cation moiety having a triphenylsulfonium skeleton, include cation moieties represented by formulas (I-1-1) to (I-1-14) shown below.

[Chemical Formula 43]

(I-1-1)

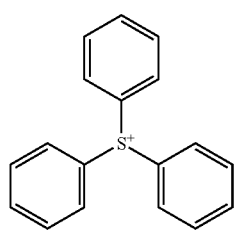

(I-1-2)

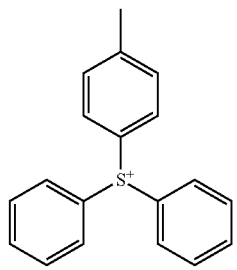

(I-1-3)

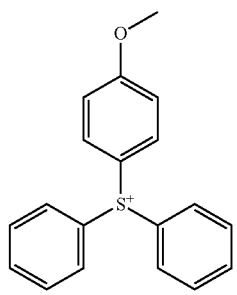

(I-1-4)

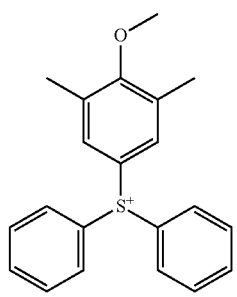

(I-1-5)

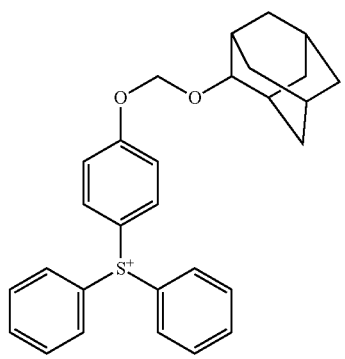

(I-1-6-)

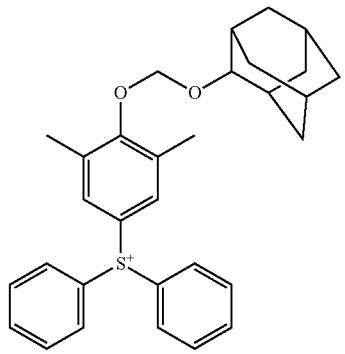

(I-1-7)

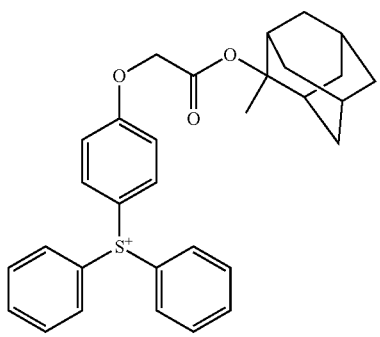

[Chemical Formula 44]

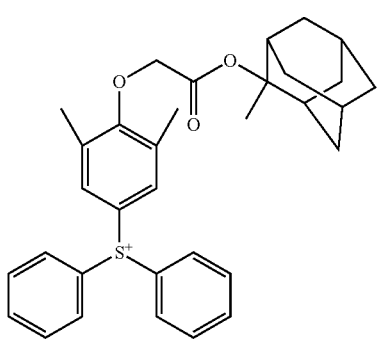

(I-1-9)

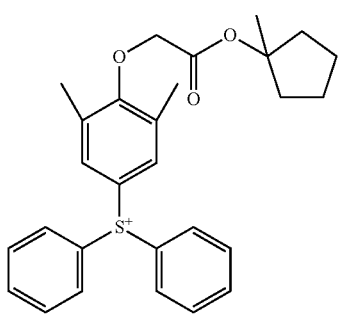

(I-1-10)

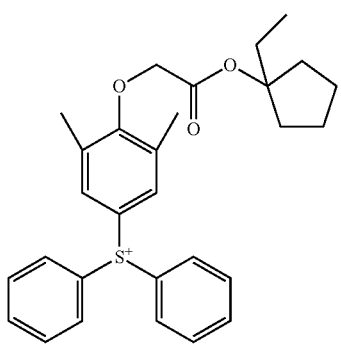

(I-1-11)

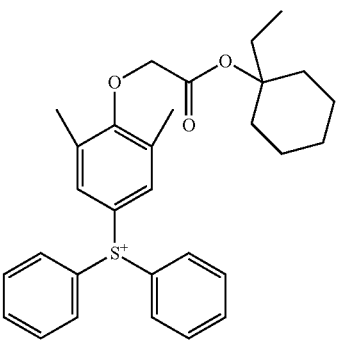

(I-1-12)

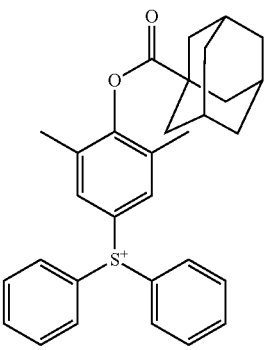

(I-1-13)

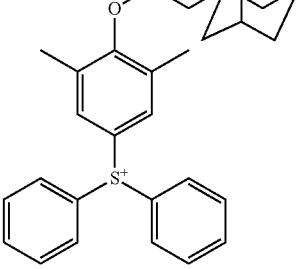

(I-1-14)

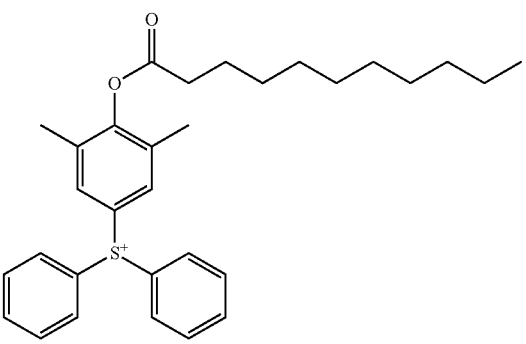

Further, a cation moiety in which part or all of the phenyl groups have been replaced with a naphthyl group which may have a substituent can also be given as a preferable example. It is preferable that 1 or 2 of the 3 phenyl groups are replaced with a naphthyl group.

Furthermore, in the compound represented by formula (b-1), preferable examples of the cation moiety in which two of $R^{1\prime\prime}$ to $R^{3\prime\prime}$ are mutually bonded to form a ring with the sulfur atom include cation moieties represented by formulas (I-11-10) to (I-11-13) shown below.

[Chemical Formula 45]

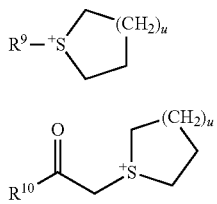

(I-11-10)

(I-11-11)

In the formulas, $R^9$ represents a phenyl group which may have a substituent, a naphthyl group which may have a substituent, or an alkyl group of 1 to 5 carbon atoms; $R^{10}$ represents a phenyl group which may have a substituent, a naphthyl group which may have a substituent, an alkyl group of 1 to 5 carbon atoms, an alkoxy group of 1 to 5 carbon atoms, or a hydroxy group; and u represents an integer of 1 to 3.

[Chemical Formula 46]

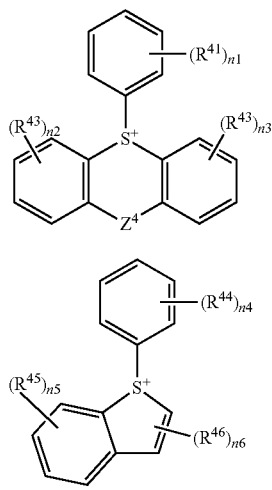

(I-11-12)

(I-11-13)

In the formulas, $Z^4$ represents a single bond, a methylene group, a sulfur atom, an oxygen atom, a nitrogen atom, a carbonyl group, —SO—, —SO$_2$—, —SO$_3$—, —COO—, —CONH— or —N(R$_N$)— (R$_N$ represents an alkyl group of 1 to 5 carbon atoms); each of $R^{41}$ to $R^{46}$ independently represents an alkyl group, an acetyl group, an alkoxy group, a carboxy group, a hydroxy group or a hydroxyalkyl group; each of $n_1$ to $n_5$ independently represents an integer of 0 to 3; and $n_6$ represents an integer of 0 to 2.

In formulas (I-11-10) and (I-11-11), examples of the substituent for the phenyl group or the naphthyl group represented by $R^9$ and $R^{10}$ include the same substituents as those described above for the aryl group represented by $R^{1\prime\prime}$ to $R^{3\prime\prime}$. Further, examples of the substituent for the alkyl group represented by $R^9$ and $R^{10}$ include the same substituents as those described above for the alkyl group represented by $R^{1\prime\prime}$ to $R^{3\prime\prime}$.

u is an integer of 1 to 3, and most preferably 1 or 2.

In general formulas (I-11-12) and (I-11-13), with respect to $R^{41}$ to $R^{14}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

In formulas (b-1) and (b-2), $R^{4\prime\prime}$ represents an alkyl group, a halogenated alkyl group, an aryl group or an alkenyl group which may have a substituent.

The alkyl group for $R^{4\prime\prime}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4\prime\prime}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for $R^{4\prime\prime}$ is preferably an aryl group of 6 to 20 carbon atoms.

The alkenyl group for $R^{4\prime\prime}$ is preferably an alkenyl group of 2 to 10 carbon atoms.

With respect to $R^{4\prime\prime}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4\prime\prime}$ may have one substituent, or two or more substituents.

Examples of the substituent include a halogen atom, a hetero atom, an alkyl group, and a group represented by the formula X-Q$^1$- (in the formula, Q$^1$ represents a divalent linking group containing an oxygen atom; and X represents a hydrocarbon group of 3 to 30 carbon atoms which may have a substituent).

Examples of halogen atoms and alkyl groups as substituents for $R^{4'''}$ include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula X-Q'-, Q' represents a divalent linking group containing an oxygen atom.

$Q^1$ may contain an atom other than oxygen. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$— and —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

$Q^1$ is preferably a divalent linking group containing an ester linkage or ether linkage, and more preferably a group of —$R^9$—O—, —$R^{92}$—O—C(=O)—, —C(=O)—O—, —C(=O)—O—$R^{93}$—, or —C(=O)—O—$R^{93}$—O—C(=O)—.

In the group represented by the formula X-$Q^1$-, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for X, there is no particular limitation as long as it is an atom other than carbon and hydrogen. Examples of hetero atoms include a halogen atom, an oxygen atom, a sulfur atom and a nitrogen atom. Examples of the halogen atom include a fluorine atom, a chlorine atom, an iodine atom and a bromine atom.

The "substituent group containing a hetero atom" (hereafter, referred to as "hetero atom-containing substituent") may consist of a hetero atom, or may be a group containing a group or atom other than a hetero atom.

Specific examples of the hetero atom-containing substituent for substituting part of the carbon atoms constituting the aliphatic hydrocarbon group include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the hetero atom-containing substituent is —NH—, the substituent for substituting H (an alkyl group, an acyl group or the like) preferably has 1 to 10 carbon atoms, more preferably 1 to 8 carbon atoms, and most preferably 1 to 5 carbon atoms.

When the aliphatic hydrocarbon group is cyclic, the aliphatic hydrocarbon group may contain any of these substituent groups in the ring structure.

Examples of the hetero atom-containing substituent for substituting part or all of the hydrogen atoms constituting the aliphatic hydrocarbon group include a halogen atom, an alkoxy group, a hydroxy group, —C(=O)—R$^{80}$ [R$^{80}$ represents an alkyl group], —COOR$^{81}$ [R$^{81}$ represents a hydrogen atom or an alkyl group], a halogenated alkyl group, a halogenated alkoxy group, an amino group, an amido group, a nitro group, an oxygen atom (=O), a sulfur atom and a sulfonyl group (SO$_2$).

Examples of the halogen atom for the hetero atom-containing substituent include a fluorine atom, a chlorine atom, a bromine atom and an iodine atom, and a fluorine atom is preferable.

The alkyl group within the alkoxy group for the hetero atom-containing substituent may be linear, branched, cyclic, or a combination thereof. The number of carbon atoms thereof is preferably 1 to 30. When the alkyl group is linear or branched, the number of carbon atoms thereof is preferably 1 to 20, more preferably 1 to 17, still more preferably 1 to 15, and most preferably 1 to 10. Specific examples include the same alkyl groups as those described later as examples of linear or branched, saturated hydrocarbon group. When the alkyl group is cyclic (i.e., a cycloalkyl group), the number of carbon atoms is preferably 3 to 30, more preferably 3 to 20, still more preferably 3 to 15, still more preferably 4 to 12, and most preferably 5 to 10. The alkyl group may be monocyclic or polycyclic. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Specific examples of the polycycloalkane include adamantane, norbornane, isobornane, tricyclodecane and tetracyclododecane. These cycloalkyl groups may or may not have part or all of the hydrogen atoms bonded to the ring substituted with a substituent such as a fluorine atom or a fluorinated alkyl group.

In the —C(=O)—R$^{80}$ group and the —COOR$^{81}$ group for the hetero atom-containing substituent, examples of the alkyl group for R$^{80}$ and R$^{81}$ include the same alkyl groups as those described above for the alkyl group within the aforementioned alkoxy group.

Examples of the alkyl group within the halogenated alkyl group for the hetero atom-containing substituent include the same alkyl groups as those described above for the alkyl group within the aforementioned alkoxy group. As the halogenated alkyl group, a fluorinated alkyl group is particularly desirable.

Examples of the halogenated alkoxy group for the hetero atom-containing substituent include the aforementioned alkoxy groups in which part or all of the hydrogen atoms have been substituted with the aforementioned halogen atoms. As the halogenated alkoxy group, a fluorinated alkoxy group is preferable.

Examples of the hydroxyalkyl group for the hetero atom-containing substituent include the alkyl groups given as examples of the alkyl group within the aforementioned alkoxy group in which at least one hydrogen atom has been substituted with a hydroxy group. The number of hydroxy groups within the hydroxyalkyl group is preferably 1 to 3, and most preferably 1.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group. As the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 47]

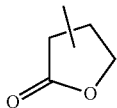
(L1)

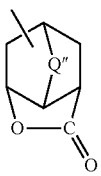
(L2)

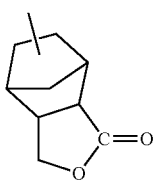
(L3)

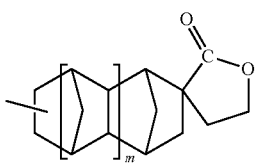
(L4)

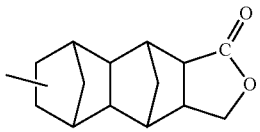
(L5)

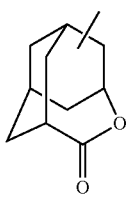
(L6)

(S1)

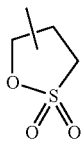
(S2)

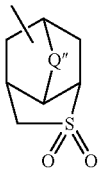
(S3)

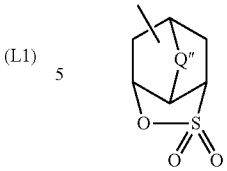
(S4)

In the formulas, Q" represents an oxygen atom, a sulfur atom or an alkylene group which may contain an oxygen atom or a sulfur atom; and m represents 0 or 1.

In the formulas, the alkylene group for Q" is preferably linear or branched, and preferably has 1 to 5 carbon atoms. Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—]. Among these, a methylene group or an alkylmethylene group is preferable, and a methylene group, —CH($CH_3$)— or —C($CH_3$)$_2$— is particularly desirable.

The alkylene group may contain an oxygen atom (—O—) or a sulfur atom (—S—). As an example of such a group, the aforementioned alkylene group having —O— or —S— on the terminal or interposed between the carbon atoms can be mentioned. Specific examples thereof include —O—$R^{94}$—, —S—$R^{95}$—, —$R^{96}$—O—$R^{97}$— and —$R^{98}$—S—$R^{99}$—. Herein, each of $R^{94}$ to $R^{99}$ independently represents an alkylene group. Examples of the alkylene group include the same alkylene groups as those described above for Q". Among these, —O—$CH_2$—, —$CH_2$—O—$CH_2$—, —S—$CH_2$— and —$CH_2$—S—$CH_2$— are preferable.

These aliphatic cyclic groups may have part or all of the hydrogen atoms substituted with a substituent. Examples of the substituent include an alkyl group, a halogen atom, an alkoxy group, a hydroxy group, —C(=O)—$R^{80}$ [$R^{80}$ represents an alkyl group], —COO$R^{81}$ [$R^{81}$ represents a hydrogen atom or an alkyl group], a halogenated alkyl group, a halogenated alkoxy group, an amino group, an amido group, a nitro group, an oxygen atom (=O), a sulfur atom and a sulfonyl group ($SO_2$).

Examples of the alkyl group for the substituent include the same alkyl groups as those described above for the alkyl group within the alkoxy group for the aforementioned hetero atom-containing substituent.

As the alkyl group, an alkyl group of 1 to 6 carbon atoms is particularly desirable. The alkyl group is preferably linear or branched, and specific examples thereof include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the halogen atom, the alkoxy group, the —C(=O)—$R^{80}$ group, the —COO$R^{81}$ group, the halogenated alkyl group and the halogenated alkoxy group for the substituent, the same groups as those described above as examples of the hetero atom-containing substituent for substituting part or all of the hydrogen atoms constituting the aforementioned aliphatic hydrocarbon group can be mentioned.

Among these examples, as the substituent for substituting the hydrogen atom of the aforementioned aliphatic cyclic group, an alkyl group, an oxygen atom (=O) or a hydroxy group is preferable.

The aliphatic cyclic group may have 1 substituent, or 2 or more substituents. When the aliphatic cyclic group has a plurality of substituents, the substituents may be the same or different from each other.

As X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

When the $R^{4'''}$ group has $X-Q^1-$ as a substituent, $R^{4'''}$ is preferably a group represented by the formula $X-Q^1-Y^1-$ (in the formula, $Q^1$ and $X$ are the same as defined above, and $Y^1$ represents an alkylene group of 1 to 4 carbon atoms which may have a substituent or a fluorinated alkylene group of 1 to 4 carbon atoms which may have s substituent.

In the group represented by the formula $X-Q^1-Y^1-$, as the alkylene group for $Y^1$, the same alkylene group as those described above for $Q^1$ in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2F_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_3)$—, —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5'''}$ and $R^{6'''}$ each independently represent an aryl group or alkyl group. At least one of $R^{5'''}$ and $R^{6'''}$ represents an aryl group. It is preferable that both of $R^{5'''}$ and $R^{6'''}$ represent an aryl group.

As the aryl group for $R^{5'''}$ and $R^{6'''}$, the same aryl groups as those described above for $R^{1'''}$ to $R^{3'''}$ can be used.

As the alkyl group for $R^{5'''}$ and $R^{6'''}$, the same alkyl groups as those described above for $R^{1'''}$ to $R^{3'''}$ can be used.

It is particularly desirable that both of $R^{5'''}$ and $R^{6'''}$ represents a phenyl group.

As $R^{4'''}$ in formula (b-2), the same groups as those mentioned above for $R^{4'''}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate such as methanesulfonate, n-propanesulfonate, n-butanesulfonate, n-octanesulfonate, 1-adamantanesulfonate, or 2-norbornanesulfonate, d-camphor-10-sulfonate, benzenesulfonate, perfluorobenzenesulfonate, or p-toluenesulfonate.

Furthermore, onium salts in which the anion moiety of these onium salts are replaced by an anion moiety represented by any one of formulas (b1) to (b8) shown below can be used.

[Chemical Formula 48]

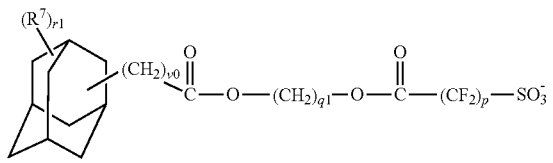
(b1)

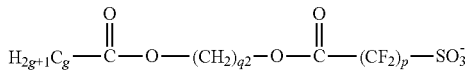
(b2)

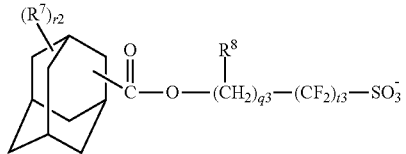
(b3)

In the formulas, p represents an integer of 1 to 3; v0 represents an integer of 0 to 3; each of q1 and q2 independently represents an integer of 1 to 5; q3 represents an integer of 1 to 12; each of r1 and r2 independently represents an integer of 0 to 3; g represents an integer of 1 to 20; t3 represents an integer of 1 to 3; $R^7$ represents a substituent; and $R^8$ represents a hydrogen atom, an alkyl group of 1 to 5 carbon atoms or a halogenated alkyl group of 1 to 5 carbon atoms.

[Chemical Formula 49]

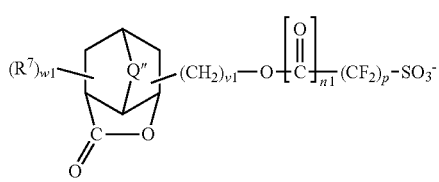
(b4)

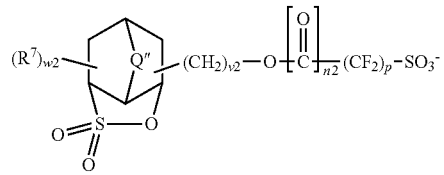
(b5)

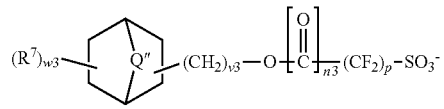
(b6)

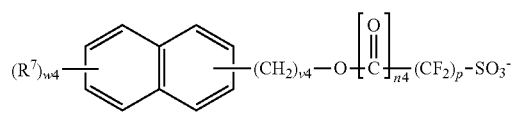
(b7)

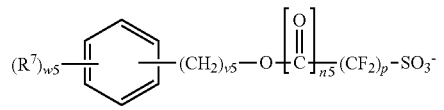
(b8)

In the formulas, p, $R^7$ and Q" are the same as defined above; each of n1 to n5 independently represents 0 or 1; each of v1 to v5 independently represents an integer of 0 to 3; and each of w1 to w5 independently represents an integer of 0 to 3.

Examples of the substituent represented by $R^7$ include an alkyl group and a hetero atom-containing substituent. Examples of the alkyl group include the same alkyl groups as those described above as the substituent for the aromatic hydrocarbon group in the explanation of X. Examples of the hetero atom-containing substituent include the same hetero atom-containing substituents as those described above for substituting part or all of the hydrogen atoms constituting the aforementioned aliphatic hydrocarbon group.

If there are two or more of the $R^7$ group, as indicated by the values r1, r2, and w1 to w5, then the two or more of the $R^7$ groups may be the same or different from each other.

The alkyl group and the halogenated alkyl group for Rare respectively the same as defined for the alkyl group and the halogenated alkyl group for R.

Each of r1, r2, and w1 to w5 is preferably an integer of 0 to 2, and more preferably 0 or 1.

v0 to v5 is preferably 0 to 2, and most preferably 0 or 1.

t3 is preferably 1 or 2, and most preferably 1.

q3 is preferably 1 to 5, more preferably 1 to 3, and most preferably 1.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 50]

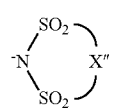
(b-3)

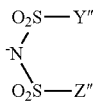

(b-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acidity increases and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Further, it is possible to use an onium salt-based acid generator represented by general formula (b-1) or (b2) in which the anion moiety ($R^{41}SO_3{-}$) has been replaced by $R^{7"}—COO^-$ (in the formula, $R^{7"}$ represents an alkyl group or a fluorinated alkyl group) (the cation moiety is the same as (b-1) or (b-2)).

As $R^{7"}$, the same groups as those described above for $R^{4"}$ can be used.

Specific examples of the group represented by the formula "$R^{7"}—COO$" include a trifluoroacetate ion, an acetate ion, $CF_3CF_2CF_2COO—$ and 1-adamantanecarboxylic acid ion.

In the present description, an oximesulfonate-based acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 51]

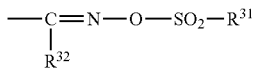

(B-1)

In formula (B-1), each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 52]

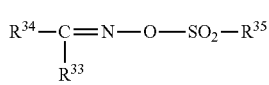

(B-2)

In the formula (B-2), $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 53]

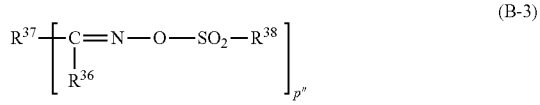

(B-3)

In the formula (B-3), $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be used.

[Chemical Formula 54]

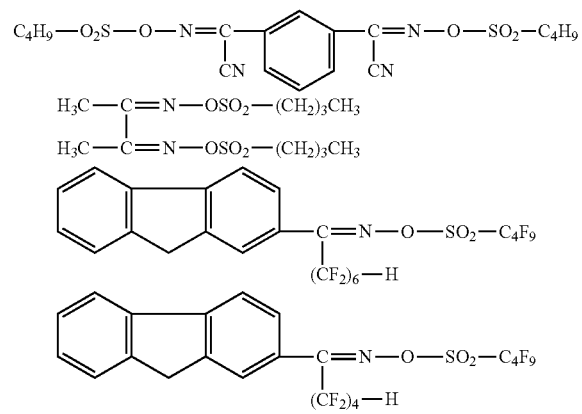

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of acid generator may be used, or two or more types of acid generators may be used in combination.

In the resist composition, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

[Component (S)]

The chemically amplified positive resist composition can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and ethyl lactate (EL) and γ-butyrolactone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

Furthermore, as the component (S), a mixed solvent containing the aforementioned PGMEA/PGME mixed solvent and γ-butyrolactone is also preferable. In this case, the mixing ratio (former:latter) of such a mixed solvent is preferably from 99.9:0.1 to 80:20, more preferably 99.9:0.1 to 90:10, and most preferably 99:9:0.1 to 95:5.

By ensuring the above-mentioned range, the rectangularity of the resist pattern is improved.

The amount of the component (S) is not particularly limited, and is appropriately adjusted to a concentration which enables coating of a coating solution to a substrate, depending on the thickness of the coating film. In general, the organic solvent is used in an amount such that the solid content of the resist composition becomes within the range from 2 to 20% by weight, and preferably from 5 to 15% by weight.

<Optional Components>

[Component (D)]

In order to improve factors such as the resist pattern shape and the post exposure stability of the latent image formed by the pattern-wise exposure of the resist layer, it is preferable that the chemically amplified positive resist composition further include a nitrogen-containing organic compound (D) (hereafter referred to as "component (D)") as an optional component.

A multitude of these components (D) have already been proposed, and any of these known compounds may be used, although a cyclic amine, an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (namely, alkylamines or alkyl alcohol amines). Specific examples include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Among these, alkyl alcohol amines and trialkylamines are preferable.

Of these alkyl alcohol amines, triethanolamine and triisopropanolamine are particularly desirable. Among these trialkylamines, tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

The component (D) is typically used in an amount within a range from 0.01 to 5.0 parts by weight, relative to 100 parts by weight of the component (A).

[Component (E)]

Furthermore, in the chemically amplified positive resist composition, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

(5) Novolak Resist Composition

Next, the novolak resist composition will be described. The novolak resist composition contains a novolak resin and a photosensitizer, and exhibits increased solubility in an aqueous alkali solution (developing solution) by the irradiation of an active energy ray such as ultraviolet ray. In the present invention, as described with respect to the non-photosensitive, non-heat polymerizable resin composition, the novolak resist composition preferably contains a resin component obtainable by an aromatic ring-containing monomer and an aromatic ring non-containing monomer.

Preferable examples of the aromatic ring-containing monomer include an aromatic compound of 6 to 18 carbon atoms having a vinyl group, an aromatic compound of 6 to 18 carbon atoms having a (meth)acryloyl group, and phenols which become the constitutional components of a novolak resin. Further, as the aromatic ring non-containing monomer having a substituent with high polarity, a vinyl group or a (meth)acrylic compound containing at least 1 atom selected from the group consisting of N, O, Si, P and S is preferable.

The novolak resin is alkali-soluble. The alkali-soluble novolak resin is not particularly limited, and a conventional alkali-soluble novolak resin used in a positive photoresist composition, e.g., a novolak resin obtainable by condensing an aromatic hydroxy compound such as phenol, cresol, xylenol and the like with an aldehyde such as formaldehyde in the presence of an acidic catalyst.

As the photosensitizer, a quinonediazide group-containing compound is usable. Examples of the quinonediazide group-containing compound include complete or partial ester of a polyhydroxybenzophenone (such as 2,3,4-trihydroxybenzophenone or 2,3,4,4'-tetrahydroxybenzophenone), a tris(hydroxyphenyl)methane or a methane substituted compound thereof (such as 1-[1-(4-hydroxyphenyl)isopropyl]-4-[1,1-bis(4-hydroxyphenyl)ethyl]benzene, 1,4-bis(4-hydroxyphenylisopropylidenyl)benzene, tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane or bis(4-hydroxy-2,5-dimethylphenyl)-2-hydroxyphenylmethane) described in Japanese Unexamined Patent Application Publication No. Hei 4-29242 and naphthoquinone-1,2-diazide-5-sulfonic acid or naphthoquinone-1,2-diazide-4-sulfonic acid. In particular, a complete or partial ester of 1-[1-(4-hydroxyphenyl)isopropyl]-4-[1,1-bis(4-hydroxyphenyl)ethyl]benzene, 1,4-bis(4-hydroxyphenylisopropylidenyl)benzene, the above tris(hydroxyphenyl)methane or a methane substituted compound thereof and naphthoquinone-1,2-diazide-5-sulfonic acid or naphthoquinone-1,2-diazide-4-sulfonic acid can be preferably used as a photosensitizer for excimer laser or deep ultraviolet ray. Further, other quinonediazide group-containing copounds, such as a reaction product of orthobenzoquinonediazide, orthonaphthoquinonediazide, orthoanthraquinonediazide, an orthonaphthoquinonediazide sulfonate or a nucleus-substituted derivative, or orthoquinonediazidesulfonyl chloride with a compound having a hydroxy group or an amino group such as phenol, p-methoxyphenol, dimethylphenol, hydroquinone, bisphenol A, naphthol, pyrocatechol, pyrogallol, pyrogallolmonomethylether, pyrogallol-1,3-dimethylether, gallic acid, esterified or etherified gallic acid which part of the hydroxy groups remaining, aniline or p-aminodiphenylamine can also be used as a photosensitizer. These photosensitizers can be used individually, or in a combination of two or more.

The amount of the novolak resin relative to 10 parts by weight of the photosensitizer is preferably 5 to 200 parts by weight, and more preferably 10 to 60 parts by weight. When the amount of the novolak resin used is within the above-mentioned range, the reproducibility of the novolak resist composition becomes excellent.

Depending on the desired properties, the novolak resist composition may have a plasticizer, a solvent or the like added. As the plasticizer, a conventional plasticizer may be used without particular limitation. Examples of the plasticizer include polymethyl vinyl ether. As the solvent, the same solvents as those described above for the aforementioned negative photosensitive resist composition and the aforementioned chemically amplified positive resist composition can be used.

By virtue of using a compound having 2 or more naphthoquinonediazide groups in 1 molecule as the photosensitizer, by conducting an after-cure of irradiating ultraviolet ray to the formed resin pattern, the hydroxy groups contained in the novolak resin are cross-linked with the naphthoquinonediazide groups contained in the photosensitizer, thereby improving the solvent resistance of the resin pattern.

<Formation of Guide Pattern 1 (Graphoepitaxy)>

Figure 2:
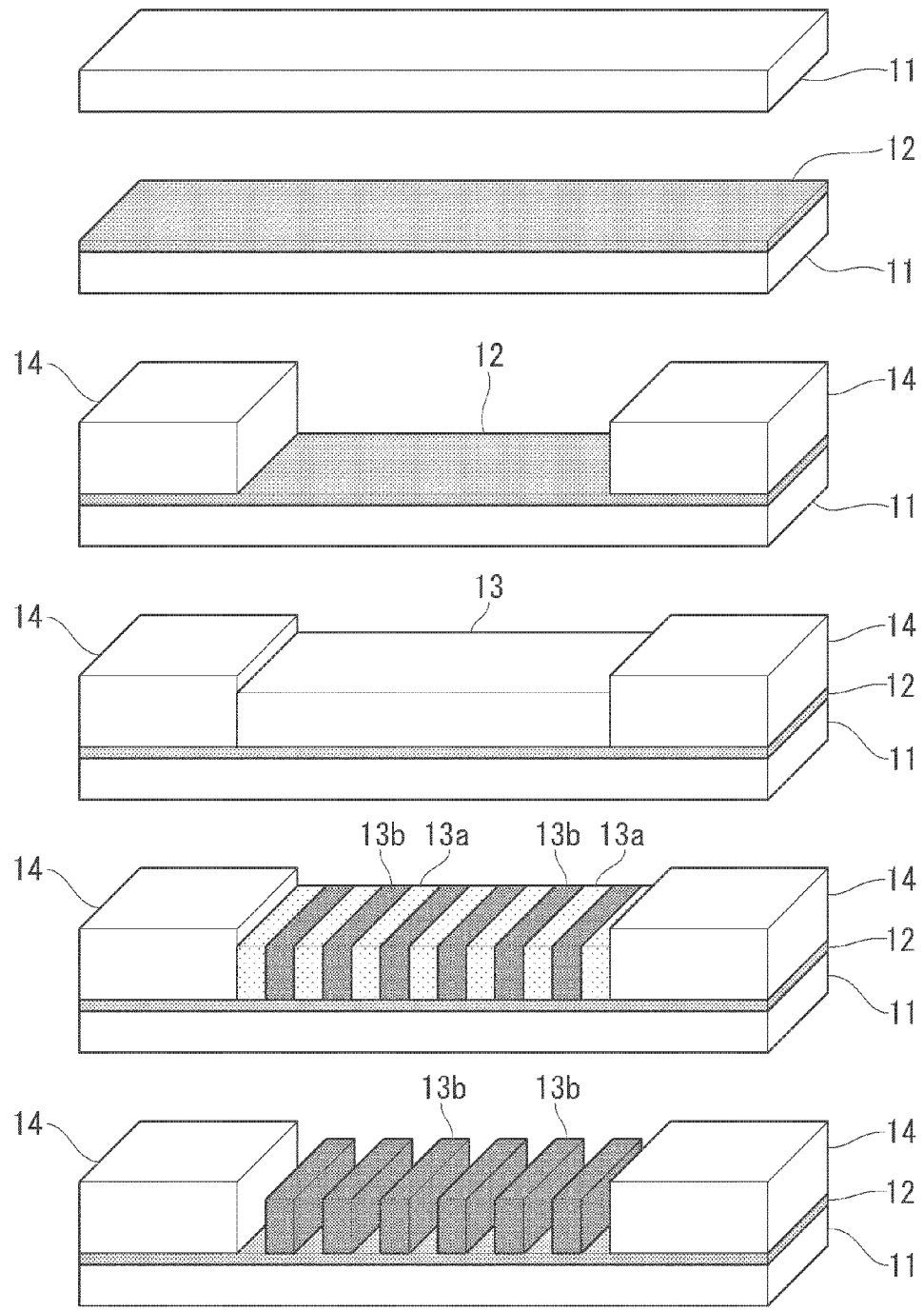
FIG. 2 is a diagram showing each step of the method of forming a pattern of a layer containing a block copolymer using an undercoat agent according to the present embodiment.

In the present invention, as shown in FIG. 2, after applying an undercoat agent having a structural unit derived from an aromatic ring-containing monomer to a substrate 11, and performing a step (1) of forming a layer of the undercoat agent (neutralization treatment), it is preferable to form a guide pattern 14 on the surface of the layer 12 of the undercoat agent (neutralization film). On the surface of the layer of the undercoat agent (neutralization film), before forming a layer 13 containing the block copolymer, a guide pattern 14 having a predetermined pattern may be formed in advance. As a result, it becomes possible to control the arrangement of the phase separation structure, depending on the shape and surface properties of the guide pattern 14. For example, in the case of a block copolymer where a random fingerprint-patterned phase separation structure is formed without using a guide pattern 14, by introducing a trench pattern of a resist film on the surface of the layer 12 of the undercoat agent (neutralization film), a phase separation structure arranged along the trench can be obtained. The guide pattern 14 can be introduced in accordance with the above-described principle. Further, when the surface of the guide pattern 14 has affinity for any of the polymers (13a) constituting the block copolymer, a phase separation structure having a lamellar structure arranged in the perpendicular direction of the surface of the substrate 11 can be more reliably formed.

As a substrate provided with a guide pattern 14 on the surface of the layer 12 (neutralization film) of an undercoat agent, a substrate in which a pattern is formed on the surface of the layer 12 (neutralization film) of an undercoat agent by a lithography method or an imprint method may be used. Among these, a substrate using the lithography method is preferable. For example, a film composed of a resist composition which has affinity for any of the polymers constituting the block copolymer is formed on the surface of the layer 12 (neutralization film) of an undercoat agent. Then, a selective exposure is conducted using a radial ray such as light or electron beam through a mask pattern having a predetermined pattern, followed by a development treatment, thereby forming a guide pattern 14.

More specifically, for example, a resist composition is applied to the surface of the substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser through a desired mask pattern, followed by post exposure bake (PEB) under temperature conditions of 80 to 150° C. for 40 to 120 seconds, preferably 60 to 90 seconds. Subsequently, the resist film is subjected to a developing treatment. As the developing method, an organic solvent such as butyl acetate or propylene glycol monomethylether acetate may be used for the developing treatment. Alternatively, an alkali developing solution such as a 0.1 to 10 wt % aqueous tetramethylammonium hydroxide solution (TMAH) may be used. After the development treatment, a water rinse is preferably conducted with pure water. If desired, bake treatment (post bake) can be conducted following the developing. In this manner, a guide pattern 14 that is faithful to the mask pattern can be formed.

The height of the guide pattern 14 from the surface of the layer 12 (the neutralization film) of the undercoat agent is preferably at least as large as the thickness of the layer containing the block copolymer which is formed on the surface of the substrate 11. The height of the guide pattern 14 from the surface of the layer 12 (the neutralization film) of the undercoat agent can be appropriately adjusted by the film thickness of the resist film formed by applying the resist composition for forming a guide pattern 14.

The resist composition for forming the guide pattern 14 can be appropriately selected from resist compositions or a modified product thereof typically used for forming a resist pattern which have affinity for any of the polymers constituting the block copolymer. As the resist composition, a positive resist composition or a negative resist composition may be used, but a negative resist composition is preferable.

When an organic solvent solution of the block copolymer is cast onto the surface of the layer 12 of the undercoat agent having a guide pattern 14 formed, and a heat treatment is conducted to cause a phase separation. Therefore, the resist pattern for forming a guide pattern 14 is preferably capable of forming a resist film which exhibits solvent resistance and heat resistance.

As the undercoat agent for graphoepitaxy, among the above examples, a non-photosensitive, non-heat polymerizable resin composition can be preferably used.

Further, as the resin component, a resin component having a group capable of being graft polymerized to the substrate 11 is preferable, and more preferably a resin component having a functional group selected from the group consisting of a phenolic hydroxyl group, a carboxyl group, a thiol group, an amino group, an amide group, an isocyanate group, a nitro group, an epoxy group, an oxetanyl group, a (meth)acryloyl group and an alkoxysilane group. The resin component can be appropriately selected from the above examples.

<Formation of Guide Pattern 2 (Chemical Epitaxy)>

Figure 3:
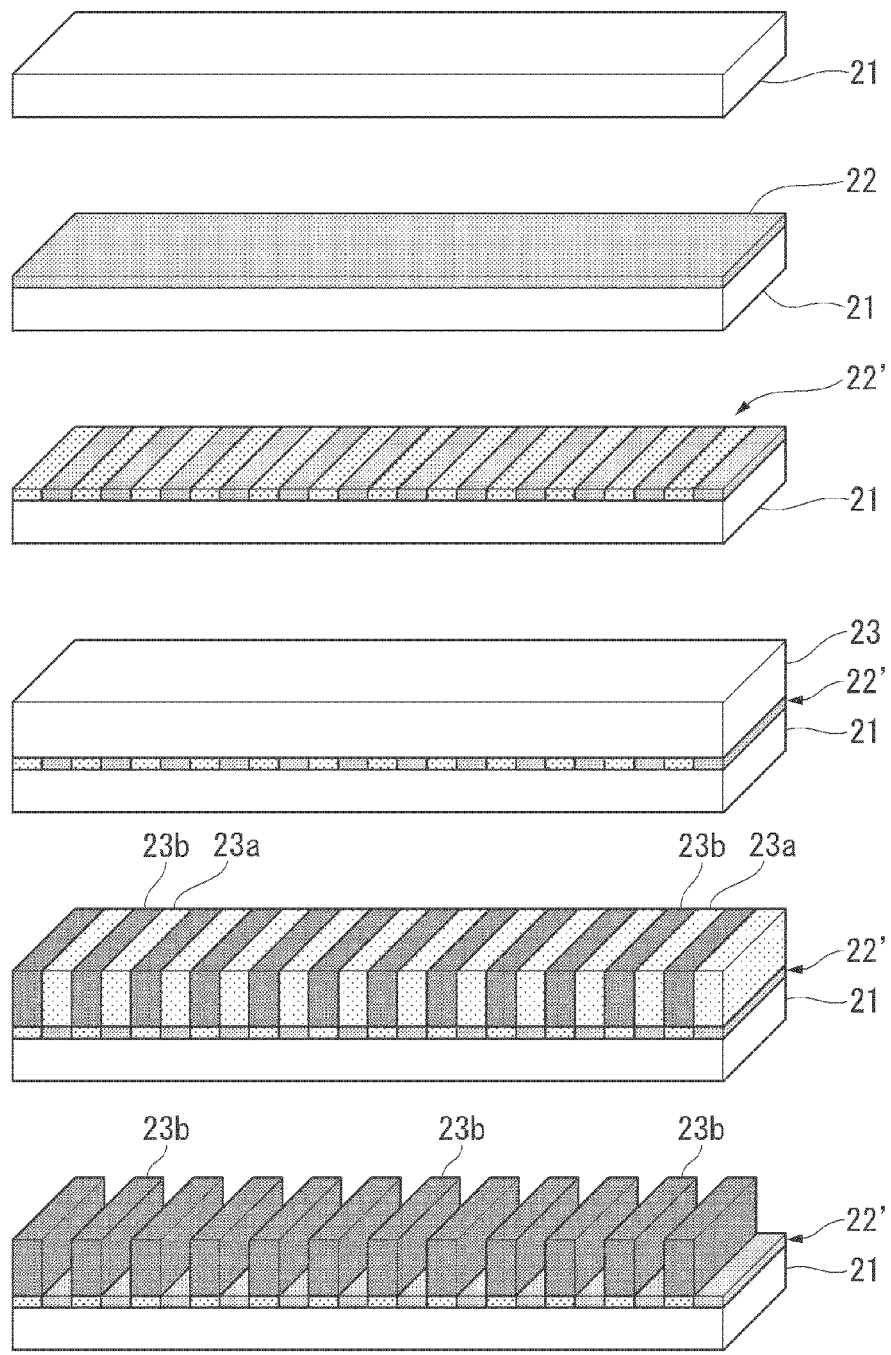
FIG. 3 is a diagram showing each step of the method of forming a pattern of a layer containing a block copolymer using an undercoat agent according to the present embodiment.

In the present invention, as shown in FIG. 3, instead of the aforementioned guide pattern having a structure with physical unevenness, a planar guide pattern may be formed on the surface of the substrate 21. Specifically, a guide pattern 22' which has regions having affinity for any of the polymers constituting the block copolymer and other regions can be used.

A planar guide pattern 22' can be formed, for example, as follows.

Firstly, the undercoat agent preferably contains a photosensitive polymerization initiator, and using the aforementioned negative photosensitive resist composition or the like, the undercoat agent is applied to the surface of the substrate 21 to form a resist film (a layer 22 of the undercoat agent) (step (1)). Then, a step (2') is performed in which selective exposure is conducted using a radial ray such as light or electron beam through a mask having a predetermined pattern, followed by a development treatment, thereby forming a predetermined pattern of a thin film which has affinity for any of the polymers constituting the block copolymer on the surface of the substrate 21. In this manner, a planar guide pattern 22' in which regions composed of the undercoat agent and regions having the undercoat agent removed are arranged with a predetermined pattern can be formed.

As the undercoat agent for the chemical epitaxy, the aforementioned negative photosensitive resin composition, heat polymerizable resin composition, chemically amplified resist composition, and novolak resist composition can be preferably used.

Further, as the resin component, a resin component having a group capable of being graft polymerized to the substrate 21 is preferable, and more preferably a resin component having a functional group selected from the group consisting of a phenolic hydroxyl group, a carboxyl group, a thiol group, an amino group, an amide group, an isocyanate group, a nitro group, an epoxy group, an oxetanyl group, a (meth)acryloyl group and an alkoxysilane group. The resin component can be appropriately selected from the above examples.

Furthermore, in the case where the resin component has a group capable of being graft polymerized to the substrate 21, it is preferable not to conduct a bake treatment (prebake and post exposure bake) in step (2'). Bu such steps, the at line/space portions of the guide pattern 22', the phase-separation formability can be separated.

<Formation of Phase Separation Structure of the Layer Containing the Block Copolymer>

Firstly, a layer containing the block copolymer is formed on the surface of the substrate. More specifically, the block copolymer dissolved in a suitable organic solvent is applied to the surface of the substrate using a spinner or the like.

As the organic solvent for dissolving the block copolymer, any organic solvent which is capable of dissolving the block copolymer to be used and forming a uniform solution can be used, and an organic solvent having high compatibility with all of the polymers constituting the block copolymer can be used. As the organic solvent, one type of solvent can be used, or two or more types may be used in combination.

Examples of the organic solvent for dissolving the block copolymer include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

For example, when a PS-PMMA block copolymer is used as the block copolymer, it is preferable to dissolve the block copolymer in an aromatic organic solvent such as toluene.

The thickness of the layer containing the block copolymer which is formed on the surface of the substrate depends on the molecular weight of the block copolymer (polymer period). In general, application is conducted within the range of 0.5 to 4.0 times the polymer period.

In the present invention, the lower limit of the thickness of the layer containing the block copolymer is not particularly limited, as long as it is sufficient for causing phase separation. In consideration to the strength of the nanostructure and the uniformity of the substrate having the nanostructure formed, the thickness of the layer is preferably 3 nm or more, and more preferably 5 nm or more.

The substrate having the layer containing the block copolymer formed is subjected to a heat treatment, and a phase separation structure in which at least a part of the surface of the substrate is exposed is formed by a selective removal of the block copolymer in a later step. The heat treatment is preferably conducted at a temperature at least as high as the glass transition temperature of the block copolymer used and lower than the heat decomposition temperature. Further, the heat treatment is preferably conducted in a low reactive gas such as nitrogen.

<Selective Removal of Phase of Polymer $P_B$ in Phase Separation Structure>

Subsequently, after the formation of the phase separation structure, the phase of polymer $P_B$ exposed (3a in FIG. 1, 13a in FIG. 2 and 23a in FIG. 3) is selectively removed from the layer containing the block copolymer formed on the substrate (step (3)). As a result, only the phase of the polymer $P_A$ (3b in FIG. 1, 13b inn FIG. 2 and 23b in FIG. 3) remains on the exposed surface of the substrate. Further, the phase of the polymer $P_B$ which was continuously formed from the surface of the substrate to the surface of the layer containing the block copolymer is removed, so that the surface of the substrate is exposed.

The selective removal treatment is not particularly limited, as long as it is a treatment capable of decomposing and removing the polymer $P_B$ without affecting the polymer $P_A$. The selective removal treatment can be appropriately selected from any methods for removing a resin film, depending on the types of the polymer $P_A$ and the polymer $P_B$. Further, when a neutralization film is formed on the surface of the substrate in advance, the neutralization film is removed together with the phase of the polymer $P_B$. Furthermore, when a guide pattern is formed on the surface of the substrate in advance, like the polymer $P_A$, the guide pattern is not removed. Examples of the removal treatment include an oxygen plasma treatment, an ozone treatment, a UV irradiation treatment, a heat decomposition treatment and a chemical decomposition treatment.

According to the undercoat agent of the present invention and the method of forming a pattern of a layer containing a block copolymer of the present invention using the undercoat agent, there can be produced a substrate provided with a nano structure on the substrate surface by using phase separation of a block copolymer, wherein the nanostructure is designed more freely with respect to the position and the orientation.

EXAMPLES

As follows is a description of examples of the present invention, although the scope of the present invention is in no way limited by these examples.

[Non-Photosensitive, Non-Heat Polymerizable Resin Composition]

In Tables 1 and 2, the monomers used in the synthesis of polymers 1 to 19, the compositional ratio (unit:mol %) of the monomers and the molecular weight of the synthesized monomers are indicated. Resin compositions of Examples 1 to 19 and Comparative Examples 1 to 5 were prepared in accordance with the formulations shown in Tables 3 to 5 (unit: parts by weight). With respect to the compositions indicated in Tables 3 to 5, the details are shown in Tables 28 to 30.

TABLE 1

| | | Polymer 1 | Polymer 2 | Polymer 3 | Polymer 4 | Polymer 5 | Polymer 6 | Polymer 7 | Polymer 8 | Polymer 9 | Polymer 10 |
|---|---|---|---|---|---|---|---|---|---|---|---|
| Synthesized polymer | Styrene | 50 | 80 | 20 | 50 | 80 | 30 | 25 | 25 | 25 | |
| | 1-Vinylnaphthalene | | | | | | | 25 | | | 50 |
| | 4-Vinylbiphenyl | | | | | | | | 25 | | |
| | 9-Vinylanthracene | | | | | | | | | 25 | |
| | 4-Hydroxystyrene | | | | | | | | | | |
| | Benzyl methacrylate | | | | | | 20 | | | | |
| | Methyl methacrylate | 50 | 20 | 80 | 30 | | 50 | 50 | 50 | 50 | 50 |
| | Methacrylic acid | | | | 20 | 20 | | | | | |
| | Vinylcyclohexane | | | | | | | | | | |
| | Mw | 40000 | 40000 | 40000 | 40000 | 40000 | 40000 | 40000 | 40000 | 40000 | 40000 |

TABLE 2

| | | Polymer 11 | Polymer 13 | Polymer 14 | Polymer 15 | Polymer 16 | Polymer 17 | Polymer 18 | Polymer 19 |
|---|---|---|---|---|---|---|---|---|---|
| Synthesized polymer | Styrene | | | 50 | 20 | 100 | | | 10 |
| | 1-Vinylnaphthalene | | | | | | | | |
| | 4-Vinylbiphenyl | 50 | | | | | | | |
| | 9-Vinylanthracene | | | | | | | | |
| | 4-Hydroxystyrene | | | | 20 | | | | |
| | Benzyl methacrylate | | | | | | | | |
| | Methyl methacrylate | 50 | 30 | 70 | | 100 | 50 | | 90 |
| | Methacrylic acid | | | | | | | | |
| | Vinylcyclohexane | | | 10 | | | 50 | 100 | |
| | Mw | 40000 | 40000 | 40000 | 40000 | 40000 | 40000 | 40000 | 40000 |

TABLE 3

| | | Example 1 | Example 2 | Example 3 | Example 4 | Example 5 | Example 6 | Example 7 | Example 8 |
|---|---|---|---|---|---|---|---|---|---|
| Synthesized polymer | Polymer 1 | 100 | | | | | | | |
| | Polymer 2 | | 100 | | | | | | |
| | Polymer 3 | | | 100 | | | | | |
| | Polymer 4 | | | | 100 | | | | |
| | Polymer 5 | | | | | 100 | | | |
| | Polymer 6 | | | | | | 100 | | |
| | Polymer 7 | | | | | | | 100 | |
| | Polymer 8 | | | | | | | | 100 |
| | Polymer 9 | | | | | | | | |
| | Polymer 10 | | | | | | | | |
| | Polymer 11 | | | | | | | | |
| | Polymer 12 | | | | | | | | |
| | Polymer 13 | | | | | | | | |
| | Polymer 14 | | | | | | | | |
| | Polymer 15 | | | | | | | | |
| | Polymer 16 | | | | | | | | |
| | Polymer 17 | | | | | | | | |
| | Polymer 18 | | | | | | | | |
| | Polymer 19 | | | | | | | | |
| Evaluation Results | Observation of perpendicular lamellar | A | A | A | A | A | A | A | A |

TABLE 4

| | | Example 9 | Example 10 | Example 11 | Example 12 | Example 13 | Example 14 | Example 15 | Example 16 |
|---|---|---|---|---|---|---|---|---|---|
| Synthesized polymer | Polymer 1 | | | | | | | 90 | 90 |
| | Polymer 2 | | | | | | | | |
| | Polymer 3 | | | | | | | | |
| | Polymer 4 | | | | | | | | |
| | Polymer 5 | | | | | | | | |
| | Polymer 6 | | | | | | | | |
| | Polymer 7 | | | | | | | | |
| | Polymer 8 | | | | | | | | |
| | Polymer 9 | 100 | | | | | | | |
| | Polymer 10 | | 100 | | | | | | |

TABLE 4-continued

|  |  | Example 9 | Example 10 | Example 11 | Example 12 | Example 13 | Example 14 | Example 15 | Example 16 |
|---|---|---|---|---|---|---|---|---|---|
|  | Polymer 11 |  |  | 100 |  |  |  |  |  |
|  | Polymer 12 |  |  |  | 100 |  |  |  |  |
|  | Polymer 13 |  |  |  |  | 100 |  |  |  |
|  | Polymer 14 |  |  |  |  |  | 100 |  |  |
|  | Polymer 15 |  |  |  |  |  |  | 10 |  |
|  | Polymer 16 |  |  |  |  |  |  |  | 10 |
|  | Polymer 17 |  |  |  |  |  |  |  |  |
|  | Polymer 18 |  |  |  |  |  |  |  |  |
|  | Polymer 19 |  |  |  |  |  |  |  |  |
| Evaluation Results | Observation of perpendicular lamellar | A | A | A | A | A | A | A | A |

TABLE 5

|  |  | Example 17 | Example 18 | Example 19 | Comparative Example 1 | Comparative Example 2 | Comparative Example 3 | Comparative Example 4 | Comparative Example 5 |
|---|---|---|---|---|---|---|---|---|---|
| Synthesized polymer | Polymer 1 | 90 | 90 | 90 |  |  |  |  |  |
|  | Polymer 2 |  |  |  |  |  |  |  |  |
|  | Polymer 3 |  |  |  |  |  |  |  |  |
|  | Polymer 4 |  |  |  |  |  |  |  |  |
|  | Polymer 5 |  |  |  |  |  |  |  |  |
|  | Polymer 6 |  |  |  |  |  |  |  |  |
|  | Polymer 7 |  |  |  |  |  |  |  |  |
|  | Polymer 8 |  |  |  |  |  |  |  |  |
|  | Polymer 9 |  |  |  |  |  |  |  |  |
|  | Polymer 10 |  |  |  |  |  |  |  |  |
|  | Polymer 11 |  |  | 10 |  |  |  |  |  |
|  | Polymer 12 |  |  |  |  |  |  |  |  |
|  | Polymer 13 |  |  |  |  |  |  |  |  |
|  | Polymer 14 |  |  |  |  |  |  |  |  |
|  | Polymer 15 |  |  |  | 100 |  |  |  |  |
|  | Polymer 16 |  |  |  |  | 100 |  |  |  |
|  | Polymer 17 | 10 |  |  |  |  | 100 |  |  |
|  | Polymer 18 |  | 10 |  |  |  |  | 100 |  |
|  | Polymer 19 |  |  |  |  |  |  |  | 100 |
| Evaluation Results | Observation of perpendicular lamellar | A | A | A | B | B | B | B | B |

[Evaluation of Perpendicular Lamellar Formability]

Each of the resin compositions of Examples 1 to 19 and Comparative Examples 1 to 5 was adjusted to a concentration of 0.5 to 2%, and was spin-coated on an 8-inch silicon substrate by adjusting the number of rotation to obtain a film thickness of 70 nm, followed by a bake treatment at 90° C. for 60 seconds.

To the substrate, a toluene solution of a PS-PMMA block copolymer 1 (17.5 mg/ml) (manufactured by Polymer Source, Inc.; molecular weight of PS: 53,000, molecular weight of PMMA: 54,000, polydispersity index (PDI): 1.16) was spin-coated (number of revolution: 1,000 rpm, 60 seconds), followed by drying by heating at 110° C. for 60 seconds.

Subsequently, the substrate was heated at 200° C. for 6 hours while flowing nitrogen, thereby forming a phase-separated structure. Thereafter, using TCA-3822 (manufactured by Tokyo Ohka Kogyo Co., Ltd.), the substrate was subjected to an oxygen plasma treatment (200 sccm, 40 Pa, 200 W, 30 seconds), thereby selectively removing the phase constituted of PMMA. The surface of the obtained substrate was observed using a scanning electron microscope SEMS4700 (manufactured by Hitachi, Ltd.). A resin composition in which a perpendicular lamellar was observed was evaluated "A", and a resin composition in which a perpendicular lamellar was not observed was evaluated "B". The results are shown in Tables 3 to 5.

From the results, it is apparent that, by using a non-photosensitive, non-heat polymerizable resin composition containing a resin component in which 20 mol % to 80 mol % of all the structural units of the resin component is a structural unit derived from an aromatic ring-containing monomer as the undercoat agent, a perpendicular lamellar can be formed on the substrate.

[Negative Photosensitive Resin Composition—No. 1]

In Tables 6 and 7, the monomers used in the synthesis of polymers 20 to 38, the compositional ratio (unit:mol %) of the monomers and the molecular weight of the synthesized monomers are indicated. Resin compositions of Examples 20 to 45 and Comparative Examples 6 to 10 were prepared in accordance with the formulations shown in Tables 8 to 12 (unit: parts by weight). With respect to the compositions indicated in Tables 8 to 12, the details are shown in Tables 28 to 30.

TABLE 6

| | | Polymer 20 | Polymer 21 | Polymer 22 | Polymer 23 | Polymer 24 | Polymer 25 | Polymer 26 | Polymer 27 | Polymer 28 |
|---|---|---|---|---|---|---|---|---|---|---|
| Synthesized polymer | Styrene | 20 | 80 | 35 | 20 | 80 | 35 | | | 30 |
| | 1-Vinylnaphthalene | | | | | | | 50 | | |
| | 4-Vinylbiphenyl | | | | | | | | 50 | |
| | 9-Vinylanthracene | | | | | | | | | 20 |
| | 4-Hydroxystyrene | | | | | | | | | |
| | Benzyl methacrylate | | | | | | | | | |
| | Methyl methacrylate | | | | | | | | | |
| | Glycidyl methacrylate | 80 | 20 | 60 | | | | 50 | 50 | |
| | 3,4-epoxycyclohexylmethane methacrylate | | | | 80 | 20 | 60 | | | 50 |
| | Glycidyl methacrylate-modified methacrylic acid | | | | | | | | | |
| | Propyltrimethoxysilane methacrylate | | | 5 | | | 5 | | | |
| | Mw | 40000 | 40000 | 40000 | 40000 | 40000 | 40000 | 40000 | 40000 | 40000 |

TABLE 7

| | | Polymer 29 | Polymer 30 | Polymer 31 | Polymer 32 | Polymer 33 | Polymer 34 | Polymer 35 | Polymer 36 | Polymer 37 | Polymer 38 |
|---|---|---|---|---|---|---|---|---|---|---|---|
| Synthesized polymer | Styrene | 40 | | | 30 | 60 | | | 100 | 90 | 10 |
| | 1-Vinylnaphthalene | | | | | | | | | | |
| | 4-Vinylbiphenyl | | | | | | | | | | |
| | 9-Vinylanthracene | | | | 10 | | | | | | |
| | 4-Hydroxystyrene | 10 | | | | | | | | | |
| | Benzyl methacrylate | | 50 | 40 | | | | | | | |
| | Methyl methacrylate | | | 10 | | | | | | | |
| | Glycidyl methacrylate | | 45 | 45 | | | 100 | | | 10 | |
| | 3,4-epoxycyclohexylmethane methacrylate | 50 | | | 55 | | | 100 | | | 90 |
| | Glycidyl methacrylate-modified methacrylic acid | | | | | 40 | | | | | |
| | Propyltrimethoxysilane methacrylate | | 5 | 5 | 5 | | | | | | |
| | Mw | 40000 | 40000 | 40000 | 40000 | 40000 | 40000 | 40000 | 40000 | 40000 | 40000 |

TABLE 8

| | | Example 20 | Example 21 | Example 22 | Example 23 | Example 24 | Example 25 | Example 26 |
|---|---|---|---|---|---|---|---|---|
| Synthesized Polymer | Polymer 20 | 100 | | | | | | |
| | Polymer 21 | | 100 | | | | | |
| | Polymer 22 | | | 100 | 100 | 100 | | |
| | Polymer 23 | | | | | | 100 | |
| | Polymer 24 | | | | | | | 100 |
| | Polymer 25 | | | | | | | |
| | Polymer 26 | | | | | | | |
| | Polymer 27 | | | | | | | |
| | Polymer 28 | | | | | | | |
| | Polymer 29 | | | | | | | |
| | Polymer 30 | | | | | | | |
| | Polymer 31 | | | | | | | |
| | Polymer 32 | | | | | | | |
| | Polymer 33 | | | | | | | |
| | Polymer 34 | | | | | | | |
| | Polymer 35 | | | | | | | |
| | Polymer 36 | | | | | | | |
| | Polymer 37 | | | | | | | |
| | Polymer 38 | | | | | | | |
| Commercially available polymer | GTR-B9 | | | | | | | |
| | VPS-3020 | | | | | | | |
| Polymerizable monomer | jER828 | | | | | | | |
| | HP-4700 | | | | | | | |
| | Z-6043N | | | | | | | |

TABLE 8-continued

|  |  | Example 20 | Example 21 | Example 22 | Example 23 | Example 24 | Example 25 | Example 26 |
|---|---|---|---|---|---|---|---|---|
|  | OXT-212 |  |  |  |  |  |  |  |
|  | GT-401 |  |  |  |  |  | 20 |  |
|  | M-140 |  |  |  | 20 |  |  |  |
|  | M-350 |  |  |  | 20 | 20 |  |  |
| Cross-linking agent | MW-30HM |  |  |  |  |  |  |  |
| Photoacid generator | HS-1PG | 2 | 2 | 2 | 2 | 2 | 2 | 2 |
|  | PAG103 |  |  |  |  |  |  |  |
| Photoradical polymerization initiator | OXE02 |  |  |  | 2 | 2 |  |  |
| Evaluation results | Observation of perpendicular lamellar | A | A | A | A | A | A | A |

TABLE 9

|  |  | Example 27 | Example 28 | Example 29 | Example 30 | Example 31 | Example 32 | Example 33 |
|---|---|---|---|---|---|---|---|---|
| Synthesized Polymer | Polymer 20 |  |  |  |  |  |  |  |
|  | Polymer 21 |  |  |  |  |  |  |  |
|  | Polymer 22 |  |  |  |  |  |  |  |
|  | Polymer 23 |  |  |  |  |  |  |  |
|  | Polymer 24 |  |  |  |  |  |  |  |
|  | Polymer 25 | 100 |  |  |  |  |  |  |
|  | Polymer 26 |  | 100 |  |  |  |  |  |
|  | Polymer 27 |  |  | 100 |  |  |  |  |
|  | Polymer 28 |  |  |  | 100 |  |  |  |
|  | Polymer 29 |  |  |  |  | 100 |  |  |
|  | Polymer 30 |  |  |  |  |  | 100 |  |
|  | Polymer 31 |  |  |  |  |  |  | 100 |
|  | Polymer 32 |  |  |  |  |  |  |  |
|  | Polymer 33 |  |  |  |  |  |  |  |
|  | Polymer 34 |  |  |  |  |  |  |  |
|  | Polymer 35 |  |  |  |  |  |  |  |
|  | Polymer 36 |  |  |  |  |  |  |  |
|  | Polymer 37 |  |  |  |  |  |  |  |
|  | Polymer 38 |  |  |  |  |  |  |  |
| Commercially available polymer | GTR-B9 |  |  |  |  |  |  |  |
|  | VPS-3020 |  |  |  |  |  |  |  |
| Polymerizable monomer | jER828 |  |  |  |  |  |  |  |
|  | HP-4700 |  |  |  |  |  |  |  |
|  | Z-6043N |  |  |  |  |  |  |  |
|  | OXT-212 |  |  |  |  |  |  |  |
|  | GT-401 |  |  |  |  |  |  |  |
|  | M-140 |  |  |  |  |  |  |  |
|  | M-350 |  |  |  |  |  |  |  |
| Cross-linking agent | MW-30HM |  |  |  |  |  |  |  |
| Photoacid generator | HS-1PG | 2 | 2 | 2 | 2 | 2 | 2 | 2 |
|  | PAG103 |  |  |  |  |  |  |  |
| Photoradical polymerization initiator | OXE02 |  |  |  |  |  |  |  |
| Evaluation results | Observation of perpendicular lamellar | A | A | A | A | A | A | A |

TABLE 10

|  |  | Example 34 | Example 35 | Example 36 | Example 37 | Example 38 | Example 39 | Example 40 |
|---|---|---|---|---|---|---|---|---|
| Synthesized Polymer | Polymer 20 |  |  |  |  |  | 90 | 90 |
|  | Polymer 21 |  |  |  |  |  |  |  |
|  | Polymer 22 |  |  |  |  |  |  |  |
|  | Polymer 23 |  |  |  |  |  |  |  |
|  | Polymer 24 |  |  |  |  |  |  |  |
|  | Polymer 25 |  |  |  |  |  |  |  |
|  | Polymer 26 |  |  |  |  |  |  |  |

TABLE 10-continued

|  |  | Example 34 | Example 35 | Example 36 | Example 37 | Example 38 | Example 39 | Example 40 |
|---|---|---|---|---|---|---|---|---|
|  | Polymer 27 |  |  |  |  |  |  |  |
|  | Polymer 28 |  |  |  |  |  |  |  |
|  | Polymer 29 |  |  |  |  |  |  |  |
|  | Polymer 30 |  |  |  |  |  |  |  |
|  | Polymer 31 |  |  |  |  |  |  |  |
|  | Polymer 32 | 100 |  |  |  |  |  |  |
|  | Polymer 33 |  | 100 | 100 | 100 | 100 |  |  |
|  | Polymer 34 |  |  |  |  |  | 10 |  |
|  | Polymer 35 |  |  |  |  |  |  | 10 |
|  | Polymer 36 |  |  |  |  |  |  |  |
|  | Polymer 37 |  |  |  |  |  |  |  |
|  | Polymer 38 |  |  |  |  |  |  |  |
| Commercially available polymer | GTR-B9 |  |  |  |  |  |  |  |
|  | VPS-3020 |  |  |  |  |  |  |  |
| Polymerizable monomer | jER828 |  |  |  | 20 |  |  |  |
|  | HP-4700 |  |  |  | 5 |  | 10 |  |
|  | Z-6043N |  |  |  |  |  | 5 | 5 |
|  | OXT-212 |  |  |  | 15 |  |  |  |
|  | GT-401 |  |  |  |  |  | 40 |  |
|  | M-140 |  |  | 20 |  |  |  |  |
|  | M-350 |  |  | 20 |  |  |  |  |
| Cross-linking | MW-30HM |  |  |  |  |  |  |  |
| Photoacid generator | HS-1PG | 2 | 2 |  |  | 2 | 2 | 2 |
|  | PAG103 |  |  |  |  |  |  |  |
| Photoradical polymerization initiator | OXE02 |  | 2 | 2 |  |  |  |  |
| Evaluation results | Observation of perpendicular lamellar | A | A | A | A | A | A | A |

TABLE 11

|  |  | Example 41 | Example 42 | Example 43 | Example 44 | Example 45 |
|---|---|---|---|---|---|---|
| Synthesized Polymer | Polymer 20 | 90 | 90 | 90 |  |  |
|  | Polymer 21 |  |  |  |  |  |
|  | Polymer 22 |  |  |  |  |  |
|  | Polymer 23 |  |  |  |  |  |
|  | Polymer 24 |  |  |  |  |  |
|  | Polymer 25 |  |  |  |  |  |
|  | Polymer 26 |  |  |  |  |  |
|  | Polymer 27 |  |  |  |  |  |
|  | Polymer 28 |  |  |  |  |  |
|  | Polymer 29 |  |  |  |  |  |
|  | Polymer 30 |  |  | 10 |  |  |
|  | Polymer 31 |  |  |  |  |  |
|  | Polymer 32 |  |  |  |  |  |
|  | Polymer 33 |  |  |  |  |  |
|  | Polymer 34 |  |  |  |  |  |
|  | Polymer 35 |  |  |  |  |  |
|  | Polymer 36 | 10 |  |  |  |  |
|  | Polymer 37 |  | 10 |  |  |  |
|  | Polymer 38 |  |  |  |  |  |
| Commercially available polymer | GTR-B9 |  |  |  | 100 |  |
|  | VPS-3020 |  |  |  |  | 100 |
| Polymerizable monomer | jER828 |  |  |  |  |  |
|  | HP-4700 |  |  |  |  |  |
|  | Z-6043N |  |  |  |  |  |
|  | OXT-212 |  |  |  |  |  |
|  | GT-401 |  |  |  |  |  |
|  | M-140 |  |  |  |  |  |
|  | M-350 |  |  |  |  |  |
| Cross-linking agent | MW-30HM |  |  |  | 15 | 15 |
| Photoacid generator | HS-1PG | 2 | 2 | 2 |  |  |
|  | PAG103 |  |  |  | 1 | 1 |
| Photoradical polymerization initiator | OXE02 |  |  |  |  |  |

TABLE 11-continued

|  |  | Example 41 | Example 42 | Example 43 | Example 44 | Example 45 |
|---|---|---|---|---|---|---|
| Evaluation results | Observation of perpendicular lamellar | A | A | A | A | A |

TABLE 12

|  |  | Comparative Example 6 | Comparative Example 7 | Comparative Example 8 | Comparative Example 9 | Comparative Example 10 |
|---|---|---|---|---|---|---|
| Synthesized Polymer | Polymer 20 |  |  |  |  |  |
|  | Polymer 21 |  |  |  |  |  |
|  | Polymer 22 |  |  |  |  |  |
|  | Polymer 23 |  |  |  |  |  |
|  | Polymer 24 |  |  |  |  |  |
|  | Polymer 25 |  |  |  |  |  |
|  | Polymer 26 |  |  |  |  |  |
|  | Polymer 27 |  |  |  |  |  |
|  | Polymer 28 |  |  |  |  |  |
|  | Polymer 29 |  |  |  |  |  |
|  | Polymer 30 |  |  |  |  |  |
|  | Polymer 31 |  |  |  |  |  |
|  | Polymer 32 |  |  |  |  |  |
|  | Polymer 33 |  |  |  |  |  |
|  | Polymer 34 | 100 |  |  |  |  |
|  | Polymer 35 |  | 100 |  |  |  |
|  | Polymer 36 |  |  | 100 |  |  |
|  | Polymer 37 |  |  |  | 100 |  |
|  | Polymer 38 |  |  |  |  | 100 |
| Commercially available polymer | GTR-B9 |  |  |  |  |  |
|  | VPS-3020 |  |  |  |  |  |
| Polymerizable monomer | jER828 |  |  |  |  |  |
|  | HP-4700 |  |  |  |  |  |
|  | Z-6043N |  |  |  |  |  |
|  | OXT-212 |  |  |  |  |  |
|  | GT-401 |  |  |  |  |  |
|  | M-140 |  |  |  |  |  |
|  | M-350 |  |  |  |  |  |
| Cross-linking agent | MW-30HM |  |  |  |  |  |
| Photoacid generator | HS-1PG | 2 | 2 | 2 | 2 | 2 |
|  | PAG103 |  |  |  |  |  |
| Photoradical polymerization initiator | OXE02 |  |  |  |  |  |
| Evaluation results | Observation of perpendicular lamellar | B | B | B | B | B |

[Evaluation of Perpendicular Lamellar Formability]

Each of the resin compositions of Examples 20 to 45 and Comparative Examples 6 to 10 was adjusted to a concentration of 0.5 to 2%, and was spin-coated on an 8-inch silicon substrate by adjusting the number of rotation to obtain a film thickness of 70 nm, followed by a bake treatment at 90° C. for 60 seconds.

Subsequently, using HMW-532D (ORC MANUFACTURING CO. LTD.), ghi line (exposure dose of 2000 mJ/cm$^2$) was irradiated. After exposure, in the samples using a photoacid generator, a post exposure bake (PEB) was conducted at 120° C. for 90 seconds.

To the substrate, a toluene solution of a PS-PMMA block copolymer 1 (17.5 mg/ml) (manufactured by Polymer Source, Inc.; molecular weight of PS: 53,000, molecular weight of PMMA: 54,000, polydispersity index (PDI): 1.16) was spin-coated (number of revolution: 1,000 rpm, 60 seconds), followed by drying by heating at 110° C. for 60 seconds.

Subsequently, the substrate was heated at 200° C. for 6 hours while flowing nitrogen, thereby forming a phase-separated structure. Thereafter, using TCA-3822 (manufactured by Tokyo Ohka Kogyo Co., Ltd.), the substrate was subjected to an oxygen plasma treatment (200 sccm, 40 Pa, 200 W, 30 seconds), thereby selectively removing the phase constituted of PMMA. The surface of the obtained substrate was observed using a scanning electron microscope SEMS4700 (manufactured by Hitachi, Ltd.). A resin composition in which a perpendicular lamellar was observed was evaluated "A", and a resin composition in which a perpendicular lamellar was not observed was evaluated "B". The results are shown in Tables 8 to 12.

From the results, it is apparent that, by using a negative photosensitive resin composition containing a resin component in which 20 mol % to 80 mol % of all the structural units of the resin component is a structural unit derived from an aromatic ring-containing monomer as the undercoat agent, a perpendicular lamellar can be formed on the substrate.

[Heat Polymerizable Resin Composition]

In Tables 13 to 15, the monomers used in the synthesis of polymers 40 to 59, the compositional ratio (unit:mol %) of the monomers and the molecular weight of the synthesized monomers are indicated. Resin compositions of Examples 46 to 71 and Comparative Examples 11 to 15 were prepared in accordance with the formulations shown in Tables 16 to 21 (unit: parts by weight). With respect to the compositions indicated in Tables 16 to 21, the details are shown in Tables 28 to 30.

TABLE 13

|  |  | Polymer 40 | Polymer 41 | Polymer 42 | Polymer 43 | Polymer 44 | Polymer 45 | Polymer 46 |
|---|---|---|---|---|---|---|---|---|
| Synthesized polymer | Styrene | 20 | 80 | 35 | 20 | 80 | 35 |  |
|  | 1-Vinylnaphthalene |  |  |  |  |  |  | 50 |
|  | 4-Vinylbiphenyl |  |  |  |  |  |  |  |
|  | 9-Vinylanthracene |  |  |  |  |  |  |  |
|  | 4-Hydroxystyrene |  |  |  |  |  |  |  |
|  | Benzyl methacrylate |  |  |  |  |  |  |  |
|  | Methyl methacrylate |  |  |  |  |  |  |  |
|  | Glycidyl methacrylate | 80 | 20 | 60 |  |  |  | 50 |
|  | 3,4-epoxycyclohexylmethane methacrylate |  |  |  | 80 | 20 | 60 |  |
|  | Glycidyl methacrylate-modified methacrylic acid |  |  |  |  |  |  |  |
|  | Propyltrimethoxysilane methacrylate |  |  | 5 |  |  | 5 |  |
|  | Mw | 40000 | 40000 | 40000 | 40000 | 40000 | 40000 | 40000 |

TABLE 14

|  |  | Polymer 47 | Polymer 48 | Polymer 49 | Polymer 50 | Polymer 51 | Polymer 52 | Polymer 53 |
|---|---|---|---|---|---|---|---|---|
| Synthesized polymer | Styrene |  | 30 | 40 |  |  | 30 | 60 |
|  | 1-Vinylnaphthalene |  |  |  |  |  |  |  |
|  | 4-Vinylbiphenyl | 50 |  |  |  |  |  |  |
|  | 9-Vinylanthracene |  | 20 |  |  |  | 10 |  |
|  | 4-Hydroxystyrene |  |  | 10 |  |  |  |  |
|  | Benzyl methacrylate |  |  |  | 50 | 40 |  |  |
|  | Methyl methacrylate |  |  |  |  | 10 |  |  |
|  | Glycidyl methacrylate | 50 |  |  | 45 | 45 |  |  |
|  | 3,4-epoxycyclohexylmethane methacrylate |  | 50 | 50 |  |  | 55 |  |
|  | Glycidyl methacrylate-modified methacrylic acid |  |  |  |  |  |  | 40 |
|  | Propyltrimethoxysilane methacrylate |  |  |  | 5 | 5 | 5 |  |
|  | Mw | 40000 | 40000 | 40000 | 40000 | 40000 | 40000 | 40000 |

TABLE 15

|  |  | Polymer 54 | Polymer 55 | Polymer 56 | Polymer 57 | Polymer 58 | Polymer 59 |
|---|---|---|---|---|---|---|---|
| Synthesized polymer | Styrene | 60 |  |  | 100 | 90 | 10 |
|  | 1-Vinylnaphthalene |  |  |  |  |  |  |
|  | 4-Vinylphenyl |  |  |  |  |  |  |
|  | 9-Vinylanthracene |  |  |  |  |  |  |
|  | 4-Hydroxystyrene |  |  |  |  |  |  |
|  | Benzyl methacrylate |  |  |  |  |  |  |
|  | Methyl methacrylate | 40 |  |  |  |  |  |
|  | Glycidyl methacrylate |  | 100 |  |  | 10 |  |
|  | 3,4-epoxycyclohexylmethane methacrylate |  |  | 100 |  |  | 90 |
|  | Glycidyl methacrylate-modified methacrylic acid |  |  |  |  |  |  |
|  | Propyltrimethoxysilane methacrylate |  |  |  |  |  |  |
|  | Mw | 40000 | 40000 | 40000 | 40000 | 40000 | 40000 |

TABLE 16

|  |  | Example 46 | Example 47 | Example 48 | Example 49 | Example 50 |
|---|---|---|---|---|---|---|
| Synthesized Polymer | Polymer 40 | 100 |  |  |  |  |
|  | Polymer 41 |  | 100 |  |  |  |
|  | Polymer 42 |  |  | 100 | 100 | 100 |
|  | Polymer 43 |  |  |  |  |  |
|  | Polymer 44 |  |  |  |  |  |
|  | Polymer 45 |  |  |  |  |  |
|  | Polymer 46 |  |  |  |  |  |
|  | Polymer 47 |  |  |  |  |  |
|  | Polymer 48 |  |  |  |  |  |
|  | Polymer 49 |  |  |  |  |  |
|  | Polymer 50 |  |  |  |  |  |
|  | Polymer 51 |  |  |  |  |  |
|  | Polymer 52 |  |  |  |  |  |
|  | Polymer 53 |  |  |  |  |  |
|  | Polymer 54 |  |  |  |  |  |
|  | Polymer 55 |  |  |  |  |  |
|  | Polymer 56 |  |  |  |  |  |
|  | Polymer 57 |  |  |  |  |  |
|  | Polymer 58 |  |  |  |  |  |
|  | Polymer 59 |  |  |  |  |  |
| Commercially available polymer | GTR-B9 |  |  |  |  |  |
|  | VPS-3020 |  |  |  |  |  |
| Polymerizable monomer | jER828 |  |  |  |  |  |
|  | HP-4700 |  |  |  |  |  |
|  | Z-6043N |  |  |  |  |  |
|  | OXT-212 |  |  |  |  |  |
|  | GT-401 |  |  |  |  | 20 |
| Cross-linking agent | MW-30HM |  |  |  |  |  |
| Heat curable catalyst | Diethylenetriamine |  | 5 |  |  |  |
|  | Pyromellitic anhydride |  |  |  | 5 |  |
|  | 2,4,6-tris(dimethylaminomethyl)phenol |  |  | 5 |  |  |
|  | 2-methylimidazole |  |  |  | 5 | 5 |
| Thermal acid generator | SI-60 | 1 |  |  |  | 0.5 |
|  | PI-2074 |  |  |  |  | 0.5 |
|  | PAG103 |  |  |  |  |  |
| Evaluation results | Observation of perpendicular lamellar | A | A | A | A | A |

TABLE 17

|  |  | Example 51 | Example 52 | Example 53 | Example 54 | Example 55 |
|---|---|---|---|---|---|---|
| Synthesized Polymer | Polymer 40 |  |  |  |  |  |
|  | Polymer 41 |  |  |  |  |  |
|  | Polymer 42 |  |  |  |  |  |
|  | Polymer 43 | 100 |  |  |  |  |
|  | Polymer 44 |  | 100 |  |  |  |
|  | Polymer 45 |  |  | 100 |  |  |
|  | Polymer 46 |  |  |  | 100 |  |
|  | Polymer 47 |  |  |  |  | 100 |
|  | Polymer 48 |  |  |  |  |  |
|  | Polymer 49 |  |  |  |  |  |
|  | Polymer 50 |  |  |  |  |  |
|  | Polymer 51 |  |  |  |  |  |
|  | Polymer 52 |  |  |  |  |  |
|  | Polymer 53 |  |  |  |  |  |
|  | Polymer 54 |  |  |  |  |  |
|  | Polymer 55 |  |  |  |  |  |
|  | Polymer 56 |  |  |  |  |  |
|  | Polymer 57 |  |  |  |  |  |
|  | Polymer 58 |  |  |  |  |  |
|  | Polymer 59 |  |  |  |  |  |
| Commercially available polymer | GTR-B9 |  |  |  |  |  |
|  | VPS-3020 |  |  |  |  |  |

TABLE 17-continued

|  |  | Example 51 | Example 52 | Example 53 | Example 54 | Example 55 |
|---|---|---|---|---|---|---|
| Polymerizable monomer | jER828 | | | | | |
| | HP-4700 | | | | | |
| | Z-6043N | | | | | |
| | OXT-212 | | | | | |
| | GT-401 | | | | | |
| Cross-linking agent | MW-30HM | | | | | |
| Heat curable catalyst | Diethylenetriamine | | | | | |
| | Pyromellitic anhydride | | | | | |
| | 2,4,6-tris(dimethylaminomethyl)phenol | | | | | |
| | 2-methylimidazole | | | | | |
| Thermal acid generator | SI-60 | 1 | | 1 | 1 | 1 |
| | PI-2074 | | 1 | | | |
| | PAG103 | | | | | |
| Evaluation results | Observation of perpendicular lamellar | A | A | A | A | A |

TABLE 18

|  |  | Example 56 | Example 57 | Example 58 | Example 59 | Example 60 |
|---|---|---|---|---|---|---|
| Synthesized Polymer | Polymer 40 | | | | | |
| | Polymer 41 | | | | | |
| | Polymer 42 | | | | | |
| | Polymer 43 | | | | | |
| | Polymer 44 | | | | | |
| | Polymer 45 | | | | | |
| | Polymer 46 | | | | | |
| | Polymer 47 | | | | | |
| | Polymer 48 | 100 | | | | |
| | Polymer 49 | | 100 | | | |
| | Polymer 50 | | | 100 | | |
| | Polymer 51 | | | | 100 | |
| | Polymer 52 | | | | | 100 |
| | Polymer 53 | | | | | |
| | Polymer 54 | | | | | |
| | Polymer 55 | | | | | |
| | Polymer 56 | | | | | |
| | Polymer 57 | | | | | |
| | Polymer 58 | | | | | |
| | Polymer 59 | | | | | |
| Commercially available polymer | GTR-B9 | | | | | |
| | VPS-3020 | | | | | |
| Polymerizable monomer | jER828 | | | | | |
| | HP-4700 | | | | | |
| | Z-6043N | | | | | |
| | OXT-212 | | | | | |
| | GT-401 | | | | | |
| Cross-linking agent | MW-30HM | | | | | |
| Heat curable catalyst | Diethylenetriamine | | | | | |
| | Pyromellitic anhydride | | | | | |
| | 2,4,6-tris(dimethylaminomethyl)phenol | | | | | |
| | 2-methylimidazole | | | | | |
| Thermal acid generator | SI-60 | 1 | 1 | 1 | 1 | 1 |
| | PI-2074 | | | | | |
| | PAG103 | | | | | |
| Evaluation results | Observation of perpendicular lamellar | A | A | A | A | A |

TABLE 19

|  |  | Example 61 | Example 62 | Example 63 | Example 64 | Example 65 |
|---|---|---|---|---|---|---|
| Synthesized Polymer | Polymer 40 |  |  |  | 90 | 90 |
|  | Polymer 41 |  |  |  |  |  |
|  | Polymer 42 |  |  |  |  |  |
|  | Polymer 43 |  |  |  |  |  |
|  | Polymer 44 |  |  |  |  |  |
|  | Polymer 45 |  |  |  |  |  |
|  | Polymer 46 |  |  |  |  |  |
|  | Polymer 47 |  |  |  |  |  |
|  | Polymer 48 |  |  |  |  |  |
|  | Polymer 49 |  |  |  |  |  |
|  | Polymer 50 |  |  |  |  |  |
|  | Polymer 51 |  |  |  |  |  |
|  | Polymer 52 |  |  |  |  |  |
|  | Polymer 53 | 100 | 100 |  |  |  |
|  | Polymer 54 |  |  | 100 |  |  |
|  | Polymer 55 |  |  |  | 10 |  |
|  | Polymer 56 |  |  |  |  | 10 |
|  | Polymer 57 |  |  |  |  |  |
|  | Polymer 58 |  |  |  |  |  |
|  | Polymer 59 |  |  |  |  |  |
| Commercially available polymer | GTR-B9 |  |  |  |  |  |
|  | VPS-3020 |  |  |  |  |  |
| Polymerizable monomer | jER828 | 20 |  | 20 |  |  |
|  | HP-4700 | 5 |  |  | 10 |  |
|  | Z-6043N |  | 5 | 5 | 5 |  |
|  | OXT-212 | 15 |  |  |  |  |
|  | GT-401 |  | 40 | 20 |  |  |
| Cross-linking agent | MW-30HM |  |  |  |  |  |
| Heat curable catalyst | Diethylenetriamine |  |  |  |  |  |
|  | Pyromellitic anhydride |  |  |  |  |  |
|  | 2,4,6-tris(dimethylamino-methyl)phenol |  |  |  |  |  |
|  | 2-methylimidazole |  |  |  |  |  |
| Thermal acid generator | SI-60 | 1 | 1 | 1 | 1 | 1 |
|  | PI-2074 |  |  |  |  |  |
|  | PAG103 |  |  |  |  |  |
| Evaluation results | Observation of perpendicular lamellar | A | A | A | A | A |

TABLE 20

|  |  | Example 66 | Example 67 | Example 68 | Example 69 | Example 70 |
|---|---|---|---|---|---|---|
| Synthesized Polymer | Polymer 40 | 90 | 90 | 90 |  |  |
|  | Polymer 41 |  |  |  |  |  |
|  | Polymer 42 |  |  |  |  |  |
|  | Polymer 43 |  |  |  |  |  |
|  | Polymer 44 |  |  |  |  |  |
|  | Polymer 45 |  |  |  |  |  |
|  | Polymer 46 |  |  |  |  |  |
|  | Polymer 47 |  |  |  |  |  |
|  | Polymer 48 |  |  |  |  |  |
|  | Polymer 49 |  |  |  |  |  |
|  | Polymer 50 |  |  | 10 |  |  |
|  | Polymer 51 |  |  |  |  |  |
|  | Polymer 52 |  |  |  |  |  |
|  | Polymer 53 |  |  |  |  |  |
|  | Polymer 54 |  |  |  |  |  |
|  | Polymer 55 |  |  |  |  |  |
|  | Polymer 56 |  |  |  |  |  |
|  | Polymer 57 | 10 |  |  |  |  |
|  | Polymer 58 |  | 10 |  |  |  |
|  | Polymer 59 |  |  |  |  |  |
| Commercially available polymer | GTR-B9 |  |  |  | 100 |  |
|  | VPS-3020 |  |  |  |  | 100 |
| Polymerizable monomer | jER828 |  |  |  |  |  |
|  | HP-4700 |  |  |  |  |  |

TABLE 20-continued

|  |  | Example 66 | Example 67 | Example 68 | Example 69 | Example 70 |
|---|---|---|---|---|---|---|
| Cross-linking agent | Z-6043N |  |  |  |  |  |
|  | OXT-212 |  |  |  |  |  |
|  | GT-401 |  |  |  |  |  |
|  | MW-30HM |  |  |  | 15 | 15 |
| Heat curable catalyst | Diethylenetriamine |  |  |  |  |  |
|  | Pyromellitic anhydride |  |  |  |  |  |
|  | 2,4,6-tris(dimethylamino-methyl)phenol |  |  |  |  |  |
|  | 2-methylimidazole |  |  |  |  |  |
| Thermal acid generator | SI-60 | 1 | 1 | 1 | 1 | 1 |
|  | PI-2074 |  |  |  |  |  |
|  | PAG103 |  |  |  |  | 1 |
| Evaluation results | Observation of perpendicular lamellar | A | A | A | A | A |

TABLE 21

|  |  | Example 71 | Comparative Example 11 | Comparative Example 12 | Comparative Example 13 | Comparative Example 14 | Comparative Example 15 |
|---|---|---|---|---|---|---|---|
| Synthesized Polymer | Polymer 40 |  |  |  |  |  |  |
|  | Polymer 41 |  |  |  |  |  |  |
|  | Polymer 42 |  |  |  |  |  |  |
|  | Polymer 43 | 100 |  |  |  |  |  |
|  | Polymer 44 |  |  |  |  |  |  |
|  | Polymer 45 |  |  |  |  |  |  |
|  | Polymer 46 |  |  |  |  |  |  |
|  | Polymer 47 |  |  |  |  |  |  |
|  | Polymer 48 |  |  |  |  |  |  |
|  | Polymer 49 |  |  |  |  |  |  |
|  | Polymer 50 |  |  |  |  |  |  |
|  | Polymer 51 |  |  |  |  |  |  |
|  | Polymer 52 |  |  |  |  |  |  |
|  | Polymer 53 |  |  |  |  |  |  |
|  | Polymer 54 |  |  |  |  |  |  |
|  | Polymer 55 |  | 100 |  |  |  |  |
|  | Polymer 56 |  |  | 100 |  |  |  |
|  | Polymer 57 |  |  |  | 100 |  |  |
|  | Polymer 58 |  |  |  |  | 100 |  |
|  | Polymer 59 |  |  |  |  |  | 100 |
| Commercially available polymer | GTR-B9 |  |  |  |  |  |  |
|  | VPS-3020 |  |  |  |  |  |  |
| Polymerizable monomer | jER828 |  |  |  |  |  |  |
|  | HP-4700 |  |  |  |  |  |  |
|  | Z-6043N |  |  |  |  |  |  |
|  | OXT-212 |  |  |  |  |  |  |
|  | GT-401 |  |  |  |  |  |  |
| Cross-linking agent | MW-30HM |  |  |  |  |  |  |
| Heat curable catalyst | Diethylenetriamine |  |  |  |  |  |  |
|  | Pyromellitic anhydride |  |  |  |  |  |  |
|  | 2,4,6-tris(dimethylamino-methyl)phenol |  |  |  |  |  |  |
|  | 2-methylimidazole |  |  |  |  |  |  |
| Thermal acid generator | SI-60 |  | 1 | 1 | 1 | 1 | 1 |
|  | PI-2074 |  |  |  |  |  |  |
|  | PAG103 |  |  |  |  |  |  |
| Evaluation results | Observation of perpendicular lamellar | A | B | B | B | B | B |

[Evaluation of Perpendicular Lamellar Formability]

Each of the resin compositions of Examples 46 to 71 and Comparative Examples 11 to 15 was adjusted to a concentration of 0.5 to 2%, and was spin-coated on an 8-inch silicon substrate by adjusting the number of rotation to obtain a film thickness of 70 nm, followed by a bake treatment at 250° C. for 10 minutes.

To the substrate, a toluene solution of a PS-PMMA block copolymer 1 (17.5 mg/ml) (manufactured by Polymer Source, Inc.; molecular weight of PS: 53,000, molecular weight of PMMA: 54,000, polydispersity index (PDI): 1.16) was spin-coated (number of revolution: 1,000 rpm, 30 seconds), followed by drying by heating at 110° C. for 60 seconds.

Subsequently, the substrate was heated at 200° C. for 6 hours while flowing nitrogen, thereby forming a phase-separated structure. Thereafter, using TCA-3822 (manufactured by Tokyo Ohka Kogyo Co., Ltd.), the substrate was subjected to an oxygen plasma treatment (200 sccm, 40 Pa, 200 W, 30 seconds), thereby selectively removing the phase constituted of PMMA. The surface of the obtained substrate was observed using a scanning electron microscope SEMS4700 (manufactured by Hitachi, Ltd.). A resin composition in which a perpendicular lamellar was observed was evaluated "A", and a resin composition in which a perpendicular lamellar was not observed was evaluated "B". The results are shown in Tables 16 to 21.

From the results, it is apparent that, by using a heat polymerizable resin composition containing a resin component in which 20 mol % to 80 mol % of all the structural units of the resin component is a structural unit derived from an aromatic ring-containing monomer as the undercoat agent, a perpendicular lamellar can be formed on the substrate.

[Chemically Amplified Positive Resist Composition]

In Tables 22 and 23, the monomers used in the synthesis of polymers 60 to 79, the compositional ratio (unit:mol %) of the monomers and the molecular weight of the synthesized monomers are indicated. Resin compositions of Examples 72 to 88 and Comparative Examples 16 to 20 were prepared in accordance with the formulations shown in Tables 24 to 26 (unit: parts by weight). With respect to the compositions indicated in Tables 24 to 26, the details are shown in Tables 28 to 30.

TABLE 22

| | | | Polymer 60 | Polymer 61 | Polymer 62 | Polymer 63 | Polymer 64 | Polymer 65 | Polymer 66 | Polymer 67 | Polymer 68 | Polymer 69 |
|---|---|---|---|---|---|---|---|---|---|---|---|---|
| Synthesized polymer | Essential component | Styrene | 50 | 20 | 80 | | | | | 50 | 50 | 40 |
| | | 1-Vinylnaphthalene | | | | 50 | | | | | | |
| | | 4-Vinylbiphenyl | | | | | 50 | | | | | |
| | | 9-Vinylanthracene | | | | | | 50 | | | | |
| | | Benzyl methacrylate | | | | | | | 50 | | | |
| | | 1-Ethylcyclohexyl methacrylate | 50 | 80 | 20 | 50 | 50 | 50 | 50 | | | 50 |
| | | 1-methyladamantyl methacrylate | | | | | | | | 50 | | |
| | | 1-Isopropyladamantyl methacrylate | | | | | | | | | 50 | |
| | Optional component | ANSM | | | | | | | | | | 10 |
| | | Hydroxyadamantyl methacrylate | | | | | | | | | | |
| | | Tricyclodecane methacrylate | | | | | | | | | | |
| | | Mw | 10000 | 10000 | 10000 | 10000 | 10000 | 10000 | 10000 | 10000 | 10000 | 10000 |

TABLE 23

| | | | Polymer 70 | Polymer 71 | Polymer 72 | Polymer 73 | Polymer 74 | Polymer 75 | Polymer 76 | Polymer 77 | Polymer 78 | Polymer 79 |
|---|---|---|---|---|---|---|---|---|---|---|---|---|
| Synthesized polymer | Essential component | Styrene | 40 | 40 | 40 | 40 | 40 | 100 | | | 50 | |
| | | 1-Vinylnaphthalene | | | | | | | | | | |
| | | 4-Vinylbiphenyl | | | | | | | | | | |
| | | 9-Vinylanthracene | | | | | | | | | | |
| | | Benzyl methacrylate | | | | | | | | | | |
| | | 1-Ethylcyclohexyl methacrylate | 25 | | 40 | | 20 | | 100 | | | 50 |
| | | 1-methyladamantyl methacrylate | | 50 | | 30 | | | | | | |
| | | 1-Isopropyladamantyl methacrylate | 25 | | 10 | 20 | 20 | | | | | |
| | Optional component | ANSM | 10 | | | | 10 | | | | 50 | 50 |
| | | Hydroxyadamantyl methacrylate | | 10 | | 10 | | | | 100 | | |
| | | Tricyclodecane methacrylate | | | 10 | | 10 | | | | | |
| | | Mw | 10000 | 10000 | 10000 | 10000 | 10000 | 10000 | 10000 | 10000 | 10000 | 10000 |

In Tables 22 and 23, ANSM indicates a compound represented by formula (III) shown below.

[Chemical Formula 55]

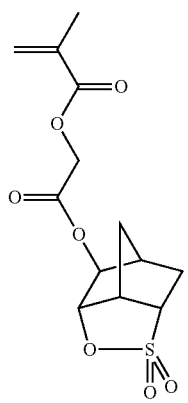

(111)

With respect to polymer 80, the weight average molecular weight (Mw) is 40,000, and the ratio (molar ratio) of the structural units is styrene: 3,4-epoxycyclohexylmethane methacrylate: propyltrimethoxysilane methacrylate=35:60:5.

TABLE 24

|  |  | Example 72 | Example 73 | Example 74 | Example 75 | Example 76 | Example 77 | Example 78 | Example 79 | Example 80 | Example 81 |
|---|---|---|---|---|---|---|---|---|---|---|---|
| Synthesized polymer | Polymer 60 | 100 |  |  | 100 |  |  |  |  |  |  |
|  | Polymer 61 |  | 100 |  |  |  |  |  |  |  |  |
|  | Polymer 62 |  |  | 100 |  |  |  |  |  |  |  |
|  | Polymer 63 |  |  |  |  | 100 |  |  |  |  |  |
|  | Polymer 64 |  |  |  |  |  | 100 |  |  |  |  |
|  | Polymer 65 |  |  |  |  |  |  | 100 |  |  |  |
|  | Polymer 66 |  |  |  |  |  |  |  | 100 |  |  |
|  | Polymer 67 |  |  |  |  |  |  |  |  | 100 |  |
|  | Polymer 68 |  |  |  |  |  |  |  |  |  | 100 |
|  | Polymer 69 |  |  |  |  |  |  |  |  |  |  |
|  | Polymer 70 |  |  |  |  |  |  |  |  |  |  |
|  | Polymer 71 |  |  |  |  |  |  |  |  |  |  |
|  | Polymer 72 |  |  |  |  |  |  |  |  |  |  |
|  | Polymer 73 |  |  |  |  |  |  |  |  |  |  |
|  | Polymer 74 |  |  |  |  |  |  |  |  |  |  |
|  | Polymer 75 |  |  |  |  |  |  |  |  |  |  |
|  | Polymer 76 |  |  |  |  |  |  |  |  |  |  |
|  | Polymer 77 |  |  |  |  |  |  |  |  |  |  |
|  | Polymer 78 |  |  |  |  |  |  |  |  |  |  |
|  | Polymer 79 |  |  |  |  |  |  |  |  |  |  |
|  | Polymer 80 |  |  |  |  |  |  |  |  |  |  |
| Photoacid generator | HS-1PG | 3 | 3 | 3 | 3 | 3 |  |  |  |  | 3 |
|  | SP-172 |  |  |  |  |  | 3 | 3 |  |  |  |
|  | ZK-0138 |  |  |  |  |  |  |  | 10 |  |  |
|  | PAG103 |  |  |  |  |  |  |  |  | 3 |  |
| Amine | Tri-n-pentylamine |  |  |  | 0.02 |  |  |  |  |  |  |
| Acid | Salicylic acid |  |  |  | 0.03 |  |  |  |  |  |  |
| Evaluation result | Observation of perpendicular lamellar | A | A | A | A | A | A | A | A | A | A |
|  | Critical resolution (um) | 0.5 | 0.5 | 0.5 | 0.5 | 0.5 | 0.5 | 0.5 | 0.5 | 0.5 | 0.5 |

TABLE 25

|  |  | Example 82 | Example 83 | Example 84 | Example 85 | Example 86 | Example 87 | Example 88 |
|---|---|---|---|---|---|---|---|---|
| Synthesized polymer | Polymer 60 |  |  |  |  |  |  |  |
|  | Polymer 61 |  |  |  |  |  |  |  |
|  | Polymer 62 |  |  |  |  |  |  |  |
|  | Polymer 63 |  |  |  |  |  |  |  |
|  | Polymer 64 |  |  |  |  |  |  |  |
|  | Polymer 65 |  |  |  |  |  |  |  |
|  | Polymer 66 |  |  |  |  |  |  |  |
|  | Polymer 67 |  |  |  |  |  |  |  |
|  | Polymer 68 |  |  |  |  |  |  |  |

TABLE 25-continued

|  |  | Example 82 | Example 83 | Example 84 | Example 85 | Example 86 | Example 87 | Example 88 |
|---|---|---|---|---|---|---|---|---|
|  | Polymer 69 | 100 |  |  |  |  |  |  |
|  | Polymer 70 |  | 100 |  |  |  |  |  |
|  | Polymer 71 |  |  | 100 |  |  |  |  |
|  | Polymer 72 |  |  |  | 100 |  |  |  |
|  | Polymer 73 |  |  |  |  | 100 |  |  |
|  | Polymer 74 |  |  |  |  |  | 100 |  |
|  | Polymer 75 |  |  |  |  |  |  | 100 |
|  | Polymer 76 |  |  |  |  |  |  |  |
|  | Polymer 77 |  |  |  |  |  |  |  |
|  | Polymer 78 |  |  |  |  |  |  |  |
|  | Polymer 79 |  |  |  |  |  |  |  |
|  | Polymer 80 |  |  |  |  |  |  |  |
| Photoacid generator | HS-1PG |  | 3 | 3 | 3 | 3 | 3 | 3 |
|  | SP-172 |  |  |  |  |  |  |  |
|  | ZK-0138 |  |  |  |  |  |  |  |
|  | PAG103 | 3 |  |  |  |  |  |  |
| Amine | Tri-n-pentylamine |  |  |  |  |  |  |  |
| Acid | Salicylic acid |  |  |  |  |  |  |  |
| Evaluation result | Observation of perpendicular lamellar | A | A | A | A | A | A | A |
|  | Critical resolution (um) | 0.5 | 0.5 | 0.5 | 0.5 | 0.5 | 0.5 | 0.5 |

TABLE 26

|  |  | Comparative Example 16 | Comparative Example 17 | Comparative Example 18 | Comparative Example 19 | Comparative Example 20 |
|---|---|---|---|---|---|---|
| Synthesized polymer | Polymer 60 |  |  |  |  |  |
|  | Polymer 61 |  |  |  |  |  |
|  | Polymer 62 |  |  |  |  |  |
|  | Polymer 63 |  |  |  |  |  |
|  | Polymer 64 |  |  |  |  |  |
|  | Polymer 65 |  |  |  |  |  |
|  | Polymer 66 |  |  |  |  |  |
|  | Polymer 67 |  |  |  |  |  |
|  | Polymer 68 |  |  |  |  |  |
|  | Polymer 69 |  |  |  |  |  |
|  | Polymer 70 |  |  |  |  |  |
|  | Polymer 71 |  |  |  |  |  |
|  | Polymer 72 |  |  |  |  |  |
|  | Polymer 73 |  |  |  |  |  |
|  | Polymer 74 |  |  |  |  |  |
|  | Polymer 75 |  |  |  |  |  |
|  | Polymer 76 | 100 |  |  |  |  |
|  | Polymer 77 |  | 100 |  |  |  |
|  | Polymer 78 |  |  | 100 |  |  |
|  | Polymer 79 |  |  |  | 100 |  |
|  | Polymer 80 |  |  |  |  | 100 |
| Photoacid generator | HS-1PG | 3 | 3 | 3 | 3 | 2 |
|  | SP-172 |  |  |  |  |  |
|  | ZK-0138 |  |  |  |  |  |
|  | PAG103 |  |  |  |  |  |
| Amine | Tri-n-pentylamine |  |  |  |  |  |
| Acid | Salicylic acid |  |  |  |  |  |
| Evaluation result | Observation of perpendicular lamellar | B | B | B | B | A |
|  | Critical resolution (um) | 0.5 | B | B | 0.5 | 1.5 |

[Evaluation of Perpendicular Lamellar Formability]

Each of the resin compositions of Examples 72 to 88 and Comparative Examples 16 to 20 was adjusted to a concentration of 4 to 10%, and was spin-coated on an 8-inch silicon substrate by adjusting the number of rotation to obtain a film thickness of 350 nm, followed by a bake treatment at 110° C. for 60 seconds.

On the resist film, a line/space pattern of 0.3 to 5 μm was exposed by using NSR-2205i14E (manufactured by Nikon Corporation). Thereafter, a PEB treatment was conducted at 110° C. for 60 seconds, followed by a paddle development NMD-3 (product name; manufactured by Tokyo Ohka Kogyo Co., Ltd.).

In Comparative Example 13, developing was conducted using propylene glycol monomethyl ether acetate (PGMEA).

In Examples 72 to 88 and Comparative Examples 16 to 20, the critical resolution (μm) was measured using a measuring SEM. The results are indicated under "Critical resolution (μm)" in Tables 24 to 26, and in the case where the critical resolution exceeded 5 µm, the critical resolution was evaluated as "B".

To the substrate, a toluene solution of a PS-PMMA block copolymer 1 (17.5 mg/ml) (manufactured by Polymer Source, Inc.; molecular weight of PS: 53,000, molecular weight of PMMA: 54,000, polydispersity index (PDI): 1.16) was spin-coated (number of revolution: 1,000 rpm, 60 seconds), followed by drying by heating at 110° C. for 60 seconds.

Subsequently, the substrate was heated at 200° C. for 6 hours while flowing nitrogen, thereby forming a phase-separated structure. Thereafter, using TCA-3822 (product name; manufactured by Tokyo Ohka Kogyo Co., Ltd.), the substrate was subjected to an oxygen plasma treatment (200 sccm, 40 Pa, 200 W, 30 seconds), thereby selectively removing the phase constituted of PMMA. The surface of the obtained substrate was observed using a scanning electron microscope SEMS4700 (manufactured by Hitachi, Ltd.). A resin composition in which a perpendicular lamellar was observed was evaluated "A", and a resin composition in which a perpendicular lamellar was not observed was evaluated "B". The results are shown in Tables 24 to 26.

In Examples 72 to 88, a perpendicular lamellar was observed, but in Comparative Examples 16 to 19, a perpendicular lamellar was not observed. In Comparative Example 20, although a perpendicular lamellar was observed, the critical resolution was poor.

From the results, it is apparent that, by using a chemically amplified positive resist composition containing a resin component in which 20 mol % to 80 mol % of all the structural units of the resin component is a structural unit derived from an aromatic ring-containing monomer as the undercoat agent, a perpendicular lamellar can be formed on the substrate.

[Novolak Resist Composition]

Resin compositions of Examples 89 to 98 were prepared in accordance with the formulations shown in Table 27. With respect to the compositions indicated in Table 27, the details are shown in Tables 28 to 30. In Table 27, "PM" for Example 98 means propyleneglycol monomethylether acetate (PGMEA). The unit is parts by weight.

[Evaluation of Perpendicular Lamellar Formability]

Each of the resin compositions of Examples 89 to 98 was adjusted to a concentration of 4 to 10%, and was spin-coated on an 8-inch silicon substrate by adjusting the number of rotation to obtain a film thickness of 350 nm, followed by a bake treatment at 110° C. for 60 seconds.

On the resist film, a line/space pattern of 0.3 to 5 µm was exposed by using NSR-2205i14E (manufactured by Nikon Corporation). Thereafter, a PEB treatment was conducted at 110° C. for 60 seconds, followed by a paddle development NMD-3 (product name; manufactured by Tokyo Ohka Kogyo Co., Ltd.).

In Examples 89 to 98, the critical resolution (µm) was measured using a measuring SEM. The results are indicated under "Critical resolution (µm)" in Table 27.

To the substrate, a toluene solution of a PS-PMMA block copolymer 1 (17.5 mg/ml) (manufactured by Polymer Source, Inc.; molecular weight of PS: 53,000, molecular weight of PMMA: 54,000, polydispersity index (PDI): 1.16) was spin-coated (number of revolution: 1,000 rpm, 60 seconds), followed by drying by heating at 110° C. for 60 seconds.

Subsequently, the substrate was heated at 200° C. for 6 hours while flowing nitrogen, thereby forming a phase-separated structure. Thereafter, using TCA-3822 (product name; manufactured by Tokyo Ohka Kogyo Co., Ltd.), the substrate was subjected to an oxygen plasma treatment (200 sccm, 40 Pa, 200 W, 30 seconds), thereby selectively removing the phase constituted of PMMA. The surface of the obtained substrate was observed using a scanning electron microscope SEMS4700 (manufactured by Hitachi, Ltd.). A resin composition in which a perpendicular lamellar was observed was evaluated "A", and a resin composition in which a perpendicular lamellar was not observed was evaluated "B". The results are shown in Table 27.

From the results, it is apparent that, by using a novolak resist composition containing a resin component in which 20 mol % to 80 mol % of all the structural units of the resin component is a structural unit derived from an aromatic ring-containing monomer as the undercoat agent, a perpendicular lamellar can be formed on the substrate.

TABLE 27

| | | Example 89 | Example 90 | Example 91 | Example 92 | Example 93 | Example 94 | Example 95 | Example 96 | Example 97 | Example 98 |
|---|---|---|---|---|---|---|---|---|---|---|---|
| Novolak resin | GTR-A7 | 100 | | | | | | 100 | 100 | 100 | 100 |
| | GTR-B9 | | 50 | | | | | | | | |
| | GTR-C6 | | 50 | | | | | | | | |
| | GTR-M3 | | | 100 | | | | | | | |
| | TO-123 | | | | 100 | | | | | | |
| NQD esterified polymer | 95 ester | | | | | 100 | 100 | | | | |
| NQD compound | TP-34 ester | 20 | 20 | 20 | 20 | | 5 | | | | |
| | TrisP-PA-MF | | | | | | | 20 | | | |
| | ASL-234 | | | | | | | | 20 | | |
| | 4CPA-1022 | | | | | | | | | 20 | |
| Solvent | PM | | | | | | | | | | 20 |
| Evaluation result | Observation of perpendicular lamellar | A | A | A | A | A | A | A | A | A | A |
| | Critical resolution (um) | 0.4 | 0.45 | 0.4 | 0.4 | 0.35 | 0.35 | 0.4 | 0.4 | 0.4 | 0.4 |

TABLE 28

| Polymer component: vinyl/acryl monomer | Vinyl monomer | Styrene | Tokyo Chemical Industry |
|---|---|---|---|
| | | 4-Hydroxystyrene | Tokyo Chemical Industry |
| | | 4-t-Bu styrene | Tokyo Chemical Industry |
| | | α-Methylstyrene | Tokyo Chemical Industry |
| | | 4-Vinylbenzylcyanide | Tokyo Chemical Industry |
| | | 4-Methylstyrene | Tokyo Chemical Industry |
| | | 4-Methoxystyrene | Tokyo Chemical Industry |
| | | 4-Nitrostyrene | Tokyo Chemical Industry |
| | | 4-n-octylstyrene | Tokyo Chemical Industry |
| | | 2,4,6-trimethylstyrene | Tokyo Chemical Industry |
| | | 1-Vinylnaphthalene | Tokyo Chemical Industry |
| | | 4-vinylbiphenyl | Tokyo Chemical Industry |
| | | 1-Vinyl-2-pyrrolidone | Tokyo Chemical Industry |
| | | 9-Vinylanthracene | Aldrich |
| | | 2-Methylstyrene | Aldrich |
| | | 3-Methylstyrene | Aldrich |
| | | 3-Nitrostyrene | Aldrich |
| | | 4-Vinylbenzylchloride | Aldrich |
| | | 4-Acetoxyvinylstyrene | Aldrich |
| | | 4-Chlorostyrene | Aldrich |
| | | 4-Fluorostyrene | Aldrich |
| | | 4-t-butoxystyrene | Aldrich |
| | Acrylic monomer | Benzyl methacrylate | Tokyo Chemical Industry |
| | | Methyl methacrylate | Tokyo Chemical Industry |
| | | Methacrylic acid | Tokyo Chemical Industry |
| | | Glycidyl methacrylate | Tokyo Chemical Industry |
| | | 9-Anthracene methacrylate | Kawasaki Kasei Chemicals |
| | | 4-methoxynaphthalene methacrylate | Kawasaki Kasei Chemicals |
| | | Glycidyl methacrylate | Tokyo Chemical Industry |
| | | 3,4-epoxycyclohexylmethane methacrylate | Daicel Chemical |
| | | Propyltrimethoxysilane methacrylate | Dow Corning Toray |

TABLE 29

| Commercially available vinyl polymer | VPS-2525 | Styrene/4-hydroxystyrene = 75/25, Mw = 2.5k | Nippon Soda |
|---|---|---|---|
| | VPS-3020 | Styrene/4-hydroxystyrene = 80/20, Mw = 3k | Nippon Soda |
| Commercially available novolak resin | GTR-B9 | m-cresol 100%, Mw = 6k | Gunei Resin |
| | TO-123 | m,p-cresol = 6/4, Mw = 20000 | Gunei Resin |
| Polymerizable epoxy polymer | Bisphenol A novolak epoxy resin | jER157S70 | Japan Epoxy Resin |
| | Bisphenol A epoxy resin | jER1004FS | Japan Epoxy Resin |
| | Bisphenol F epoxy resin | jER4005P | Japan Epoxy Resin |
| | Biphenyl epoxy resin | NC-3000 | Nippon Kayaku |
| | Cresol novolak epoxy resin | EPICLON N-690 | DIC |
| | Phenol novolak epoxy resin | EPICLON N-775 | DIC |
| Polymerizable oxetane polymer | Phenol novolak oxetane | PNOX-1009 | Toagosei |
| Polymerizable epoxy monomer | Bisphenol A epoxy resin | jER828 | Japan Epoxy Resin |
| | Biphenyl epoxy resin | YX4000H | Japan Epoxy Resin |
| | Naphthalene epoxy resin | EPICLON HP-4032D | DIC |
| | Naphthalene epoxy resin | EPICLON HP-4700 | DIC |
| | Alicyclic epoxy resin | GT-401 | Daicel Chemical |
| | Silane coupling agent | Z-6040N | Dow Corning Toray |
| | Silane coupling agent | Z-6043N | Dow Corning Toray |
| Polymerizable oxetane monomer | Monofunctional oxetane | OXT-101 | Toagosei |
| | Monofunctional oxetane | OXT-121 | Toagosei |
| | Bifunctional oxetane | OXT-212 | Toagosei |
| | Bifunctional oxetane | OXT-221 | Toagosei |
| Polymerizabgle acrylic monomer | Trifunctional acrylate | M-350 | Toagosei |
| | Tetrafunctional acrylate | M-450 | Toagosei |
| | Hexafunctional acrylate | DPHA | Toagosei |
| | Monofunctional acrylate | M-140 | Toagosei |
| | Bifunctional acrylate | 4G | Shin-Nakamura Chemical |
| | Bifunctional acrylate | M-220 | Toagosei |
| | Bifunctional acrylate | M-270 | Toagosei |
| | Bifunctional methacrylate | BPE-200 | Shin-Nakamura Chemical |
| | Bifunctional methacrylate | BPE-900 | Shin-Nakamura Chemical |

TABLE 30

| Heat curable catalyst | Aliphatic amine | Diethylenetriamine | Tokyo Chemical Industry |
|---|---|---|---|
| | Anhydride | Pyromellitic anhydride | Tokyo Chemical Industry |
| | Tertiary amine | 2,4,6-tris(dimethylaminomethyl)phenol | Tokyo Chemical Industry |
| | Imidazole derivative | 2-Methylimidazole | Tokyo Chemical Industry |
| | Thermal acid generator | SI-60 | Sanshin Chemical |

TABLE 30-continued

| | | | |
|---|---|---|---|
| Cross-linking agent | Methylated melamine | Mw-30HM | Sanwa Chemical |
| | Methylated urea | MX-270 | Sanwa Chemical |
| Photoacid generator | Onium salt | CPI-210S | San-Apro |
| | | HS-1PG | San-Apro |
| | | PI-2074 | Rhodia |
| | | SP-172 | ADEKA |
| | | ZK-0138 | Dainippon Sumitomo Pharma |
| | | CGI TPS C1 | BASF |
| | Oxime | PAG103 | BASF |
| Photoradical polymerization initiator | α-aminoalkylphenone | IRGACURE 907 | Ciba |
| | Oxime | IRGACURE OXE 02 | Ciba |
| Solvent | | Toluene | Junsei Chemical |
| | | Propylene glycol monomethyl ether acetate | Tokyo Ohka |
| Commercially available novolak resin | GTR-A7 | m/p/2,5xy = 80/5/15, Mw = 5k | Gunei Chemical |
| | GTR-B9 | m-cresol 100%, Mw = 8k | Gunei Chemical |
| | GTR-C6 | m/p/3,4xy = 54/36/10, Mw = 4k | Gunei Chemical |
| | GTR-M3 | m,p-cresol = 36/64, Mw = 6k | Gunei Chemical |
| | TO-123 | m,p-cresol = 6/4, Mw = 20000 | Gunei Chemical |
| | 95 ester | m/p/235TMP = 35/40/25, Mw = 4k, Esterification ratio 4 mol % | Daito Chemix |
| Commercially available NQD compound | TP-34 ester | 4,4'-[(3,4-dihydroxyphenyl)methylene]bis(2-cyclohexyl-5-methylphenol), esterification ratio 2.5 mol % | Honshu Chemical |
| | TrisP-PA-MF | 4,4'-[1-[4-[1-(4-hydroxyphenyl)-1-methylethyl]phenyl]ethylidene]bisphenol, esterification ratio 2.0 mol % | Honshu Chemical |
| | ASL-234 | 2,3,4,4'-tetrahydroxy-benzophenone, esterification ratio 2.5 mol % | Daito Chemix |
| | 4CPA-1022 | 4,4'-[1-[4-[1-(4-hydroxyphenyl)-1-methylethyl]phenyl]ethylidene]bisphenol, esterification ratio 2.2 mol % | Daito Chemix |

[Negative Photosensitive Resin—No. 2]

In Tables 31 and 32, the monomers used in the synthesis of polymers 81 to 97, the compositional ratio (unit:mol %) of the monomers and the molecular weight of the synthesized monomers are indicated. Polymers 87, 89 to 91, 93, 94 and 96 have graft polymerization ability.

Resin compositions of Examples 99 to 111 and Comparative Examples 21 to 26 were prepared in accordance with the formulations shown in Tables 33 and 34 (unit: parts by weight). Examples 105 and 107 to 111 and Comparative Examples 22, 23 and 25 have graft polymerization ability.

With respect to the compositions indicated in Tables 35 to 37, the details are shown in Tables 31 to 34.

TABLE 31

| | | Polymer 81 | Polymer 82 | Polymer 83 | Polymer 84 | Polymer 85 | Polymer 86 | Polymer 87 | Polymer 88 | Polymer 89 | Polymer 90 |
|---|---|---|---|---|---|---|---|---|---|---|---|
| Synthesized polymer | Styrene | 20 | 80 | 35 | | | 30 | | | 35 | 35 |
| | 1-Vinylnaphthalene | | | | 50 | | | | | | |
| | 4-Vinylbiphenyl | | | | | 50 | | | | | |
| | 9-Vinylanthracene | | | | | | 20 | | | | |
| | 4-Hydroxystyrene | | | | | | | 50 | | | |
| | Benzyl methacrylate | | | | | | | | 50 | | |
| | Methyl methacrylate | | | | | | | | | | |
| | Glycidyl methacrylate | | | | 50 | | 25 | | | | |
| | 3,4-epoxycyclohexylmethane methacrylate | 80 | 20 | 60 | | 50 | 25 | 50 | 50 | 60 | 60 |
| | Propyltrimethoxysilane methacrylate | | | | | | | | | 5 | |
| | Methacrylic acid | | | | | | | | | | 5 |
| | Mw | 40000 | 40000 | 40000 | 40000 | 40000 | 40000 | 40000 | 40000 | 40000 | 40000 |

TABLE 32

| | | Polymer 91 | Polymer 92 | Polymer 93 | Polymer 94 | Polymer 95 | Polymer 96 | Polymer 97 |
|---|---|---|---|---|---|---|---|---|
| Synthesized polymer | Styrene | 35 | 50 | | 45 | 100 | | 90 |
| | 1-Vinylnaphthalene | | | | | | | |
| | 4-Vinylbiphenyl | | | | | | | |
| | 9-Vinylanthracene | | | | | | | |
| | 4-Hydroxystyrene | 5 | | 50 | | | 100 | |
| | Benzyl methacrylate | | | | | | | |

TABLE 32-continued

|  | Polymer 91 | Polymer 92 | Polymer 93 | Polymer 94 | Polymer 95 | Polymer 96 | Polymer 97 |
|---|---|---|---|---|---|---|---|
| Methyl methacrylate | 10 | 50 | 50 | 45 |  |  |  |
| Glycidyl methacrylate |  |  |  |  |  |  |  |
| 3,4-epoxycyclohexylmethane methacrylate |  | 50 |  |  |  |  |  |
| Propyltrimethoxysilane methacrylate |  |  |  |  | 10 |  | 10 |
| Methacrylic acid |  | 5 |  |  |  |  |  |
| Mw | 40000 | 40000 | 40000 | 40000 | 40000 | 40000 | 40000 |

TABLE 33

|  |  | Example 99 | Example 100 | Example 101 | Example 102 | Example 103 | Example 104 | Example 105 | Example 106 | Example 107 | Example 108 |
|---|---|---|---|---|---|---|---|---|---|---|---|
| Synthesized polymer | Polymer 81 | 100 |  |  |  |  |  |  |  |  |  |
|  | Polymer 82 |  | 100 |  |  |  |  |  |  |  |  |
|  | Polymer 83 |  |  | 100 |  |  |  |  |  |  |  |
|  | Polymer 84 |  |  |  | 100 |  |  |  |  |  |  |
|  | Polymer 85 |  |  |  |  | 100 |  |  |  |  |  |
|  | Polymer 86 |  |  |  |  |  | 100 |  |  |  |  |
|  | Polymer 87 |  |  |  |  |  |  | 100 |  |  |  |
|  | Polymer 88 |  |  |  |  |  |  |  | 100 |  |  |
|  | Polymer 89 |  |  |  |  |  |  |  |  | 100 | 100 |
|  | Polymer 90 |  |  |  |  |  |  |  |  |  |  |
|  | Polymer 91 |  |  |  |  |  |  |  |  |  |  |
|  | Polymer 92 |  |  |  |  |  |  |  |  |  |  |
|  | Polymer 93 |  |  |  |  |  |  |  |  |  |  |
|  | Polymer 94 |  |  |  |  |  |  |  |  |  |  |
|  | Polymer 95 |  |  |  |  |  |  |  |  |  |  |
|  | Polymer 96 |  |  |  |  |  |  |  |  |  |  |
|  | Polymer 97 |  |  |  |  |  |  |  |  |  |  |
| Commercially available polymer | VPS-3020 |  |  |  |  |  |  |  |  |  |  |
| Polymerizable monomer | jER828 |  |  |  |  |  |  |  |  |  | 10 |
|  | HP-4700 |  |  |  |  |  |  |  |  |  | 10 |
| Cross linking agent | MW-30HM |  |  |  |  |  |  |  |  |  |  |
| Photoacid generator | SP-172 | 2 |  |  |  |  |  |  |  |  |  |
|  | HS-1PG |  | 2 | 2 | 2 | 2 | 2 | 2 | 2 | 2 | 2 |
|  | PAG103 |  |  |  |  |  |  |  |  |  |  |
| Evaluation result | Observation of perpendicular lamellar Experiment method 1 | A | A | A | A | A | A | A | A | A | A |
|  | Observation of perpendicular lamellar Experiment method 2 | A | A | A | A | A | A | A' | A | A' | A' |
|  | Observation of perpendicular lamellar Experiment method 3 | A | A | A | A | A | A | A' | A | A' | A' |
|  | Observation of perpendicular lamellar Experiment method 4 | B | B | B | A | A | A | A' | A | A' | A' |

TABLE 34

|  |  | Example 109 | Example 110 | Example 111 | Comparative Example 21 | Comparative Example 22 | Comparative Example 23 | Comparative Example 24 | Comparative Example 25 | Comparative Example 26 |
|---|---|---|---|---|---|---|---|---|---|---|
| Synthesized polymer | Polymer 81 |  |  |  |  |  |  |  |  |  |
|  | Polymer 82 |  |  |  |  |  |  |  |  |  |
|  | Polymer 83 |  |  |  |  |  |  |  |  |  |
|  | Polymer 84 |  |  |  |  |  |  |  |  |  |

TABLE 34-continued

| | | Example 109 | Example 110 | Example 111 | Comparative Example 21 | Comparative Example 22 | Comparative Example 23 | Comparative Example 24 | Comparative Example 25 | Comparative Example 26 |
|---|---|---|---|---|---|---|---|---|---|---|
| | Polymer 85 | | | | | | | | | |
| | Polymer 86 | | | | | | | | | |
| | Polymer 87 | | | | | | | | | |
| | Polymer 88 | | | | | | | | | |
| | Polymer 89 | | | | | | | | | |
| | Polymer 90 | 100 | | | | | | | | |
| | Polymer 91 | | | 100 | | | | | | |
| | Polymer 92 | | | | 100 | | | | | |
| | Polymer 93 | | | | | 100 | | | | |
| | Polymer 94 | | | | | | 100 | | | |
| | Polymer 95 | | | | | | | 100 | | |
| | Polymer 96 | | | | | | | | 100 | |
| | Polymer 97 | | | | | | | | | 100 |
| Commercially available polymer | VPS-3020 | | 100 | | | | | | | |
| Polymerizable monomer | jER828 | | | | | | | | | |
| | HP-4700 | | | | | | | | | |
| Cross linking agent | MW-30HM | | 15 | | | | | | | |
| Photoacid generator | SP-172 | | | | | | | | | |
| | HS-1PG | 2 | | 2 | 2 | 2 | 2 | 2 | 2 | 2 |
| | PAG103 | | 1 | | | | | | | |
| Evaluation result | Observation of perpendicular lamellar Experiment method 1 | A | A | A | B | B | B | B | B | B |
| | Observation of perpendicular lamellar Experiment method 2 | A' | A' | A' | B | A' | A' | B | B | B |
| | Observation of perpendicular lamellar Experiment method 3 | A' | A' | A' | B | A' | A' | B | B | B |
| | Observation of perpendicular lamellar Experiment method 4 | A' | A' | A' | B | A' | A' | B | B | B |

[Evaluation of Perpendicular Lamellar Formability]

<Experiment Method 1>

Each of the resin compositions of Examples 99 to 111 and Comparative Examples 21 to 26 was adjusted to a concentration of 0.5 to 2%, and was spin-coated on an 8-inch silicon substrate by adjusting the number of rotation to obtain a film thickness of 30 nm.

Subsequently, without conducting a heat drying treatment, selective exposure was conducted using NSR-2205i14E (manufactured by Nikon Corporation). After exposure, without conducting post exposure bake (PEB), a developing treatment was conducted using propylene glycol monomethyl ether acetate (PGMEA).

To the substrate, a toluene solution of a PS-PMMA block copolymer 1 (17.5 mg/ml) (manufactured by Polymer Source, Inc.; molecular weight of PS: 53,000, molecular weight of PMMA: 54,000, polydispersity index (PDI): 1.16) was spin-coated (number of revolution: 1,000 rpm, 60 seconds), followed by drying by heating at 110° C. for 60 seconds.

Subsequently, the substrate was heated at 200° C. for 6 hours while flowing nitrogen, thereby forming a phase-separated structure. Thereafter, using TCA-3822 (manufactured by Tokyo Ohka Kogyo Co., Ltd.), the substrate was subjected to an oxygen plasma treatment (200 sccm, 40 Pa, 200 W, 30 seconds), thereby selectively removing the phase constituted of PMMA. The surface of the obtained substrate was observed using a scanning electron microscope SEMS4700 (manufactured by Hitachi, Ltd.). A substrate on which perpendicular lamellar was observed only at exposed portions of the layer of the undercoat agent was evaluated "A"; a substrate on which perpendicular lamellar was observed on the entire surface, regardless of exposed portions or unexposed portions of the layer of the undercoat agent was evaluated "A'"; and a substrate on which no perpendicular lamellar was observed on the entire surface, regardless of exposed portions or unexposed portions of the layer of the undercoat agent was evaluated "B". The results are shown in Tables 33 and 34.

From the results, it is apparent that, by using an undercoat agent in which 20 mol % to 80 mol % of all the structural units of the resin component is a structural unit derived from an aromatic ring-containing monomer, and conducting no bake treatment, a perpendicular lamellar can be selectively formed on the substrate.

<Experiment Method 2>

Perpendicular lamellar formability was evaluated in the same manner as in Experiment Method 1, except that, after spin-coating the resin compositions of Examples 99 to 111 and Comparative Examples 21 to 26, a bake treatment was conducted at 120° C. for 60 seconds. The results are shown in Tables 33 and 34.

From the results, it is apparent that, in the case where a prebake treatment is conducted, by using an undercoat agent in which 20 mol % to 80 mol % of all the structural units of the resin component is a structural unit derived from an aromatic ring-containing monomer, and the undercoat agent has no graft polymerization ability, a perpendicular lamellar can be selectively formed on the substrate.

<Experiment Method 3>

Perpendicular lamellar formability was evaluated in the same manner as in Experiment Method 1, except that, after spin-coating the resin compositions of Examples 99 to 111 and Comparative Examples 21 to 26, post exposure bake (PEB) treatment was conducted at 120° C. for 60 seconds. The results are shown in Tables 33 and 34.

From the results, it is apparent that, in the case where a post exposure bake (PEB) is conducted, by using an undercoat agent in which 20 mol % to 80 mol % of all the structural units of the resin component is a structural unit derived from an aromatic ring-containing monomer, and the undercoat agent has no graft polymerization ability, a perpendicular lamellar can be selectively formed on the substrate.

<Experiment Method 4>

Perpendicular lamellar formability was evaluated in the same manner as in Experiment Method 1, except that, after spin-coating the resin compositions of Examples 99 to 111 and Comparative Examples 21 to 26, a bake treatment was conducted at 120° C. for 60 seconds, and without exposure, post exposure bake (PEB) treatment was conducted at 120° C. for 60 seconds. The results are shown in Tables 33 and 34.

From the results, it is apparent that, in the case where a bake treatment is conducted, by using an undercoat agent in which 20 mol % to 80 mol % of all the structural units of the resin component is a structural unit derived from an aromatic ring-containing monomer, and the undercoat agent has no graft polymerization ability, a perpendicular lamellar can be selectively formed on the substrate.

TABLE 35

| Polymer component: vinyl/acryl monomer | Vinyl monomer | Styrene | Tokyo Chemical Industry |
|---|---|---|---|
| | | 4-Hydroxystyrene | Tokyo Chemical Industry |
| | | 4-t-Bu styrene | Tokyo Chemical Industry |
| | | α-Methylstyrene | Tokyo Chemical Industry |
| | | 4-Vinylbenzylcyanide | Tokyo Chemical Industry |
| | | 4-Methylstyrene | Tokyo Chemical Industry |
| | | 4-Methoxystyrene | Tokyo Chemical Industry |
| | | 4-Nitrostyrene | Tokyo Chemical Industry |
| | | 4-n-octylstyrene | Tokyo Chemical Industry |
| | | 2,4,6-trimethylstyrene | Tokyo Chemical Industry |
| | | 1-Vinylnaphthalene | Tokyo Chemical Industry |
| | | 4-vinylbiphenyl | Tokyo Chemical Industry |
| | | 1-Vinyl-2-pyrrolidone | Tokyo Chemical Industry |
| | | 9-Vinylanthracene | Aldrich |
| | | 2-Methylstyrene | Aldrich |
| | | 3-Methylstyrene | Aldrich |
| | | 3-Nitrostyrene | Aldrich |
| | | 4-Vinylbenzylchloride | Aldrich |
| | | 4-Acetoxyvinylstyrene | Aldrich |
| | | 4-Chlorostyrene | Aldrich |
| | | 4-Fluorostyrene | Aldrich |
| | | 4-t-butoxystyrene | Aldrich |
| | Acrylic monomer | Benzyl methacrylate | Tokyo Chemical Industry |
| | | Methyl methacrylate | Tokyo Chemical Industry |
| | | Methacrylic acid | Tokyo Chemical Industry |
| | | Glycidyl methacrylate | Tokyo Chemical Industry |
| | | 9-Anthracene methacrylate | Kawasaki Kasei Chemicals |
| | | 4-methoxynaphthalene methacrylate | Kawasaki Kasei Chemicals |
| | | Glycidyl methacrylate | Tokyo Chemical Industry |
| | | 3,4-epoxycyclohexylmethane methacrylate | Daicel Chemical |
| | | Propyltrimethoxysilane methacrylate | Dow Corning Toray |

TABLE 36

| Commercially available vinyl polymer | VPS-2525 | Styrene/4-hydroxystyrene = 75/25, Mw = 2.5k | Nippon Soda |
|---|---|---|---|
| | VPS-3020 | Styrene/4-hydroxystyrene = 80/20, Mw = 3k | Nippon Soda |
| Commercially available novolak resin | GTR-B9 | m-cresol 100%, Mw = 6k | Gunei Resin |
| | TO-123 | m,p-cresol = 6/4, Mw = 20000 | Gunei Resin |
| Polymerizable epoxy polymer | Bisphenol A novolak epoxy resin | jER157S70 | Japan Epoxy Resin |
| | Bisphenol A epoxy resin | jER1004FS | Japan Epoxy Resin |
| | Bisphenol F epoxy resin | jER4005P | Japan Epoxy Resin |
| | Biphenyl epoxy resin | NC-3000 | Nippon Kayaku |
| | Cresol novolak epoxy resin | EPICLON N-690 | DIC |
| | Phenol novolak epoxy resin | EPICLON N-775 | DIC |
| Polymerizable oxetane polymer | Phenol novolak oxetane | PNOX-1009 | Toagosei |
| Polymerizable epoxy monomer | Bisphenol A epoxy resin | jER828 | Japan Epoxy Resin |
| | Biphenyl epoxy resin | YX4000H | Japan Epoxy Resin |
| | Naphthalene epoxy resin | EPICLON HP-4032D | DIC |
| | Naphthalene epoxy resin | EPICLON HP-4700 | DIC |
| | Alicyclic epoxy resin | GT-401 | Daicel Chemical |
| | Silane coupling agent | Z-6040N | Dow Corning Toray |
| | Silane coupling agent | Z-6043N | Dow Corning Toray |

TABLE 36-continued

| | | | |
|---|---|---|---|
| Polymerizable oxetane monomer | Monofunctional oxetane | OXT-101 | Toagosei |
| | Monofunctional oxetane | OXT-121 | Toagosei |
| | Bifunctional oxetane | OXT-212 | Toagosei |
| | Bifunctional oxetane | OXT-221 | Toagosei |
| Polymerizabgle acrylic monomer | Trifunctional acrylate | M-350 | Toagosei |
| | Tetrafunctional acrylate | M-450 | Toagosei |
| | Hexafunctional acrylate | DPHA | Toagosei |
| | Monofunctional acrylate | M-140 | Toagosei |
| | Bifunctional acrylate | 4G | Shin-Nakamura Chemical |
| | Bifunctional acrylate | M-220 | Toagosei |
| | Bifunctional acrylate | M-270 | Toagosei |
| | Bifunctional methacrylate | BPE-200 | Shin-Nakamura Chemical |
| | Bifunctional methacrylate | BPE-900 | Shin-Nakamura Chemical |

TABLE 37

| | | | |
|---|---|---|---|
| Heat curable catalyst | Aliphatic amine | Diethylenetriamine | Tokyo Chemical Industry |
| | Anhydride | Pyromellitic anhydride | Tokyo Chemical Industry |
| | Tertiary amine | 2,4,6-tris(dimethylaminomethyl)phenol | Tokyo Chemical Industry |
| | Imidazole derivative | 2-Methylimidazole | Tokyo Chemical Industry |
| | Thermal acid generator | SI-60 | Sanshin Chemical |
| Cross-linking agent | Methylated melamine | Mw-30HM | Sanwa Chemical |
| | Methylated urea | MX-270 | Sanwa Chemical |
| Photoacid generator | Onium salt | CPI-210S | San-Apro |
| | | HS-1PG | San-Apro |
| | | PI-2074 | Rhodia |
| | | SP-172 | ADEKA |
| | | ZK-0138 | Dainippon Sumitomo Pharma |
| | | CGI TPS Cl | BASF |
| | Oxime | PAG103 | BASF |
| Photoradical polymerization initiator | α-aminoalkylphenone | IRGACURE 907 | Ciba |
| | Oxime | IRGACURE OXE 02 | Ciba |
| Solvent | | Toluene | Junsei Chemical |
| | | Propylene glycol monomethyl ether acetate | Tokyo Ohka |
| Commercially available novolak resin | GTR-A7 | m/p/2,5xy = 80/5/15, Mw = 5k | Gunei Chemical |
| | GTR-B9 | m-cresol 100%, Mw = 8k | Gunei Chemical |
| | GTR-C6 | m/p/3,4xy = 54/36/10, Mw = 4k | Gunei Chemical |
| | GTR-M3 | m,p-cresol = 36/64, Mw = 6k | Gunei Chemical |
| | TO-123 | m,p-cresol = 6/4, Mw = 20000 | Gunei Chemical |
| | 95 ester | m/p/235TMP = 35/40/25, Mw = 4k, Esterification ratio 4 mol % | Daito Chemix |
| Commercially available NQD compound | TP-34 ester | 4,4'-[(3,4-dihydroxyphenyl)methylene]bis(2-cyclohexyl-5-methylphenol), esterification ratio 2.5 mol % | Honshu Chemical |
| | TrisP-PA-MF | 4,4'-[1-[4-[1-(4-hydroxyphenyl)-1-methylethyl]phenyl]ethylidene]bisphenol, esterification ratio 2.0 mol % | Honshu Chemical |
| | ASL-234 | 2,3,4,4'-tetrahydroxy-benzophenone, esterification ratio 2.5 mol % | Daito Chemix |
| | 4CPA-1022 | 4,4'-[1-[4-[1-(4-hydroxyphenyl)-1-methylethyl]phenyl]ethylidene]bisphenol, esterification ratio 2.2 mol % | Daito Chemix |

INDUSTRIAL APPLICABILITY

According to the undercoat agent and the method of forming a pattern of a layer containing a block copolymer of the present invention, there can be produced a substrate provided with a nano structure on the substrate surface by using phase separation of a block copolymer, wherein the nanostructure is designed more freely with respect to the position and the orientation. Therefore, the present invention is extremely useful in industry.

BRIEF DESCRIPTION OF THE DRAWINGS

1, 11, 21: substrate, 2, 12, 22: layer of undercoat agent, 14, 22': guide pattern, 3, 13, 23: layer containing block copolymer, 3a, 13a, 23a: phase of polymer $P_B$, 3b, 13b, 23b: phase of polymer $P_A$.

What is claimed is:

1. A method of forming a pattern of a layer containing a block copolymer, the method comprising the steps of:
    (1) coating an undercoat agent on a substrate, thereby forming a layer composed of the undercoat agent,
    (2) forming a layer containing a block copolymer having a plurality of polymers bonded on the surface of the layer composed of the undercoat agent, and subjecting the layer containing the block copolymer to phase separation, and
    (3) selectively removing a phase of at least one polymer of the plurality of copolymers constituting the block copolymer from the layer containing the block copolymer, wherein the undercoat agent comprises a resin component, the resin component comprises a structural unit derived from an aromatic ring-containing monomer and a structural unit derived from an aromatic ring non-containing monomer which is a (meth)acrylic compound or a vinyl compound containing at least 1 atom selected from the group consisting of N, O, Si, P and S, provided that 20 mol % to 80 mol % of all the structural units of the resin component being a structural unit derived from an aromatic ring-containing monomer, and the undercoat agent comprises a polymerizable monomer and at least one photosensitive polymerization initiator selected from the group consisting of a cationic polymerization initiator and a radical polymerization initiator.

2. The method of forming a pattern of a layer containing a block copolymer according to claim 1, further comprising a step (2') in which, after step (1), the layer of the undercoat agent is selectively exposed, followed by a development treatment, thereby forming a pattern of the layer of the undercoat agent on the substrate.

3. The method of forming a pattern of a layer containing a block copolymer according to claim 2, wherein no bake treatment is conducted in step (2').

4. The method of forming a pattern of a layer containing a block copolymer according to claim 1, wherein the aromatic-ring containing monomer is selected from an aromatic compound of 6 to 18 carbon atoms having a vinyl group, an aromatic compound of 6 to 18 carbon atoms having a (meth)acryloyl group, and a phenol which become the constitutional components of a novolak resin.

5. The method of forming a pattern of a layer containing a block copolymer according to claim 1, wherein the resin component has a group capable of being graft polymerized to the substrate.

6. The method of forming a pattern of a layer containing a block copolymer according to claim 5, wherein the group capable of being graft polymerized to the substrate is selected from a phenolic hydroxyl group, a carboxyl group, a thiol group, an amino group, an amide group, an isocyanate group, a nitro group, an epoxy group, an oxetanyl group, a (meth)acryloyl group and an alkoxysilane group.

* * * * *